(12) United States Patent
Yoshitani et al.

(10) Patent No.: US 9,954,389 B2
(45) Date of Patent: Apr. 24, 2018

(54) LIGHT-EMITTING DEVICE, MODULE, AND ELECTRONIC DEVICE

(71) Applicant: Semiconductor Energy Laboratory Co., Ltd., Kanagawa-ken (JP)

(72) Inventors: Yusuke Yoshitani, Kanagawa (JP); Masaaki Hiroki, Kanagawa (JP); Minoru Takahashi, Nagano (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 321 days.

(21) Appl. No.: 14/872,659

(22) Filed: Oct. 1, 2015

(65) Prior Publication Data

US 2016/0097501 A1 Apr. 7, 2016

(30) Foreign Application Priority Data

Oct. 3, 2014 (JP) .................................. 2014-204599
Oct. 28, 2014 (JP) .................................. 2014-219133
Dec. 1, 2014 (JP) .................................. 2014-243193

(51) Int. Cl.
| | |
|---|---|
| *H02J 7/02* | (2016.01) |
| *F21V 23/04* | (2006.01) |
| *H02J 50/20* | (2016.01) |
| *H01L 51/00* | (2006.01) |
| *H01L 51/50* | (2006.01) |
| *H01L 51/52* | (2006.01) |

(Continued)

(52) U.S. Cl.
CPC .............. *H02J 7/025* (2013.01); *H02J 50/20* (2016.02); *H01L 27/3244* (2013.01); *H01L 51/006* (2013.01); *H01L 51/0052* (2013.01); *H01L 51/0072* (2013.01); *H01L 51/0074* (2013.01); *H01L 51/0085* (2013.01); *H01L 51/5016* (2013.01); *H01L 51/524* (2013.01); *H01M 10/052* (2013.01)

(58) Field of Classification Search
CPC ........ H02J 7/025; H02J 50/20; H02J 27/3244; H02J 51/0052; H02J 51/006; H02J 51/0072; H02J 51/0074; H02J 51/0085; H02J 51/5016; H02J 51/524; H02J 10/052
USPC .......... 315/169.1–169.3, 291, 307, 308, 312; 345/39, 48, 76, 82–84
See application file for complete search history.

(56) References Cited

U.S. PATENT DOCUMENTS 7,518,692 B2  4/2009  Yamazaki et al.
7,652,359 B2  1/2010  Takayama et al.
(Continued)

FOREIGN PATENT DOCUMENTS

JP   2003-174153   6/2003

*Primary Examiner* — Jimmy Vu
(74) *Attorney, Agent, or Firm* — Husch Blackwell LLP

(57) ABSTRACT

To provide a light-emitting device capable of being used in a wide temperature range. To provide a light-emitting device capable of being used in a low-temperature environment and a high-temperature environment. The light-emitting device includes a light-emitting panel, a secondary battery, a circuit, and a sealing structure. The light-emitting panel includes a light-emitting element. The light-emitting element can emit light with power supplied from the secondary battery. The circuit includes an antenna and can charge the secondary battery wirelessly. The light-emitting panel, the secondary battery, and the circuit are provided in the sealing structure. The sealing structure includes a portion through which light emitted from the light-emitting element passes.

21 Claims, 37 Drawing Sheets

(51) Int. Cl.
H01L 27/32 (2006.01)
H01M 10/052 (2010.01)

(56) References Cited

U.S. PATENT DOCUMENTS

| | | | |
|---|---|---|---|
| 7,663,578 B2 * | 2/2010 | Miyake | G09G 3/3258 |
| | | | 315/169.3 |
| 8,415,208 B2 | 4/2013 | Takayama et al. | |
| 8,698,262 B2 | 4/2014 | Tsurume et al. | |
| 2006/0244689 A1 * | 11/2006 | Osame | G09G 3/2022 |
| | | | 345/76 |
| 2008/0158217 A1 | 7/2008 | Hata et al. | |
| 2015/0022957 A1 | 1/2015 | Hiroki et al. | |
| 2015/0041795 A1 | 2/2015 | Suzuki et al. | |
| 2015/0060896 A1 | 3/2015 | Okano et al. | |
| 2015/0138699 A1 | 5/2015 | Yamazaki | |

* cited by examiner

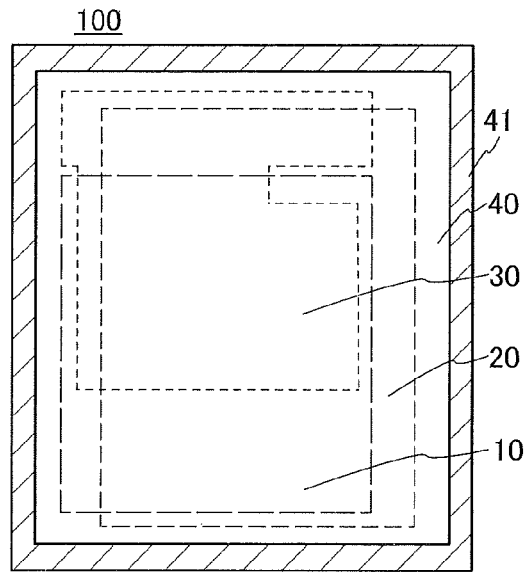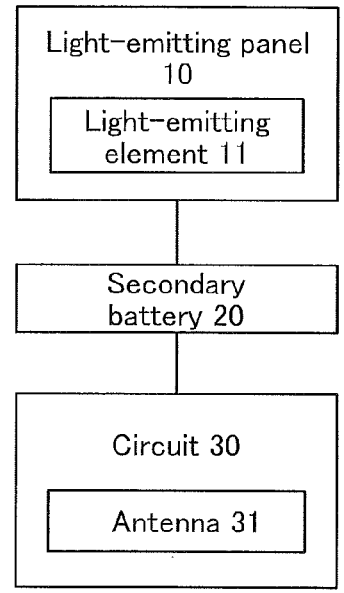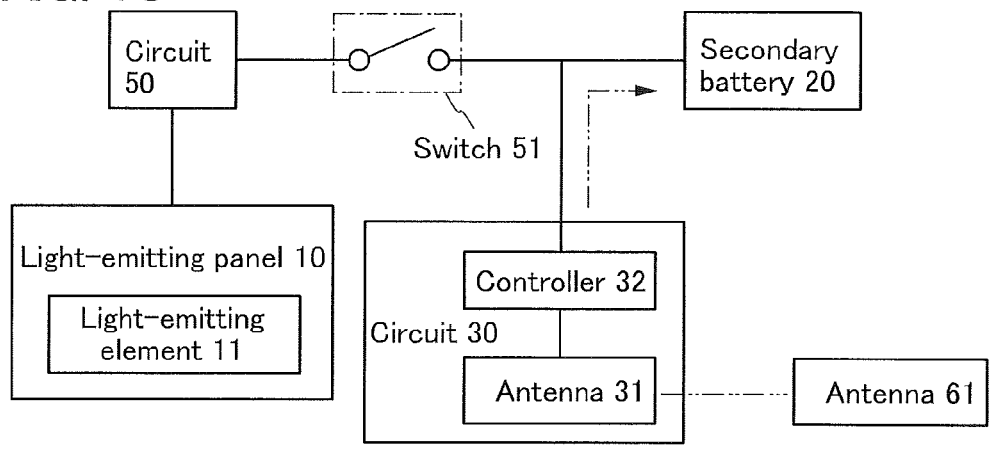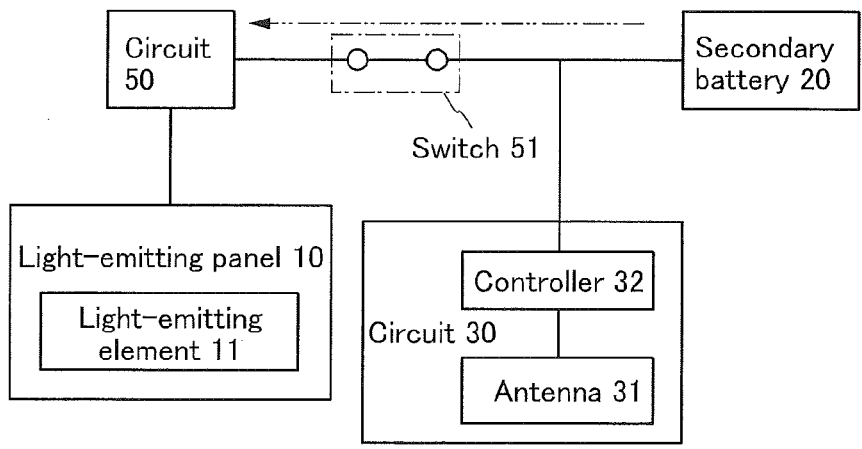

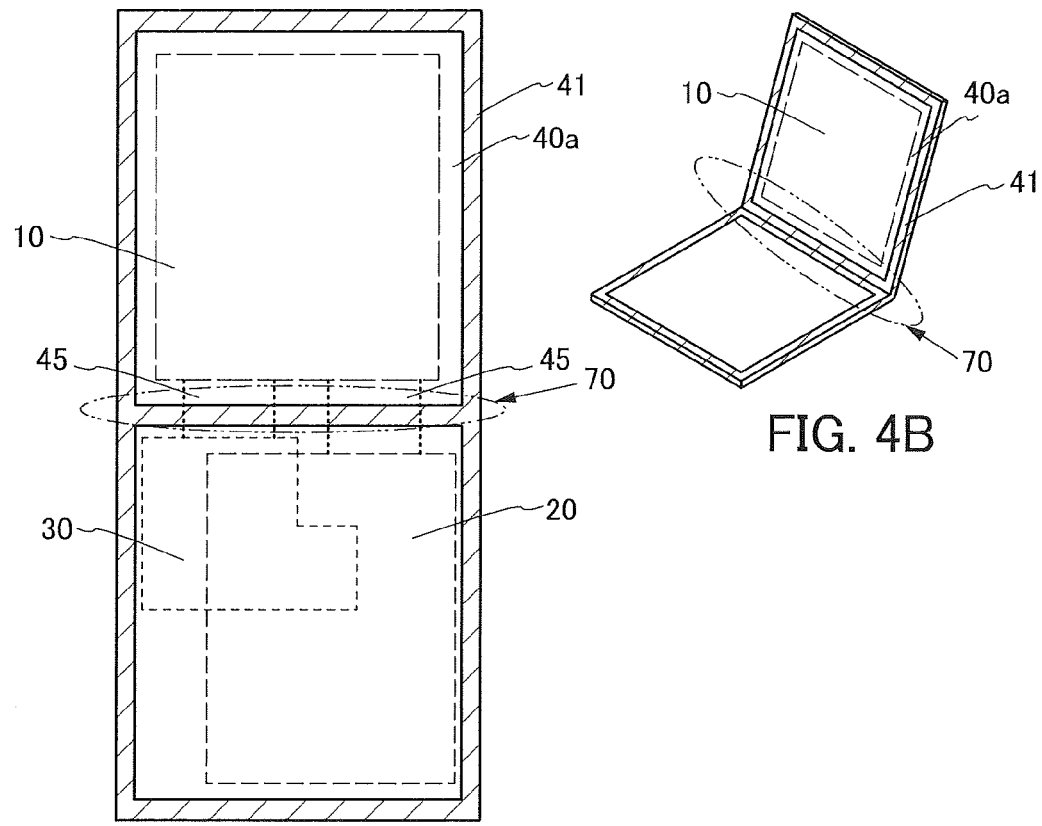
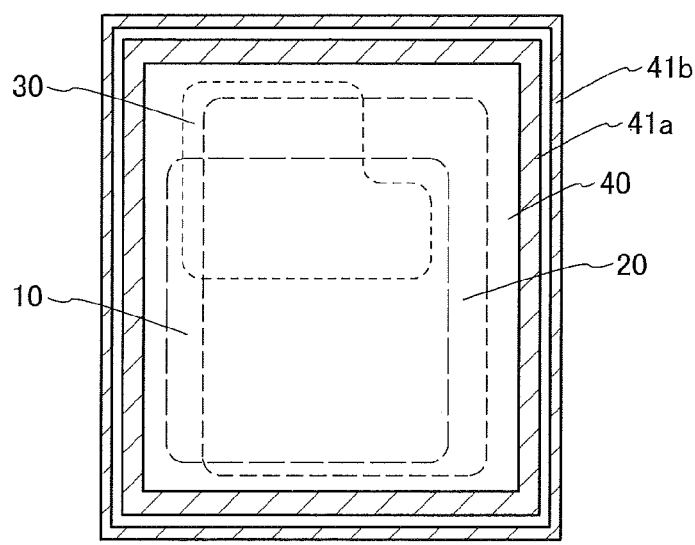

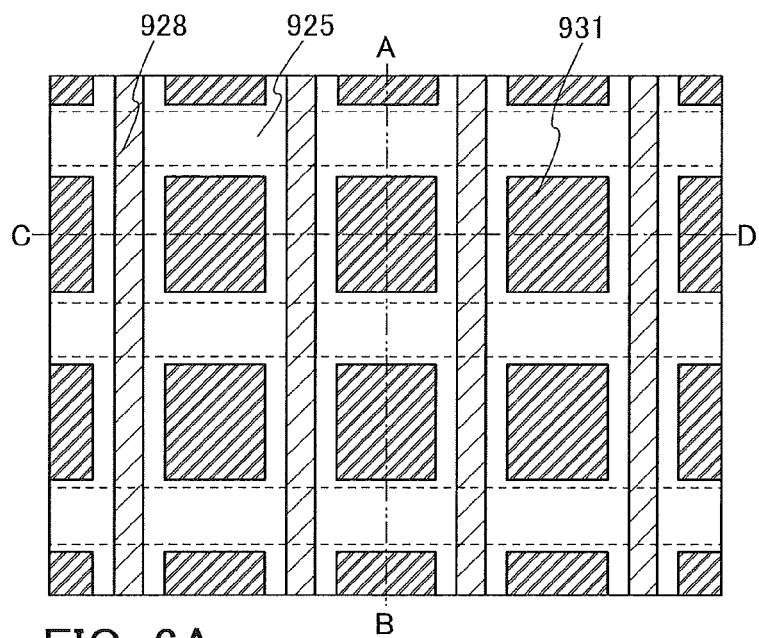
FIG. 6A
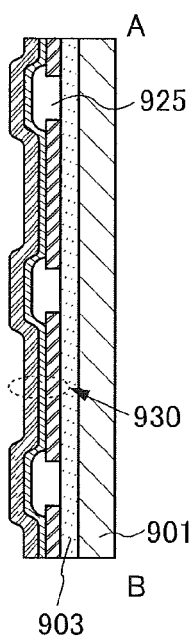
FIG. 6B
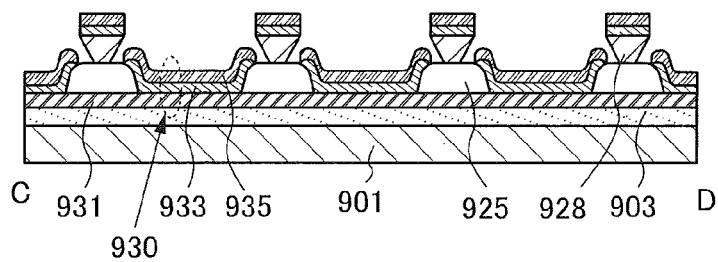
FIG. 6C
FIG. 6D
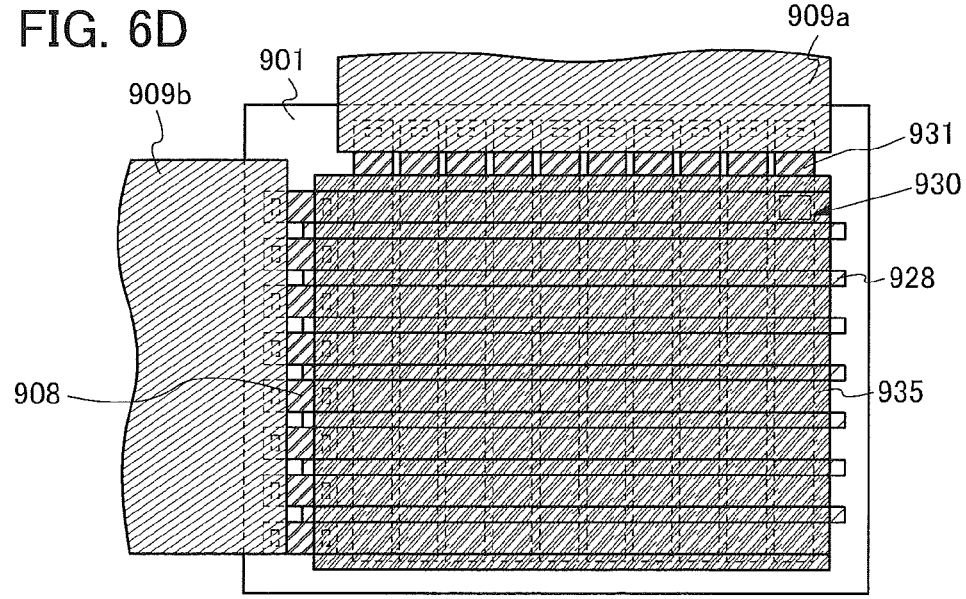

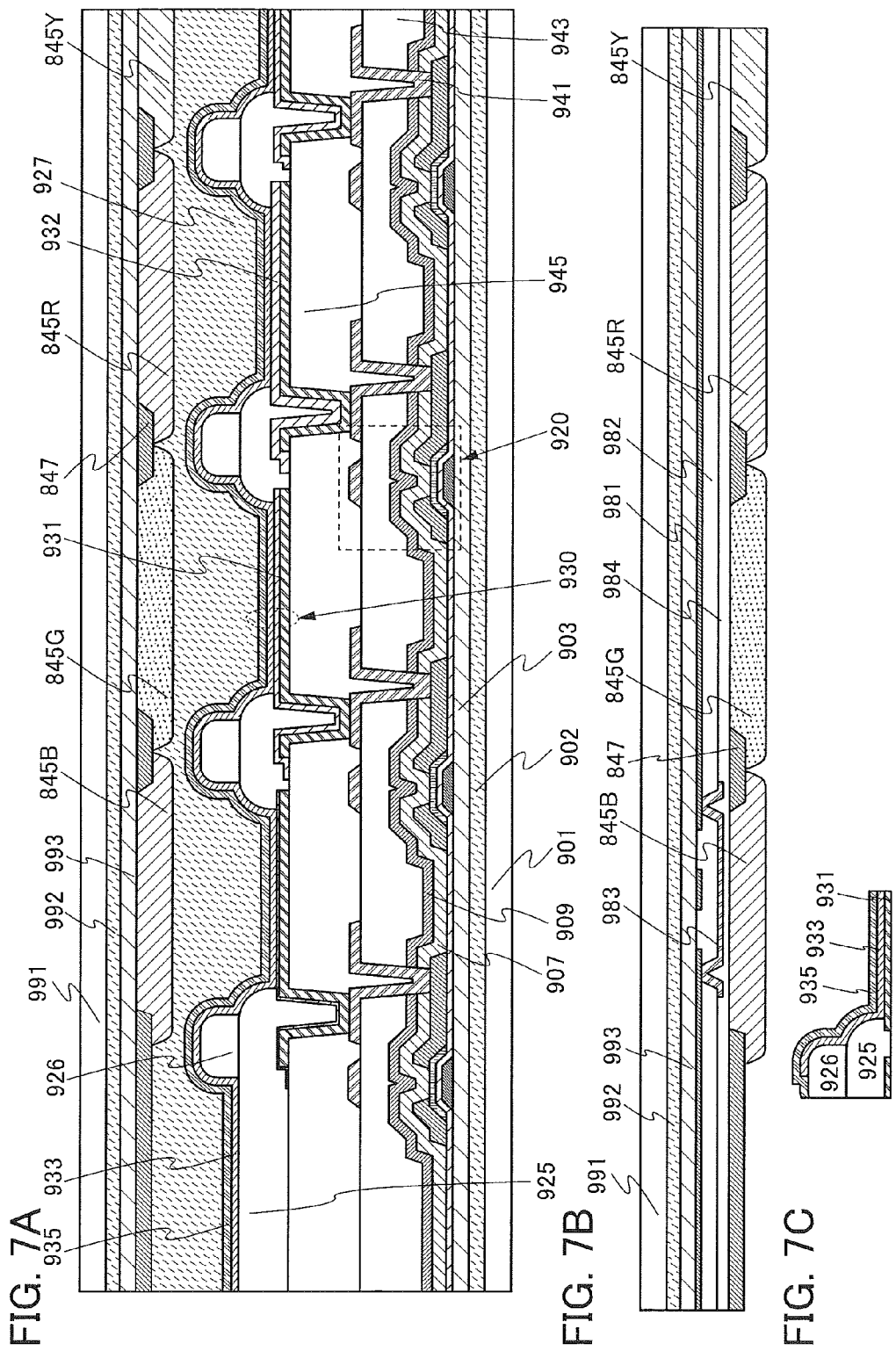

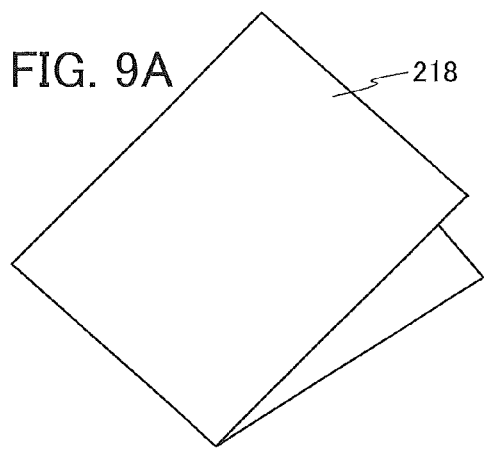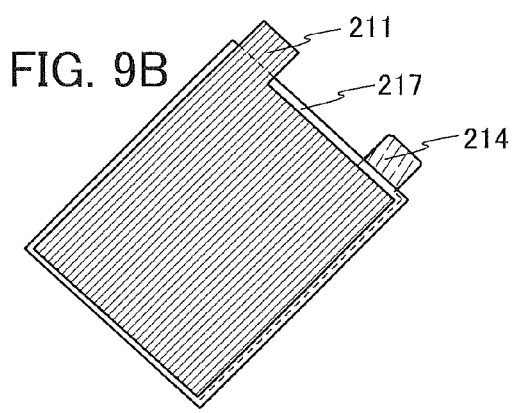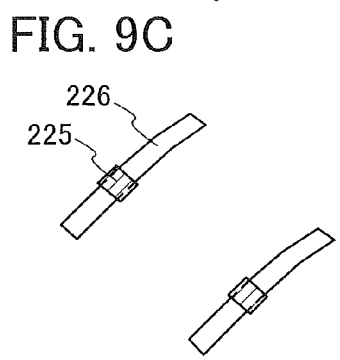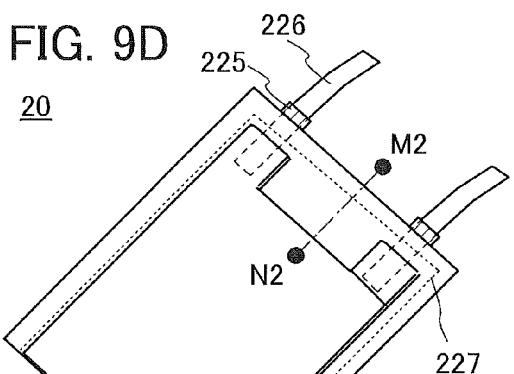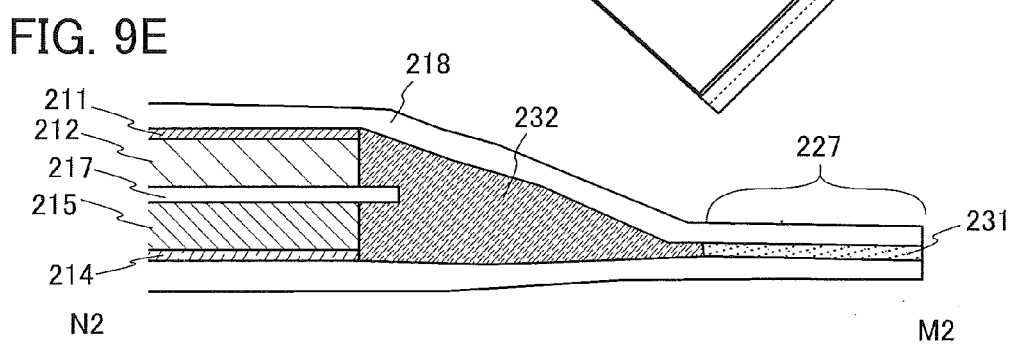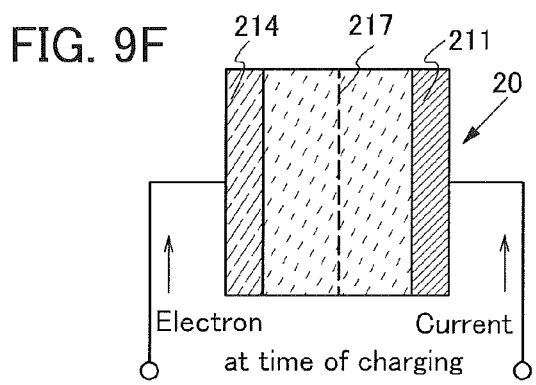

FIG. 20A
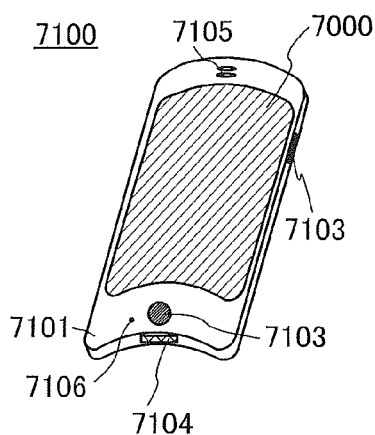
FIG. 20B
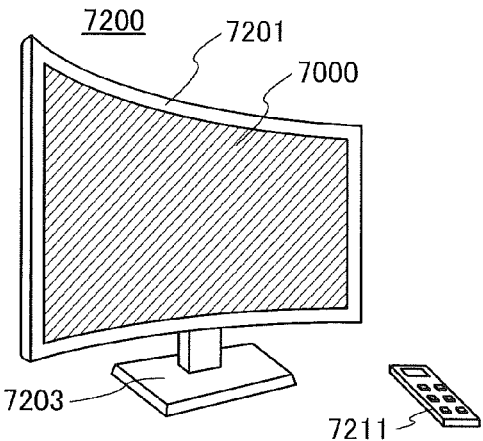
FIG. 20C
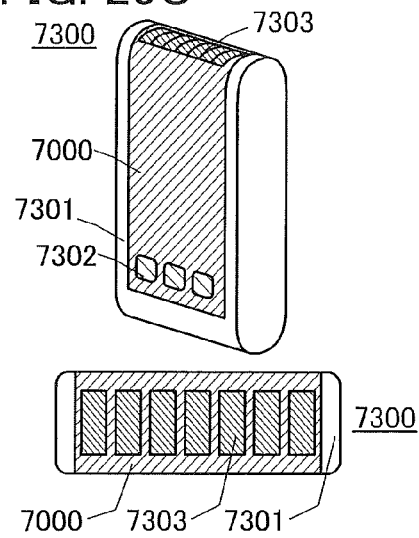
FIG. 20E
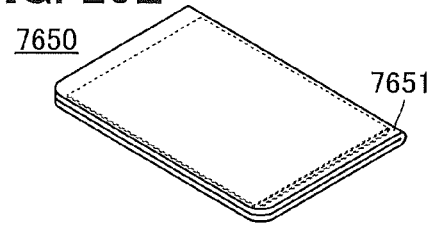
FIG. 20F
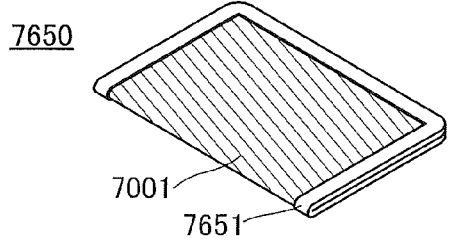
FIG. 20D
FIG. 20G
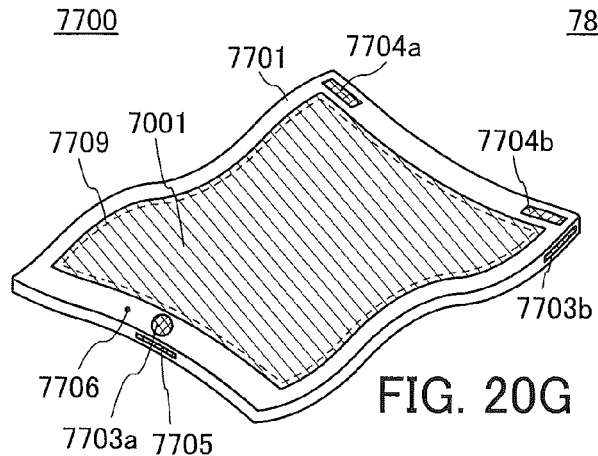
FIG. 20H
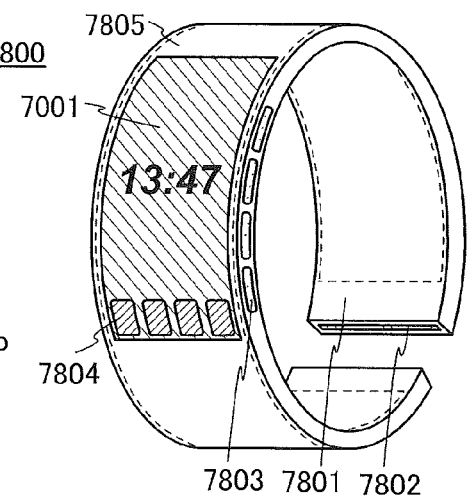

LIGHT-EMITTING DEVICE, MODULE, AND ELECTRONIC DEVICE

BACKGROUND OF THE INVENTION

1. Field of the Invention

One embodiment of the present invention relates to a light-emitting device including a light-emitting element and a secondary battery. One embodiment of the present invention relates to a module and an electronic device each including the light-emitting device.

Note that one embodiment of the present invention is not limited to the above technical field. Specifically, examples of the technical field of one embodiment of the invention disclosed in this specification include a semiconductor device, a display device, a light-emitting device, a power storage device, a memory device, an electronic device, a lighting device, a method for driving any of them, and a method for manufacturing any of them.

2. Description of the Related Art

Recent light-emitting devices are expected to be applied to a variety of uses and become diversified.

For example, light-emitting devices for mobile devices and the like are required to be thin, lightweight, and less likely to be broken.

Light-emitting elements utilizing electroluminescence (EL) (such elements are also referred to as EL elements) have features of the ease of being thinner and lighter, high speed response to input signals, and capability of DC low voltage driving and have been expected to be applied to display devices and lighting devices.

For example, Patent Document 1 discloses a flexible active matrix light-emitting device in which an organic EL element and a transistor serving as a switching element are provided over a film substrate.

As power sources for driving portable devices, the importance of secondary batteries have been increased.

REFERENCE

[Patent Document]
[Patent Document 1] Japanese Published Patent Application No. 2003-174153

SUMMARY OF THE INVENTION

Display devices or lighting devices are used in a variety of environments; therefore, light-emitting devices which can be used in a wide temperature range are required. For example, light-emitting devices do not operate normally in some cases, in a place exposed to direct sunlight such as a dashboard of a car or at the window, inside of a sun-heated car, a high-temperature environment, e.g., desert, or a low-temperature environment, e.g., a cold region with a glacier.

An object of one embodiment of the present invention is to provide a light-emitting device which can be used in a wide temperature range. Another object of one embodiment of the present invention is to provide a light-emitting device which can be used in a high-temperature environment. Another object of one embodiment of the present invention is to provide a light-emitting device which can be used in a low-temperature environment. In particular, an object of one embodiment of the present invention is to provide a light-emitting device which is thin, lightweight, or flexible and which can be used in a wide temperature range.

Another object of one embodiment of the present invention is to provide a small light-emitting device. An object of one embodiment of the present invention is to provide a light-emitting device with high heat resistance. Another object of one embodiment of the present invention is to provide a light-emitting device with a high degree of safety. Another object of one embodiment of the present invention is to provide a light-emitting device with low power consumption. Another object of one embodiment of the present invention is to provide a light-emitting device which can be used for a long time per charge.

Note that the descriptions of these objects do not disturb the existence of other objects. In one embodiment of the present invention, there is no need to achieve all the objects. Other objects can be derived from the description of the specification, the drawings, and the claims.

One embodiment of the present invention is a light-emitting device including a light-emitting panel, a secondary battery, a circuit, and a sealing structure. The light-emitting panel includes a light-emitting element. The light-emitting element has a function of emitting light using power supplied from the secondary battery. The secondary battery has a portion overlapping with the light-emitting panel. The circuit includes an antenna. The antenna has a portion overlapping with the light-emitting panel. The circuit has a function of charging the secondary battery wirelessly. In the sealing structure, the light-emitting panel, the secondary battery, and the circuit are provided. At least part of the sealing structure has a function of transmitting light emitted from the light-emitting element.

In the above structure, the secondary battery preferably has a portion overlapping with the circuit. For example, part of the antenna may be between the light-emitting panel and the secondary battery.

The light-emitting element preferably emits light at a temperature of at least one of 0° C. and 100° C. For example, it is preferable that the light-emitting element include a pair of electrodes and a light-emitting layer, the light-emitting layer be between the pair of electrodes, the light-emitting layer contain a light-emitting organic compound, and the glass transition temperature of the light-emitting organic compound be 100° C. or higher.

The secondary battery preferably supplies power to the light-emitting panel at a temperature of at least one of 0° C. and 100° C. For example, it is preferable that the secondary battery contain a nonaqueous electrolyte, the nonaqueous electrolyte contain an ionic liquid and an alkali metal salt, the ionic liquid contain an imidazolium cation and an anion, and the alkali metal salt be a lithium salt.

One embodiment of the present invention is a light-emitting device including a light-emitting panel, a secondary battery, a circuit, and a sealing structure. The light-emitting panel includes a light-emitting element. The light-emitting element has a function of emitting light using power supplied from the secondary battery. The light-emitting element can emit light at 0° C. and 100° C. The secondary battery can supply power to the light-emitting panel at both 0° C. and 100° C. The circuit includes an antenna. The circuit has a function of charging the secondary battery wirelessly. In the sealing structure, the light-emitting panel, the secondary battery, and the circuit are provided. At least part of the sealing structure has a function of transmitting light emitted from the light-emitting element.

In any of the above structures, the antenna preferably has a portion overlapping with the light-emitting panel. In any of the above structures, the secondary battery preferably has a portion overlapping with the light-emitting panel. In any of the above structures, the secondary battery preferably has a portion overlapping with the circuit. For example, part of the antenna may be between the light-emitting panel and the secondary battery.

In any of the above structures, a first switch may be provided. When the first switch is on, the secondary battery can supply power to the light-emitting panel, and when the first switch is off, the circuit can charge the secondary battery wirelessly.

The light-emitting device of one embodiment of the present invention may have a flexible portion. For example, in any of the above structures, part or the whole of the light-emitting panel may be flexible. In any of the above structures, part or the whole of the secondary battery may be flexible. In any of the above structures, part or the whole of the sealing structure may be flexible.

In any of the above structures, the inside of the sealing structure is preferably a reduced pressure atmosphere.

The light-emitting device of one embodiment of the present invention may be able to be used in water at 0° C. The light-emitting device of one embodiment of the present invention may be able to be used in water at 100° C.

In any of the above structures, the light-emitting panel may include a second switch, a third switch, and a capacitor. The second switch may be electrically connected to one electrode of the capacitor. The third switch may be electrically connected to the other electrode of the capacitor. The capacitor may have a function of holding a voltage corresponding to a video signal. The light-emitting element may have a function of emitting light in accordance with a voltage. In a period during which the capacitor holds a voltage, the second switch and the third switch may be off and electrically disconnected from a driver circuit used for supplying a video signal.

In any of the above structures, the light-emitting panel may include a first transistor, a second transistor, a third transistor, and a capacitor. A gate of the first transistor is electrically connected to a first wiring, one of a source and a drain of the first transistor is electrically connected to a second wiring, and the other of the source and the drain of the first transistor is electrically connected to one electrode of the capacitor. The other of the source and the drain of the first transistor is electrically connected to a gate of the third transistor. One of a source and a drain of the second transistor is electrically connected to a third wiring, and the other of the source and the drain of the second transistor is electrically connected to the other electrode of the capacitor. The other of the source and the drain of the second transistor is electrically connected to one of a source and a drain of the third transistor, and the other of the source and the drain of the third transistor is electrically connected to a fourth wiring. The capacitor has a function of holding voltage in accordance with a video signal. The light-emitting element may have a function of emitting light in accordance with voltage. In such a structure, in a period during which the capacitor holds a potential, the first transistor and the second transistor are off and may be electrically disconnected from a driver circuit used for supplying a video signal. In a period during which the capacitor holds a potential, operation in which the potential of the second wiring is set to the potential of the first wiring, operation in which the potential of the fourth wiring is set to the potential of the third wiring, and operation in which the supply of a potential to the first wiring, the second wiring, the third wiring, and the fourth wiring may be performed.

In any of the above structures, it is preferable that the first transistor and the second transistor each include an oxide semiconductor.

One embodiment of the present invention is a module including the light-emitting device having any of the above structures and a touch sensor. One embodiment of the present invention is a module in which a connector such as a flexible printed circuit (FPC) or a tape carrier package (TCP) is attached to the light-emitting device having any of the above structures. One embodiment of the present invention is a module in which an IC is provided in the light-emitting device having any of the above structures by a chip on glass (COG) method or the like.

One embodiment of the present invention also includes an electronic device or a lighting device including the light-emitting device with any of the above structures. For example, one embodiment of the present invention is an electronic device including the light-emitting device or the module which has any of the above structures; and a sensor, a housing, a speaker, a microphone, an operation switch, or an operation button.

According to one embodiment of the present invention, a light-emitting device which can be used in a wide temperature range can be provided. According to one embodiment of the present invention, a light-emitting device which can be used in a high-temperature environment can be provided. According to one embodiment of the present invention, a light-emitting device which can be used in a low-temperature environment can be provided. In particular, a light-emitting device which is thin, lightweight, or flexible and which can be used in a wide temperature range can be provided.

According to one embodiment of the present invention, a small light-emitting device can be provided. According to one embodiment of the present invention, a light-emitting device with high heat resistance can be provided. According to one embodiment of the present invention, a light-emitting device with a high degree of safety can be provided. According to one embodiment of the present invention, a light-emitting device with low power consumption can be provided. According to one embodiment of the present invention, a light-emitting device which can be used for a long time per charge can be provided.

Note that the descriptions of these effects do not disturb the existence of other effects. One embodiment of the present invention does not necessarily achieve all the effects listed above. Other effects can be derived from the description of the specification, the drawings, and the claims.

BRIEF DESCRIPTION OF THE DRAWINGS

In the accompanying drawings:

FIGS. 1A to 1D illustrate an example of a light-emitting device;

FIGS. 4A to 4C each illustrate an example of a light-emitting device;

FIGS. 6A to 6D illustrate an example of a light-emitting panel;

FIGS. 7A to 7C each illustrate an example of a light-emitting panel;

FIGS. 9A to 9F illustrate an example of a secondary battery;

FIGS. 16A to 16F show examples of a light-emitting panel and the like;

FIGS. 17A and 17B show examples of light-emitting panels and the like;

FIGS. 18A to 18E illustrate examples of light-emitting panels and the like;

FIGS. 20A to 20H each illustrate an example of an electronic device;

DETAILED DESCRIPTION OF THE INVENTION

Figure 2A:
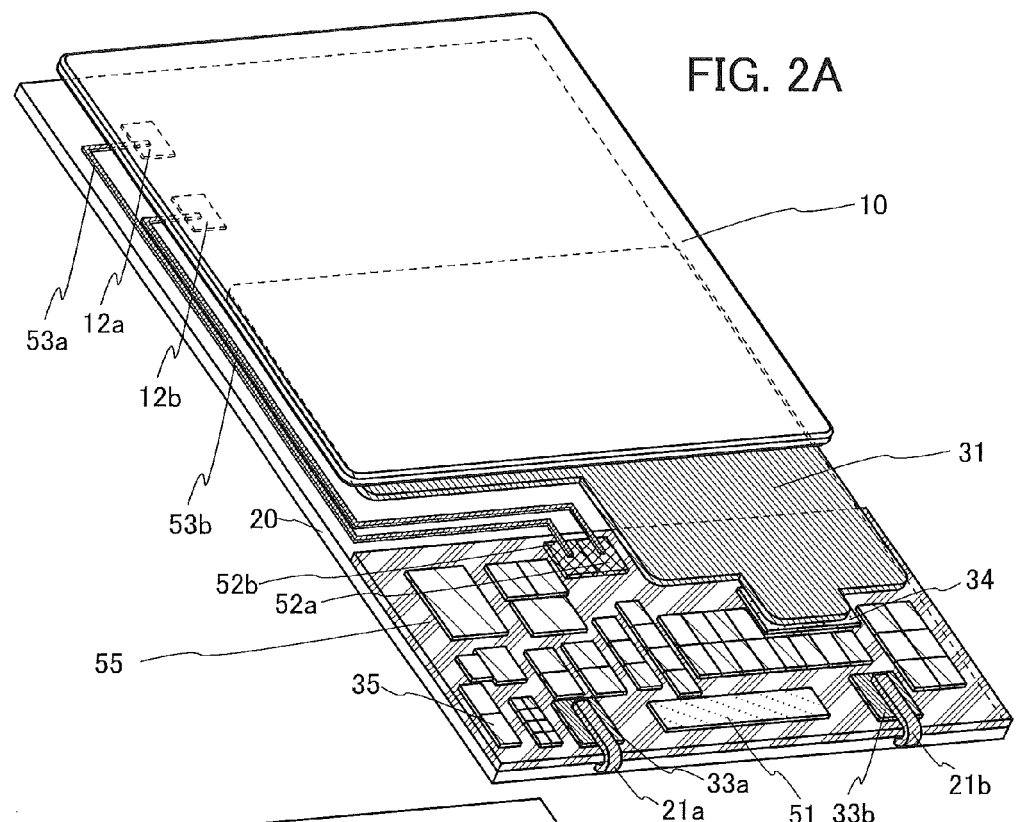
FIGS. 2A and 2B illustrate an example of a light-emitting device.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the descriptions of the embodiments below.

Note that in the structures of the invention described below, the same portions or portions having similar functions are denoted by the same reference numerals in different drawings, and the descriptions of such portions are not repeated. Furthermore, the same hatching pattern is applied to portions having similar functions, and the portions are not denoted by reference numerals in some cases.

The position, size, range, or the like of each structure illustrated in drawings is not accurately represented in some cases for easy understanding. Therefore, the disclosed invention is not necessarily limited to the position, the size, the range, or the like disclosed in the drawings.

The terms "film" and "layer" can be interchanged with each other depending on the case or circumstances. For example, the term "conductive layer" can be changed into the term "conductive film". Also, the term "insulating film" can be changed into the term "insulating layer".

Embodiment 1

In this embodiment, a light-emitting device of one embodiment of the present invention is described with reference to FIGS. 1A to 1D.

A light-emitting device 100 illustrated in FIG. 1A includes a light-emitting panel 10, a secondary battery 20, a circuit 30, and a sealing structure 40. The light-emitting panel 10, the secondary battery 20, and the circuit 30 are provided inside the sealing structure 40. The light-emitting panel 10, the secondary battery 20, and the circuit 30 are sealed by a sealing region 41 of the sealing structure 40.

In this specification and the like, among components of a light-emitting device of one embodiment of the present invention, components which are positioned inside the sealing structure 40 and are sealed by the sealing region 41 are also collectively referred to as a sealed object. For example, the light-emitting panel 10, the secondary battery 20, and the circuit 30 illustrated in FIG. 1A can be referred to as a sealed object. FIG. 1B is a block diagram illustrating an example of a connection relationship of a sealed object.

The light-emitting panel 10 includes a light-emitting element 11. The light-emitting element 11 has a function of emitting light with power supplied from the secondary battery 20.

It is preferable that the light-emitting element 11 can emit light at a temperature of 0° C. It is preferable that the light-emitting element 11 can emit light at a temperature of 100° C. Note that the light-emitting panel 10 may have a function of emitting light with power supplied from a component other than the secondary battery 20.

The secondary battery 20 includes a portion overlapping with the light-emitting panel 10.

It is preferable that the secondary battery 20 can supply power to the light-emitting panel 10 at a temperature of 0° C. It is preferable that the secondary battery 20 can supply power to the light-emitting panel 10 at a temperature of 100° C. Note that the secondary battery 20 may have a function of supplying power to a component other than the light-emitting panel 10.

The circuit 30 includes an antenna 31. The antenna 31 includes a portion overlapping with the light-emitting panel 10. The circuit 30 can charge the secondary battery 20 wirelessly (without contact).

The portion where the light-emitting panel 10 and the circuit 30 overlap with each other and the portion where the light-emitting panel 10 and the secondary battery 20 overlap with each other enable a reduction in size of the light-emitting device 100. In particular, it is preferable that a portion where the light-emitting panel 10, the secondary battery 20, and the circuit 30 overlap with one another be provided. A short entire periphery of the sealing region 41 is preferable because the shorter the length of the entire periphery is, the lower the probability of breaking the sealing is, so that a reduction in reliability of the light-emitting device can be suppressed.

It is preferable that the secondary battery 20 include a portion overlapping with the circuit 30. For example, at least part of the antenna 31 may be overlapped with the secondary battery 20. The appearance of the light-emitting device can be maintained by overlapping of the light-emitting panel 10, the secondary battery 20, and the circuit 30 so that the user of the light-emitting device hardly perceives the antenna 31, e.g., by providing the antenna 31 between the light-emitting panel 10 and the secondary battery 20, which is preferable. The antenna 31 provided between the light-emitting panel 10 and the secondary battery 20 receives power from an external antenna through the light-emitting panel 10.

A light-emitting element of the light-emitting device of one embodiment of the present invention can emit light at both temperatures of 0° C. and 100° C. Furthermore, a secondary battery of the light-emitting device of one embodiment of the present invention can supply power to the light-emitting panel at both temperatures of 0° C. and 100° C. Therefore, the light-emitting device of one embodiment of the present invention can be used in a low-temperature environment and a high-temperature environment. The light-emitting device of one embodiment of the present invention can be used in a wide temperature range (e.g., higher than or equal to 0° C. and lower than or equal to 100° C., preferably higher than or equal to −25° C. and lower than or equal to 150° C., more preferably higher than or equal to −50° C. and lower than or equal to 200° C.). The light-emitting device of one embodiment of the present invention may be used either indoors or outdoors.

A light-emitting panel and a secondary battery are provided inside a sealing structure in the light-emitting device of one embodiment of the present invention. In the case where a light-emitting element or a secondary battery can be used in a narrow temperature range, the light-emitting device cannot be used in some cases because the light-emitting device is affected by a low-temperature environment or a high-temperature environment. To reduce the influence of the temperature in a usage environment, the sealing structure needs to have sufficiently high heat resistance or sufficiently low thermal conductance, for example. On the other hand, since the light-emitting element and the secondary battery of the light-emitting device of one embodiment of the present invention can operate at temperatures of 0° C. and 100° C., conditions of heat resistance and thermal conductance required for the sealing structure are not severe and the range of choices of materials that can be used for the sealing structure can be wide. Instead of glass, an organic resin or the like can be used as the material for the sealing structure. Thus, the light-emitting device can be made thin, lightweight, or flexible.

In the light-emitting device of one embodiment of the present invention, a secondary battery can be charged by non-contact power transmission. Therefore, the secondary battery does not need to be taken out from the sealing structure in charging. The sealing structure is not necessarily provided with a hinge such as a zipper; thus, the sealing capability can be increased.

The light-emitting device may include a switch. In FIGS. 1C and 1D, the light-emitting panel 10, the secondary battery 20, the circuit 30, a circuit 50, and a switch 51 are illustrated as a sealed object.

As illustrated in FIG. 1C, the circuit 30 can charge the secondary battery 20 wirelessly when the switch 51 is off. As illustrated in FIG. 1D, the secondary battery 20 can supply power to the light-emitting panel 10 when the switch 51 is on.

Components of the light-emitting device of one embodiment of the present invention are described in detail below.

<Light-Emitting Panel 10>

The light-emitting panel 10 includes the light-emitting element 11. The light-emitting panel may include a sensing element such as a touch sensor. Examples of a structure of the light-emitting panel 10 are detailed in Embodiment 2.

In the light-emitting panel 10, an active matrix method in which an active element (a non-linear element) is included in a pixel or a passive matrix method in which an active element is not included in a pixel can be used.

The light-emitting panel 10 may be flexible. For example, when a film is used for at least one of a supporting substrate and a sealing substrate of the light-emitting element 11, the flexibility of the light-emitting panel 10 can be increased.

It is preferable that an element capable of emitting light in a low-temperature environment and a high-temperature environment be used as the light-emitting element 11. The low-temperature environment is, for example, an environment at higher than or equal to −100° C. and lower than or equal to 0° C., preferably higher than or equal to −100° C. and lower than or equal to −25° C., more preferably higher than or equal to −100° C. and lower than or equal to −50° C. The high-temperature environment is, for example, an environment at higher than or equal to 100° C. and lower than or equal to 300° C., preferably higher than or equal to 150° C. and lower than or equal to 300° C., more preferably higher than or equal to 200° C. and lower than or equal to 300° C. Note that the light-emitting element 11 can emit light in an environment at higher than 0° C. and lower than 100° C., in addition to the low-temperature environment or the high-temperature environment. For example, the light-emitting element 11 can emit light at a room temperature (higher than or equal to 20° C. and lower than or equal to 30° C.).

As the light-emitting element 11, a self-luminous element can be used, and an element whose luminance is controlled by current or voltage is included in the category of the light-emitting element 11. For example, a light-emitting diode (LED), an organic EL element, an inorganic EL element, or the like can be used. A display element can be used without being limited to the light-emitting element.

It is preferable that the heat resistance of the light-emitting element 11 be as high as possible. For example, in the case where an organic EL element is used as the light-emitting element 11, the glass transition temperature of each of organic compounds contained in the organic EL element is preferably higher than or equal to 100° C. and lower than or equal to 300° C., more preferably higher than or equal to 150° C. and lower than or equal to 300° C.

It is preferable that since an antenna receives power from an external antenna through a light-emitting panel in the light-emitting device of one embodiment of the present invention, the thickness of a pair of electrodes in the light-emitting element 11 be as small as possible. For example, the total thickness of the pair of electrodes is less than or equal to 1 µM, preferably less than or equal to 500 nm, more preferably less than or equal to 350 nm, still more preferably less than or equal to 250 nm.

<Secondary Battery 20>

It is preferable that a secondary battery capable of supplying power to the light-emitting panel 10 in a low-temperature environment and a high-temperature environment be used as the secondary battery 20. The low-temperature environment is, for example, an environment at higher than or equal to −100° C. and lower than or equal to 0° C., preferably an environment at higher than or equal to −100° C. and lower than or equal to −25° C., more preferably an environment at higher than or equal to −100° C. and lower than or equal to −50° C. The high-temperature environment is, for example, an environment at higher than or equal to 100° C. and lower than or equal to 300° C., preferably an environment at higher than or equal to 150° C. and lower than or equal to 300° C., more preferably an environment at higher than or equal to 200° C. and lower than or equal to 300° C. Note that the secondary battery 20 can be used in an environment at higher than 0° C. and lower than 100° C., in addition to the low-temperature environment or the high-temperature environment. For example, the secondary battery 20 can be used at a room temperature (higher than or equal to 20° C. and lower than or equal to 30° C.).

As examples of the secondary battery 20, a lithium ion secondary battery such as a lithium polymer battery (lithium ion polymer battery) using a gel electrolyte, a nickel-hydride battery, a nickel-cadmium battery, an organic radical battery, a lead-acid battery, an air secondary battery, a nickel-zinc battery, and a silver-zinc battery can be given.

A lithium ion secondary battery which achieves a high energy density is preferable because the light-emitting device can be lightweight and small.

For example, a secondary battery containing a nonaqueous electrolyte can be used. The nonaqueous electrolyte contains an ionic liquid (room temperature molten salt) and an alkali metal salt. A secondary battery with high heat resistance can be obtained because the ionic liquid has non-flammability and non-volatility. For example, the ionic liquid preferably contains an imidazolium cation and an anion. The alkali metal salt is preferably a lithium salt.

A secondary battery using a gel electrolyte or an all-solid-state secondary battery using a solid electrolyte are preferable because the heat resistance and the level of safety are high.

As the secondary battery 20, any of secondary batteries with a variety of shapes, such as a coin-type (single-layer flat type) secondary battery, a cylindrical secondary battery, a thin secondary battery, a square-type secondary battery, and a sealed secondary battery can be used. Furthermore, a structure in which a plurality of positive electrodes, a plurality of negative electrodes, and a plurality of separators are stacked or a structure in which a positive electrode, a negative electrode, and a separator are wound (winding structure) may be employed.

The secondary battery 20 may be flexible. For example, when a film is used as an exterior body, the flexibility of the secondary battery 20 can be increased. In a region surrounded by the exterior body, at least a positive electrode, a negative electrode, and an electrolyte (or an electrolytic solution) are provided.

In the light-emitting device, the light-emitting element 11 and the secondary battery 20 may be provided to overlap with each other. As the area where the light-emitting element 11 and the secondary battery 20 are overlapped with each other is larger, the secondary battery 20 can be made warm in a wider area by utilizing heat of the light-emitting element 11. The reliability of the light-emitting device can be increased even in the case where a secondary battery which operates more hardly in a low-temperature environment than in a high-temperature environment is used.

Examples of a structure of the secondary battery 20 are detailed in Embodiment 3.

<Circuit 30>

The circuit 30 includes the antenna 31. The circuit 30 may include a controller 32.

The antenna 31 can receive power from an external antenna (e.g., an antenna 61 of a charger). The antenna 31 may receive power from an external antenna through the light-emitting panel 10. Alternatively, the antenna 31 may receive power from an external antenna through the secondary battery 20.

The controller 32 has a function of converting power received with the antenna 31 into power to be supplied to the secondary battery 20 and outputting the power to the secondary battery 20. For example, the controller 32 may function as an AC-DC converter. In that case, the controller 32 converts power received with the antenna 31 into DC power and outputs the DC power to the secondary battery 20.

The light-emitting device of one embodiment of the present invention is charged in the following manner by an electromagnetic induction method in which the antenna 61 of a charger (primary coil) and the antenna 31 of the light-emitting device (secondary coil) are magnetically coupled and a voltage is generated at the secondary coil with an alternating magnetic field generated from the primary coil, power is transmitted to the secondary coil side without contact. Note that the power receiving method is not limited to an electromagnetic induction method.

The uses for the antenna of the light-emitting device are not limited to charging of a secondary battery without contact. For example, the light-emitting device may be provided with an antenna and a memory between which electronic data is transmitted and received. The light-emitting panel 10 may display an image, data, or the like in accordance with the received data. An antenna having a GPS function with which location information or GPS time can be obtained may be provided.

It is preferable for safety that input-output terminals for charging or discharging a secondary battery be not exposed on a surface of the light-emitting device. In the case where the input-output terminals are exposed, the input-output terminals might short-circuit by water such as rain, or the input-output terminals might be in contact with a human body and cause an electric shock. The use of the antenna 31 enables a structure in which the input-output terminals are not exposed on a surface of the light-emitting device because the secondary battery can be charged without contact.

<Sealing Structure 40>

A sealed object including the light-emitting panel 10, the secondary battery 20, the circuit 30, and the like is provided inside the sealing structure 40. The sealing structure 40 includes the sealing region 41. The sealed object is sealed in the sealing region 41 and is isolated from the air outside the sealing structure 40.

For example, the sealing structure 40 is laminated (e.g., sealed) to form the sealing region 41. Note that when a sealed object is directly put into the sealing structure 40 and sealed, a surface of the light-emitting device becomes uneven along the shape of the sealed object in some cases. When the sealed object is put into a case such as a plastic case and the case is put into the sealing structure 40 and sealed, the surface of the light-emitting device becomes flat, which is preferable.

A hinge such as a zipper may be used as the sealing region 41. For example, a zipper of a light-emitting device which has been sealed once may be opened, the light-emitting panel 10 or the secondary battery 20 may be exchanged, and then the light-emitting device may be sealed again.

The sealing structure 40 may be flexible. For example, when a film is used for the sealing structure 40, the flexibility of the sealing structure 40 can be increased.

There is no limitation on the material of the sealing structure 40 as long as the material can withstand a temperature in a usage environment. The sealing structure 40 can be formed using a variety of materials such as glass, an organic resin, plastics, and a metal, for example.

For the sealing structure 40, a material having flexibility and a light-transmitting property with respect to visible light, e.g., polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, or an aramid resin can be used.

The sealing structure 40 preferably has high water resistance. By preventing entry of moisture from the outside of the light-emitting device into the light-emitting panel 10 or the like, the reliability of the light-emitting device can be increased.

<Circuit 50>

The circuit 50 has a function of converting power supplied from the secondary battery 20 into power which makes the light-emitting element 11 emit light. For example, the circuit 50 may have a function of converting (stepping up or stepping down) output voltage of the secondary battery 20 into voltage which makes the light-emitting element 11 emit light.

The circuit 50 may have a function of controlling timing when the light-emitting element 11 emits light. For example, the circuit 50 may have a function of driving the light-emitting element 11 so that the light-emitting element 11 blinks.

The circuit 50 may have a function of generating a signal for driving the light-emitting panel 10 and outputting the signal to the light-emitting panel 10. The circuit 50 may include a signal line driver circuit or a scan line driver circuit. The light-emitting panel 10 may include a signal line driver circuit or a scan line driver circuit.

<Switch 51>

The switch 51 is electrically connected to the circuit 50. The switch 51 is also electrically connected to the secondary battery 20. The switch 51 is also electrically connected to the circuit 30.

There is no particular limitation on the switch 51. For example, an electrical switch, a mechanical switch, or the like can be used. Specifically, a transistor, a diode, a magnetic switch, a mechanical switch, or the like can be used.

Figure 2B:
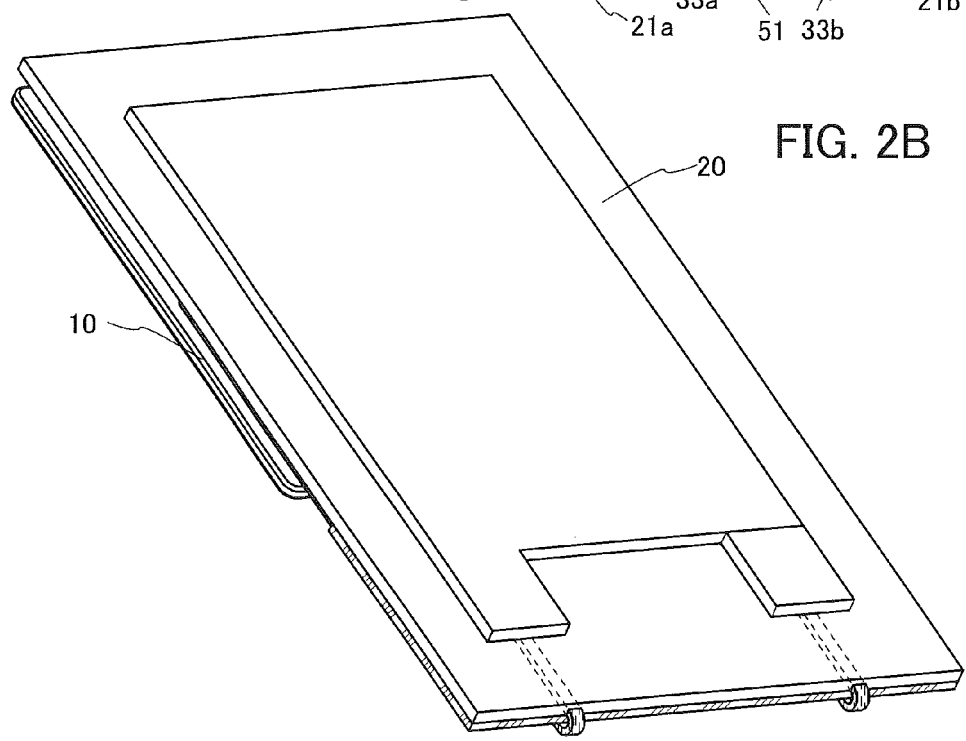

FIGS. 2A and 2B illustrate a specific example of the sealed object. FIG. 2A illustrates a front surface (light-emitting surface) of the sealed object, and FIG. 2B illustrates a rear surface of the sealed object.

FIGS. 2A and 2B illustrate an example where a laminated secondary battery is used as the secondary battery 20. As illustrated in FIG. 2B, the central portion of the secondary battery 20 is a portion where a plurality of electrodes are stacked and has a larger thickness than an end portion.

An electrode 21a is electrically connected to one of a positive electrode and a negative electrode of the secondary battery. An electrode 21b is electrically connected to the other of the positive electrode and the negative electrode of the secondary battery.

The electrodes 21a and 21b are each bent so as to sandwich the circuit board 55 and are electrically connected to terminals 33a and 33b, respectively, over the circuit board 55.

The circuit board 55 is provided with components (shown as electronic parts 35) included in the circuit 30, the circuit 50, and the like illustrated in FIG. 1C and the like. The circuit board 55 is provided with electronic parts, for example, a capacitor, a resistor, or a switching element. As the circuit board 55, a printed circuit board can be used, for example.

The circuit board 55 is provided with the switch 51. FIGS. 2A and 2B illustrate an example where a magnetic switch is used as the switch 51. By attaching or detaching the magnet, the on/off state of the switch can be switched.

The antenna 31 is electrically connected to a terminal 34 over the circuit board 55. Part of the antenna 31 is positioned between the secondary battery 20 and the light-emitting panel 10. That is, in the light-emitting device, the antenna 31 includes a portion overlapping with the light-emitting panel 10. Furthermore, the antenna 31 includes a portion overlapping with the secondary battery 20.

The antenna 31 can receive power from an external antenna through the light-emitting panel 10.

In the light-emitting panel 10, a terminal 12a is electrically connected to one of an anode and a cathode of the light-emitting element 11. A terminal 12b is electrically connected to the other of the anode and the cathode of the light-emitting element 11. The terminals 12a and 12b each may function as the anode or the cathode of the light-emitting element 11.

The terminal 12a is electrically connected to a terminal 52a over the circuit board 55 through a wiring 53a. The terminal 12b is electrically connected to a terminal 52b over the circuit board 55 through a wiring 53b.

In the light-emitting device of one embodiment of the present invention, the secondary battery and the antenna each independently includes a portion overlapping with the light-emitting panel. Furthermore, the secondary battery and the circuit are partly overlapped with each other. As illustrated in FIGS. 2A and 2B, part of the antenna may be positioned between the light-emitting panel and the secondary battery, for example.

When at least two of components of the light-emitting device, e.g., the secondary battery, the light-emitting panel, the circuit board, and the antenna, partly overlap with each other as described above, the size of the light-emitting device can be reduced, which is preferable. A short entire periphery of the sealing region is preferable because the shorter the length of the entire periphery is, the lower the probability of breaking the sealing, so that a reduction in reliability of the light-emitting device can be suppressed.

For example, the secondary battery 20 preferably includes a portion overlapping with at least one of the light-emitting panel 10, the circuit board 55, and the antenna 31. It is particularly preferable that the secondary battery 20 include respective portions overlapping with the light-emitting panel 10, the circuit board 55, and the antenna 31 as illustrated in FIGS. 2A and 2B.

An environment where the light-emitting device of one embodiment of the present invention can be used is not limited to an air atmosphere. The light-emitting device of one embodiment of the present invention can be used in water at temperatures of higher than or equal to 0° C. and lower than or equal to 100° C., for example. The light-emitting device of one embodiment of the present invention can have high reliability even when used in water since the light-emitting element and the secondary battery can be used in a wide temperature range and are sealed by a sealing structure, for example.

FIGS. 3A to 3F are each a schematic cross-sectional view of a light-emitting device of one embodiment of the present invention.

As illustrated in FIGS. 3A to 3F, the light-emitting panel 10, the secondary battery 20, and the circuit 30 are provided in a sealing structure in the light-emitting device. The light-emitting panel 10, the secondary battery 20, and the circuit 30 are sealed in the sealing region 41 of the sealing structure.

A space 42 sealed by the sealing region 41 is preferably in a reduced-pressure atmosphere or an inert atmosphere. By such an atmosphere, the reliability of the light-emitting panel 10 or the like can be increased compared with an air atmosphere.

Figure 3A:
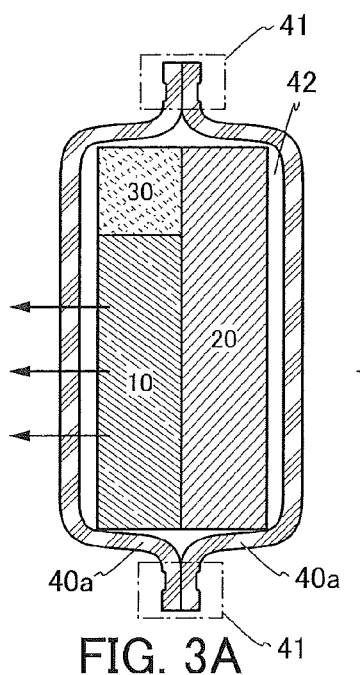
FIGS. 3A to 3F each illustrate an example of a light-emitting device.

FIG. 3A illustrates an example where the sealing structure 40a which transmits visible light is used. The sealing structure 40a can transmit light emitted from a light-emitting element of the light-emitting panel 10. The user can perceive the light-emitting panel 10, the secondary battery 20, and the circuit 30 through the sealing structure 40a.

Figure 3B:
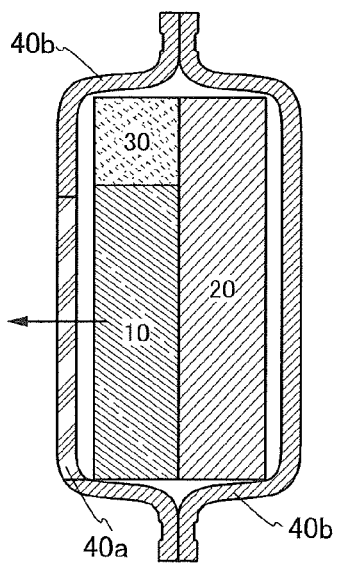
Figure 3C:
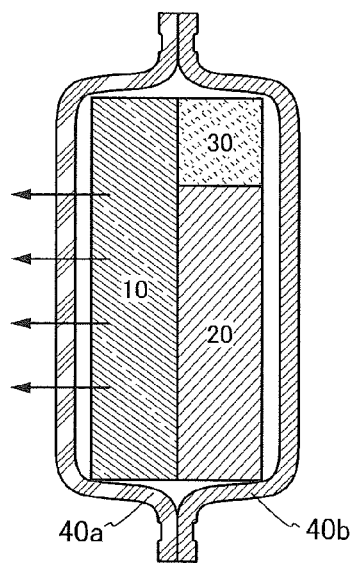

In one embodiment of the present invention, the sealing structure does not necessarily transmit visible light in a portion other than a portion overlapping with a light-emitting region of the light-emitting panel 10. For example, FIGS. 3B and 3C illustrate an example where the sealing structure 40a transmitting visible light is used as the portion of the sealing structure which overlaps with the light-emitting region of the light-emitting panel 10 and a sealing structure 40b blocking visible light is used as the other portions of the sealing structure. Since the sealing structure 40b blocks visible light, the user can be prevented from perceiving the secondary battery 20 and the circuit 30.

Although FIGS. 3A and 3B and the like illustrate an example where the secondary battery 20 and the light-emitting panel 10 overlap with each other and the secondary battery 20 and the circuit 30 overlap with each other when seen from a light-emitting surface of the light-emitting device, the light-emitting panel 10 and the circuit 30 may overlap with each other as illustrated in FIG. 3C. Instead of the circuit 30, the circuit board 55 illustrated in FIG. 2A may be provided.

Figure 3D:
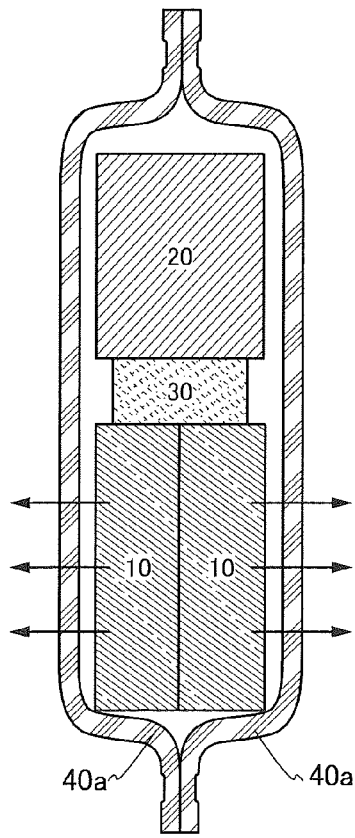

The number of each of the light-emitting panels 10, the secondary batteries 20, and the circuits 30 of the light-emitting device is not limited to one, and may be two or more independently. For example, two light-emitting panels 10 may be provided as illustrated in FIG. 3D. A double-side light-emitting device may be used. In the case of using a double-side light-emitting panel 10, a double-side light-emitting device can be manufactured with one light-emitting panel 10.

As illustrated in FIG. 3D, the light-emitting panel 10, the secondary battery 20, and the circuit 30 included in the light-emitting device do not necessarily include a portion overlapping with one another when seen from a light-emitting surface of the light-emitting device.

Figure 3E:
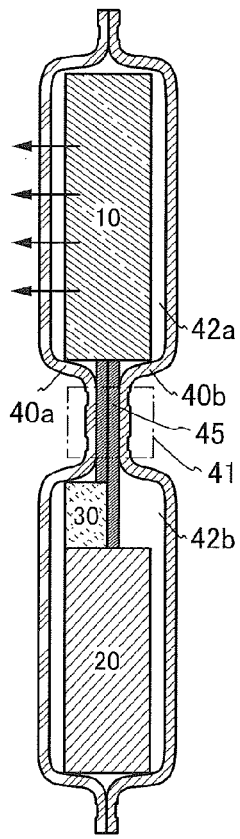

As illustrated in FIG. 3E and FIGS. 4A and 4B, the light-emitting device may include a plurality of spaces. FIG. 4A is a plan view of the light-emitting device illustrated in FIG. 3E when seen from the sealing structure 40a side. FIG. 4B is a perspective view when the light-emitting device illustrated in FIG. 3E is bent. Components may be placed in a plurality of spaces, and a wiring 45 or the like for connecting the components placed in the plurality of spaces may overlap with the sealing region 41. Such a region can be referred to as a flexible region 70. As illustrated in FIG. 4B, the light-emitting device can be bent in the flexible region 70. In this manner, the light-emitting device may be flexible. In the case where at least one of the light-emitting panel 10, the secondary battery 20, and the circuit 30 is flexible, the light-emitting device may be changed in shape by bending one or more of them.

FIG. 3E illustrates an example of a light-emitting device having a space 42a including the light-emitting panel 10 and a space 42b including the secondary battery 20 and the circuit 30. The light-emitting panel 10 is electrically connected to the secondary battery 20 and the circuit 30 through the wirings 45.

Figure 3F:
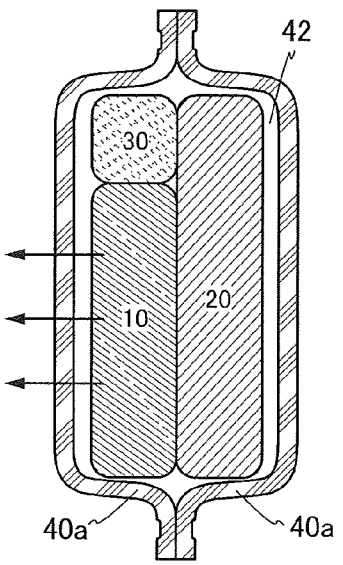

It is preferable that an end portion of each of the light-emitting panel 10, the secondary battery 20, and the circuit 30 be chamfered as illustrated in FIG. 3F. Breaking the sealing at corner portions of the light-emitting panel 10, the secondary battery 20, the circuit 30, and the like can be prevented; thus, a reduction in reliability of the light-emitting device can be suppressed even when a film or the like is used as a sealing structure.

In the light-emitting device, the sealing region may be doubly included. As illustrated in FIG. 4C, a sealing region 41b surrounding a sealing region 41a may be provided and the light-emitting panel 10 and the like may be doubly sealed. Double or multiple sealing can increase the reliability of the light-emitting device.

Note that the light-emitting device of one embodiment of the present invention may be used as a display device or as a lighting device. For example, the light-emitting device may be used as a light source such as a backlight or a front light, i.e., a lighting device for a display device.

The light-emitting device of one embodiment of the present invention may include another semiconductor circuit, e.g., a control circuit for preventing overcharge, an imaging element, a sensor such as a gyroscope sensor or an acceleration sensor, a touch panel, or the like. For example, when an imaging element is included, a taken image can be displayed on the light-emitting panel. When a touch panel is included, the electronic device can be operated or information can be input by touching a predetermined position of the touch panel. When a memory or a CPU is included, a computer which can be used in a wide temperature range can be provided.

The light-emitting device of one embodiment of the present invention may be provided with a belt or a clasp for being fixed to an arm or a wrist of a human body or a robot. A part on which the light-emitting device is worn is not particularly limited, and the light-emitting device may be worn on any part of a human body or a robot such as a waist or an ankle.

The light-emitting device of one embodiment of the present invention includes a secondary battery and can be used in a wide temperature range, for example; thus, it can be preferably used as a portable light-emitting device.

This embodiment can be combined as appropriate with any of the other embodiments.

Embodiment 2

In this embodiment, a light-emitting panel that can be used for the light-emitting device of one embodiment of the present invention is described with reference to FIGS. 5A to 5D, FIGS. 6A to 6D, and FIGS. 7A to 7C. In this embodiment, an example where an organic EL element is used as a light-emitting element is described.

The organic EL element includes a layer containing a light-emitting organic compound (also referred to as an EL layer) between a pair of electrodes (a lower electrode and an upper electrode). When a voltage higher than the threshold voltage of the light-emitting element is applied between the lower electrode and the upper electrode, holes are injected to the EL layer from the anode side and electrons are injected to the EL layer from the cathode side. The injected electrons and holes are recombined in the EL layer, so that a light-emitting substance contained in the EL layer emits light.

The organic EL element may have any of a top emission structure, a bottom emission structure, and a dual emission structure. A conductive film that transmits visible light is used as the electrode through which light is extracted. A conductive film that reflects visible light is preferably used as the electrode through which light is not extracted.

For the EL layer, an organic compound with high heat resistance is preferably used. For example, an organic compound whose glass transition temperature is higher than or equal to 100° C. and lower than or equal to 300° C., preferably higher than or equal to 150° C. and lower than or equal to 300° C., more preferably higher than or equal to 200° C. and lower than or equal to 300° C. is used. Either a low molecular compound or a high molecular compound can be used for the EL layer, and an inorganic compound may also be used.

Each of the layers included in the EL layer can be formed by any of the following methods: an evaporation method (including a vacuum evaporation method), a transfer method, a printing method, an inkjet method, a coating method, and the like.

The EL layer includes at least a light-emitting layer. The light-emitting layer includes a light-emitting organic compound. The glass transition temperature of the light-emitting organic compound is preferably higher than or equal to 100° C. and lower than or equal to 300° C., more preferably higher than or equal to 150° C. and lower than or equal to 300° C., still more preferably higher than or equal to 200° C. and lower than or equal to 300° C.

Although there is no particular limitation on a material which is contained in the EL layer, any of the following substances can be contained as the guest material, for example: high heat-resistant materials such as N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(dibenzofuran-4-yl)phenyl]-N,N'-diphenylpyrene-1,6-diamine (abbreviation: 1,6FrAPm-II), (acetylacetonato)bis(6-tert-butyl-4-phenylpyrimidinato)iridium(III) (abbreviation: [Ir(tBuppm)$_2$(acac)]), (acetylacetonato)bis(4,6-diphenylpyrimidinato)iridium(III) (abbreviation: [Ir(dppm)$_2$(acac)]), and bis{4,6-dimethyl-2-[3-(3,5-dimethylphenyl)-5-phenyl-2-pyrazinyl-κN]phenyl-κC}(2,6-dimethyl-3,5-heptanedionate-κ$^2$O,O')iridium(III) (abbreviation: [Ir(dmdppr-P)$_2$(dibm)]).

In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Although there is no particular limitation on a material with a high hole-transport property, any of the following materials can be used, for example: high heat-resistant materials such as N-(1,1'-biphenyl-4-yl)-N-[4-(9-phenyl-9H-carbazol-3-yl)phenyl]-9,9-dimethyl-9H-fluoren-2-amine (abbreviation: PCBBiF) and 4,4',4''-(1,3,5-benzenetriyl)tri(dibenzothiophene) (abbreviation: DBT3P-II).

There is no particular limitation on a material having a high electron-transport property. For example, by stacking a layer containing 2,9-di(2-naphthyl)-4,7-diphenyl-1,10-phenanthroline (abbreviation: NBPhen) and a layer containing a condensed aromatic compound or a condensed heteroaromatic compound as an electron-transport layer, heat resistance of the organic EL element can be improved. Since the layer containing NBPhen has an electron-transport property, it is preferably provided closer to the cathode than a light-emitting region is. The layer containing NBPhen may be in contact with an electron-injection layer or the cathode on the side opposite to the side in contact with the layer containing the condensed aromatic compound or the condensed heteroaromatic compound.

The condensed aromatic compound or the condensed heteroaromatic compound is preferably a compound having a condensed ring skeleton including three or more rings. This is because the interface between NBPhen and the compound having the condensed ring skeleton including three or more rings is thermally and electrically very stable.

The light-emitting element of this embodiment shows a small decrease in luminance even when kept in an environment at high temperature. In the case of using the layer containing the condensed heteroaromatic compound, a change in drive voltage can also be reduced.

In the case of using the condensed heteroaromatic compound, the condensed heteroaromatic compound preferably includes two nitrogen atoms in one condensed ring skeleton because this enables the light-emitting element to have high reliability and also contributes to a decrease in drive voltage.

The condensed heteroaromatic compound is suitable as a host material for a phosphorescent material or as a material of an electron-transport layer adjacent to a phosphorescent light-emitting layer; therefore, the light-emitting element is preferably a light-emitting element which emits phosphorescent light. A phosphorescent light-emitting element having the above structure can have high reliability with improved heat resistance, and can have both high reliability and high emission efficiency due to the use of phosphorescent light emission.

Suitable examples of the condensed aromatic compound include compounds having condensed ring skeletons each including three or more rings, e.g., anthracene compounds such as 9-phenyl-3-[4-(10-phenyl-9-anthryl)phenyl]-9H-carbazole (abbreviation: PCzPA 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA) and tetracene compounds such as 5,12-bis(2,4-diphenylphenyl)tetracene. Among these compounds, anthracene compounds are particularly preferable because a light-emitting element with long lifetime can be easily obtained.

Examples of the condensed heteroaromatic compound include heterocyclic compounds having polyazole skeletons, such as 2-[3-(dibenzothiophen-4-yl)phenyl]-1-phenyl-1H-benzimidazole (abbreviation: mDBTBIm-II); condensed heterocyclic compounds including three or more rings having diazine skeletons, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq- II), 2-{3-[3-(2,8-diphenyldibenzothiophen-4-yl)phenyl]phenyl}dibenzo[f,h]quinoxaline (abbreviation: 2mDBTBPDBq-III), and 2-[3'-(9H-carbazol-9-yl)biphenyl-3-yl]dibenzo[f,h]quinoxaline (abbreviation: 2mCzBPDBq); and condensed heterocyclic compounds having pyridine skeletons, such as 2-[3-(dibenzothiophen-4-yl)phenyl]dibenzo[f,h]quinoline (abbreviation: 2mDBTPDBQu-II) and 2-{3-[3-(dibenzothiophen-4-yl)phenyl]phenyl}dibenzo[f,h]quinoline (abbreviation: 2mDBTBPDBQu-II). Among the above materials, a heterocyclic compound having a diazine skeleton and a heterocyclic compound having a pyridine skeleton have high reliability and are thus preferable. Heterocyclic compounds having diazine (pyrimidine or pyrazine) skeletons have a high electron-transport property and contribute to a decrease in drive voltage; thus, among the above compounds, dibenzoquinoxaline derivatives such as 2mDBTPDBq-II, 2mDBTBPDBq-II, and 2mCzBPDBq are particularly suitable.

Note that the material having a high hole-transport property and the material having a high electron-transport property which are described above may be used as a host material or the like for the light-emitting layer.

As a substrate of the light-emitting panel, a substrate having high heat resistance is used. The thermal expansion coefficient of the substrate is preferably greater than 0 ppm/K and less than or equal to 60 ppm/K, more preferably greater than 0 ppm/K and less than or equal to 30 ppm/K, still more preferably greater than 0 ppm/K and less than or equal to 20 ppm/K. Furthermore, the glass transition temperature of the substrate is preferably higher than or equal to 100° C. and lower than or equal to 400° C., more preferably higher than or equal to 150° C. and lower than or equal to 400° C., still more preferably higher than or equal to 200° C. and lower than or equal to 400° C.

As an adhesive layer included in the light-emitting panel, an adhesive having high heat resistance is used. The thermal expansion coefficient of the adhesive is preferably greater than 0 ppm/K and less than or equal to 100 ppm/K, more preferably greater than 0 ppm/K and less than or equal to 70 ppm/K, still more preferably greater than 0 ppm/K and less than or equal to 50 ppm/K. Furthermore, the glass transition temperature of the adhesive is preferably higher than or equal to 80° C. and lower than or equal to 300° C., more preferably higher than or equal to 100° C. and lower than or equal to 300° C., still more preferably higher than or equal to 150° C. and lower than or equal to 300° C.

In the case where a transistor is included in the light-emitting panel, an oxide semiconductor is preferably used as a semiconductor material. An oxide semiconductor has lower temperature dependence than amorphous silicon or polysilicon. With an oxide semiconductor, characteristics of the transistor are hardly changed in a wide temperature range; thus, a highly reliable light-emitting panel can be provided.

Configuration Example 1 of Light-Emitting Panel

Figure 5B:
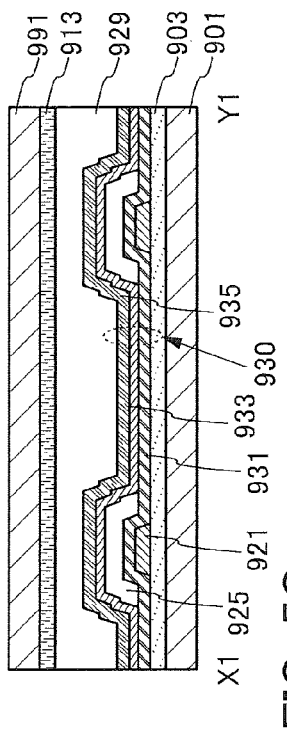
FIGS. 5A to 5D illustrate an example of a light-emitting panel.
Figure 5C:
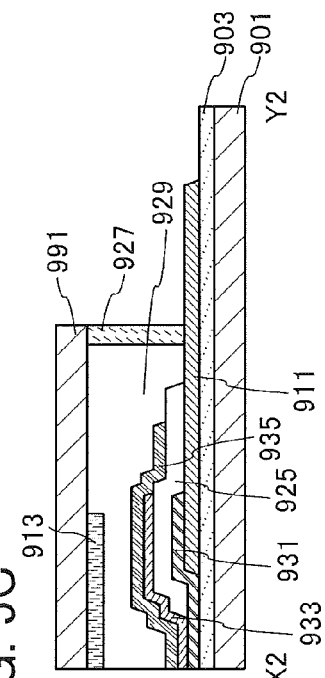
Figure 5D:
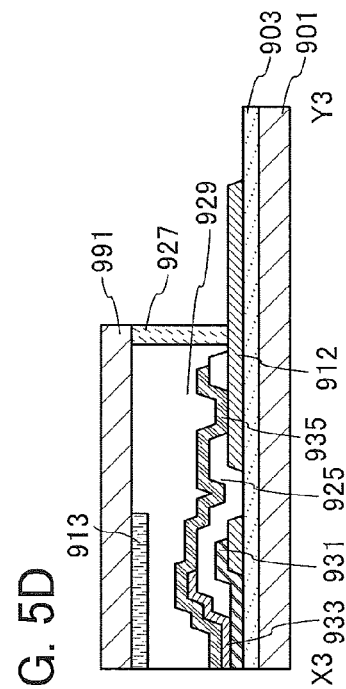
Figure 5A:
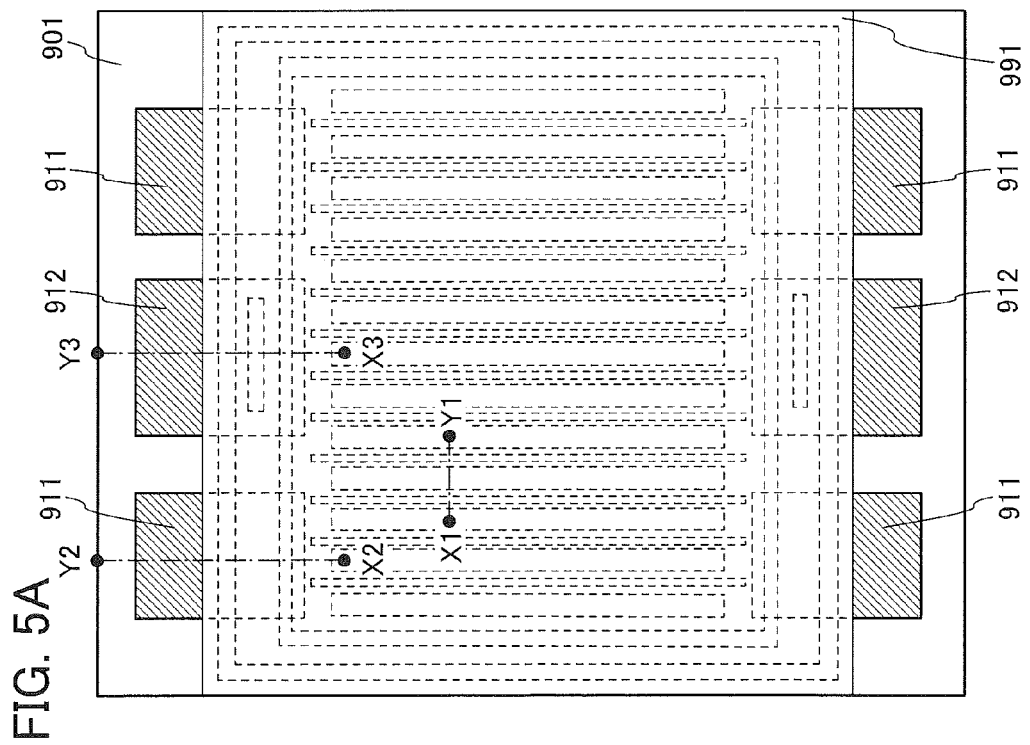

FIG. 5A is a top view illustrating a light-emitting panel. FIG. 5B is a cross-sectional view taken along dashed-dotted line X1-Y1 in FIG. 5A. FIG. 5C is a cross-sectional view taken along dashed-dotted line X2-Y2 in FIG. 5A. FIG. 5D is a cross-sectional view taken along dashed-dotted line X3-Y3 in FIG. 5A.

The light-emitting panel illustrated in FIGS. 5A to 5D includes a substrate 901, an insulating layer 903, an auxiliary electrode 921 (also referred to as an auxiliary wiring), a light-emitting element 930, an insulating layer 925, an adhesive layer 927, a conductive layer 911, a conductive layer 912, a drying agent 913, and a substrate 991.

The light-emitting element 930 is an organic EL element having a bottom-emission structure; specifically, a lower electrode 931 transmitting visible light is provided over the substrate 901, an EL layer 933 is provided over the lower electrode 931, and an upper electrode 935 reflecting visible light is provided over the EL layer 933.

In the light-emitting panel illustrated in FIGS. 5A to 5D, the light-emitting element 930 is provided over the substrate 901 with the insulating layer 903 provided therebetween. The auxiliary electrode 921 provided over the insulating layer 903 is electrically connected to the lower electrode 931. The conductive layer 911 provided over the insulating layer 903 is electrically connected to the lower electrode 931. As illustrated in FIGS. 5A and 5C, part of the conductive layer 911 is exposed and functions as a terminal. The conductive layer 912 provided over the insulating layer 903 is electrically connected to the upper electrode 935. As illustrated in FIGS. 5A and 5D, part of the conductive layer 912 is exposed and functions as a terminal. The end portion of the lower electrode 931 is covered with the insulating layer 925. The insulating layer 925 is provided to cover the auxiliary electrode 921 with the lower electrode 931 provided therebetween.

The light-emitting element 930 is sealed with the substrate 901, the substrate 991, and the adhesive layer 927. A method for sealing the light-emitting panel is not limited, and either solid sealing or hollow sealing can be employed. For example, a glass material such as a glass frit, or a resin material such as a two-component-mixture-type resin which is curable at room temperature, a light curable resin, a thermosetting resin, and the like can be used for the adhesive layer 927. The sealed space 929 may be filled with an inert gas such as nitrogen or argon, or a resin such as a polyvinyl chloride (PVC) resin, an acrylic resin, a polyimide resin, an epoxy resin, a silicone resin, a polyvinyl butyral (PVB) resin, or an ethylene vinyl acetate (EVA) resin. Furthermore, a drying agent may be contained in the resin.

The drying agent 913 is provided in contact with the substrate 991. Since the light-emitting panel illustrated in FIGS. 5A to 5D has a bottom-emission structure, the drying agent 913 can be provided in the space 929 without reducing light extraction efficiency. With the drying agent 913, the lifetime of the light-emitting element 930 can be increased, which is preferable.

Structure Example 2 of Light-Emitting Panel

FIGS. 6A to 6D illustrate an example of a passive matrix light-emitting panel. In a passive matrix light-emitting panel, a plurality of anodes arranged in stripes (in stripe form) are provided to be perpendicular to a plurality of cathodes arranged in stripes, and an EL layer is interposed at each intersection. Therefore, a pixel at an intersection of an anode selected (to which a voltage is applied) and a cathode selected emits light.

FIG. 6A is a plan view illustrating a light-emitting panel before an EL layer is formed. The lower electrode 931 is provided over a substrate. The insulating layer 925 having openings corresponding to light-emitting regions of light-emitting elements is provided over the lower electrode 931. Over the insulating layer 925, a plurality of inversely tapered partitions 928 which are parallel to each other are provided to intersect with the lower electrode 931.

FIG. 6B is a cross-sectional view taken along dashed-dotted line A-B in FIG. 6A, and FIG. 6C is a cross-sectional view taken along dashed-dotted line C-D in FIG. 6A. FIGS. 6B and 6C illustrate a structure after the EL layer 933 and the upper electrode 935 are formed over the lower electrode 931 to constitute the light-emitting element 930.

FIGS. 6B and 6C illustrate an example where the insulating layer 903 is provided over the substrate 901 and a plurality of lower electrodes 931 are arranged in stripes at regular intervals over the insulating layer 903.

As illustrated in FIG. 6C, the total thickness of the insulating layer 925 and the partition 928 is set to be larger than the total thickness of the EL layer 933 and the upper electrode 935; thus, the EL layer 933 and the upper electrode 935 are each divided into a plurality of regions. The upper electrodes 935 are electrodes in stripes which are parallel to each other and extend in a direction intersecting with the lower electrodes 931. The plurality of separated regions are electrically isolated from one another. Although layers of materials used for the EL layers 933 and the upper electrodes 935 are formed over the partitions 928, they are isolated from the EL layers 933 and the upper electrodes 935.

By coloring the EL layers 933 (at least light-emitting layers) separately, different light-emitting elements exhibit light of different colors; thus, a light-emitting panel capable of full-color display can be provided. Alternatively, the light-emitting elements 930 emit white light and light emitted from the light-emitting elements 930 is extracted through color filters; thus, a light-emitting panel capable of full-color display can be provided.

FIG. 6D is a plan view of a case where a passive matrix light-emitting panel is provided with a flexible printed circuit (FPC) or the like. In FIG. 6D, a plurality of lower electrodes 931 and a plurality of upper electrodes 935 intersect with each other so that they are perpendicular to each other. In FIG. 6D, some components (the EL layer 933 and the like) are not illustrated.

The plurality of lower electrodes 931 are connected to an FPC 909a through an anisotropic conductive film (not illustrated). The plurality of upper electrodes 935 are electrically connected at their ends to wirings 908, and the wirings 908 are connected to an FPC 909b through an anisotropic conductive film (not illustrated).

Although FIG. 6D illustrates an example in which a driver circuit is not provided over the substrate 901, an IC chip including a driver circuit may be mounted on the substrate 901.

Structural Example 3 of Light-Emitting Panel

As methods for forming a light-emitting element over a substrate having flexibility (also referred to as a flexible substrate) in the case of fabricating a flexible light-emitting panel, there are methods such as a first method in which the light-emitting element is directly formed over a flexible substrate, and a second method in which the light-emitting element is formed over a highly heat-resistant substrate (hereinafter referred to as a formation substrate) that is different from a flexible substrate and the light-emitting element is then separated from the formation substrate and transferred to the flexible substrate.

When a substrate that is resistant to heat applied in the process of forming the light-emitting element, such as a glass substrate thin enough to have flexibility, is used, the first method is preferably employed, in which case the process can be simplified.

When the second method is employed, an insulating film with low water permeability or the like that is formed over a formation substrate at high temperature can be transferred to a flexible substrate. Thus, even when an organic resin with high water permeability and low heat resistance or the like is used as a material of the flexible substrate, a flexible light-emitting panel with high reliability can be fabricated.

FIG. 7A illustrates an example of a light-emitting panel which can be fabricated by the second method. The light-emitting panel illustrated in FIG. 7A is a top-emission light-emitting panel using a color filter method. The light-emitting panel can have, for example, a structure in which sub-pixels of three colors of red (R), green (G), and blue (B) express one color, or a structure in which sub-pixels of four colors of R, G, B, and white (W) or sub-pixels of four colors of R, G, B, and yellow (Y) express one color. There is no particular limitation on the color element and colors other than R, G, B, W, and Y may be used. For example, cyan, magenta, or the like may be used.

The light-emitting panel illustrated in FIG. 7A includes the substrate 901, an adhesive layer 902, the insulating layer 903, a transistor 920, an insulating layer 907, an insulating layer 909, a conductive layer 941, an insulating layer 943, an insulating layer 945, the light-emitting element 930, the insulating layer 925, a spacer 926, the adhesive layer 927, coloring layers 845R, 845G, 845B, and 845Y, a light-blocking layer 847, an insulating layer 993, an adhesive layer 992, and the substrate 991. The substrate 901 and the substrate 991 are flexible substrates, and the light-emitting panel illustrated in FIG. 7A has flexibility.

The light-emitting element 930 includes the lower electrode 931, an optical adjustment layer 932, the EL layer 933, and the upper electrode 935. It is preferable to use a conductive material having a light-transmitting property for the optical adjustment layer 932. Owing to the combination of a color filter (the coloring layer) and a microcavity structure (the optical adjustment layer), light with high color purity can be extracted from the light-emitting panel of one embodiment of the present invention. The thickness of the optical adjustment layer is varied depending on the emission color of the pixel.

The substrate 901 and the insulating layer 903 are bonded to each other with the adhesive layer 902. The substrate 991 and the insulating layer 993 are bonded to each other with the adhesive layer 992. The transistor 920 and the light-emitting element 930 are formed over the insulating layer 903. At least one of the insulating layer 903 and the insulating layer 993 is preferably highly resistant to moisture, in which case impurities such as water can be prevented from entering the light-emitting element 930 or the transistor 920, leading to higher reliability of the light-emitting panel.

One of a source and a drain of the transistor 920 is electrically connected to the lower electrode 931 of the light-emitting element 930 through the conductive layer 941. The transistor 920 includes a second gate on the same plane as the conductive layer 941. An end portion of the lower electrode 931 is covered with the insulating layer 925. The lower electrode 931 preferably reflects visible light. The upper electrode 935 transmits visible light. The spacer 926 can adjust the distance between the substrate 901 and the substrate 991.

Each coloring layer has a portion overlapping with the light-emitting element 930. The light-blocking layer 847 has a portion overlapping with the insulating layer 925. The space between the light-emitting element 930 and each coloring layer is filled with the adhesive layer 927.

The insulating layers 907 and 909 each have an effect of suppressing diffusion of impurities into a semiconductor included in the transistor. As the insulating layers 943 and 945, an insulating layer having a planarization function is preferably selected in order to reduce surface unevenness due to the transistors and the wirings.

According to one embodiment of the present invention, the light-emitting panel may include a touch sensor. For example, as illustrated in FIG. 7B, a capacitor may be provided between the insulating layer 993 and the light-blocking layer 847 and between the insulating layer 993 and the coloring layer. A plurality of conductive layers 981 are provided in contact with the insulating layer 993. The plurality of conductive layers 981 are electrically connected by a conductive layer 983 through openings in the insulating layer 982. An insulating layer 984 is provided to reduce surface unevenness due to the capacitors. The coloring layer or the light-blocking layer 847 is provided in contact with the insulating layer 984. The capacitor is formed using a material which transmits light emitted from the light-emitting element 930.

The EL layers 933 emitting light of different colors may be provided as illustrated in FIG. 7C.

<Examples of Materials>

Materials that can be used for a light-emitting panel are described below. Note that description on the components already described in this specification is omitted in some cases.

For each of the substrates, a material such as glass, quartz, an organic resin, a metal, or an alloy can be used. The substrate on the side from which light from the light-emitting element is extracted is formed using a material which transmits the light.

It is particularly preferable to use a flexible substrate. For example, an organic resin; a glass material, a metal, or an alloy that is thin enough to have flexibility; or the like can be used.

An organic resin, which has a specific gravity smaller than that of glass, is preferably used for the flexible substrate, in which case the light-emitting panel can be more lightweight as compared with the case where glass is used.

The substrates are preferred to be formed using a material with high toughness. In that case, a light-emitting panel with high impact resistance that is less likely to be broken can be provided. For example, when an organic resin substrate, a thin metal substrate, or a thin alloy substrate is used, the light-emitting panel can be lightweight and less likely to be broken as compared with the case where a glass substrate is used.

A metal material and an alloy material, which have high thermal conductivity, are preferred because they can easily conduct heat to the whole substrate and accordingly can prevent a local temperature rise in the light-emitting panel. The thickness of a substrate using a metal material or an alloy material is preferably greater than or equal to 10 μm and less than or equal to 200 μm, further preferably greater than or equal to 20 μm and less than or equal to 50 μm.

Examples of glass include alkali-free glass, barium borosilicate glass, and aluminoborosilicate glass.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and an aramid resin. In particular, a material whose thermal expansion coefficient is low is preferred, and for example, a polyamide imide resin, a polyimide resin, or PET can be suitably used. A substrate in which a glass fiber is immersed in an organic resin or a substrate whose thermal expansion coefficient is reduced by mixing an organic resin with an inorganic filler can also be used. A substrate using such a material is lightweight, and thus a light-emitting panel using this substrate can also be lightweight.

There is no particular limitation on a material of the metal substrate, but it is preferable to use, for example, aluminum, copper, nickel, a metal alloy such as an aluminum alloy or stainless steel.

It is preferable to use a substrate subjected to insulation treatment in such a manner that a surface of a conductive substrate is oxidized or an insulating film is formed on the surface. An insulating film may be formed by, for example, a coating method such as a spin-coating method and a dipping method, an electrodeposition method, an evaporation method, or a sputtering method. An oxide film may be formed over the substrate surface by an anodic oxidation method, exposing to or heating in an oxygen atmosphere, or the like.

The flexible substrate may have a stacked structure of a layer of any of the above-mentioned materials and a hard coat layer (e.g., a silicon nitride layer) which protects a surface of the light-emitting panel from damage or the like, a layer (e.g., an aramid resin layer) which can disperse pressure, or the like. Furthermore, to suppress a decrease in the lifetime of the light-emitting element due to moisture and the like, an insulating film with low water permeability may be provided. For example, a film containing nitrogen and silicon (e.g., a silicon nitride film or silicon oxynitride film), or a film containing nitrogen and aluminum (e.g., an aluminum nitride film) may be provided. Note that in this specification and the like, "silicon oxynitride" contains more oxygen than nitrogen, and "silicon nitride oxide" contains more nitrogen than oxygen. The oxygen content and the nitrogen content are measured by Rutherford backscattering spectrometry (RBS) or hydrogen forward scattering spectrometry (HFS).

Any of a variety of curable adhesives, e.g., light curable adhesives such as a UV curable adhesive, a reactive curable adhesive, a thermal curable adhesive, and an anaerobic adhesive can be used for the adhesive layer. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Further, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the light-emitting element, thereby improving the reliability of the light-emitting panel.

In addition, it is preferable to mix a filler with a high refractive index or light-scattering member into the resin, in which case the efficiency of light extraction from the light-emitting element can be improved. For example, titanium oxide, barium oxide, zeolite, zirconium, or the like can be used.

A leveling agent or a surfactant may be contained in the above resin.

By adding a leveling agent or a surfactant to the above resin, surface tension of the resin is reduced and wettability of the resin can be improved. As the wettability is higher, the resin can be applied more uniformly. Thus, entry of bubbles when a pair of substrates are bonded can be prevented. Furthermore, light-emitting defects in the light-emitting panel can be prevented.

As the leveling agent or the surfactant, a material which does not adversely affect an element contained in a layer to be separated and the like is used. For example, a material obtained by adding 0.2 wt % of a fluorine-based leveling agent to an epoxy resin may be used as an adhesive.

Insulating films with high resistance to moisture are preferably used for the insulating layer 903 and the insulating layer 993. Alternatively, the insulating layer 903 and the insulating layer 993 preferably have a function of preventing diffusion of impurities to a light-emitting element.

As an insulating film with high resistance to moisture, a film containing nitrogen and silicon (e.g., a silicon nitride film, a silicon nitride oxide film, or the like), a film containing nitrogen and aluminum (e.g., an aluminum nitride film or the like), or the like can be used. Alternatively, a silicon oxide film, a silicon oxynitride film, an aluminum oxide film, or the like can be used.

For example, the moisture vapor transmission rate of the insulating film with high resistance to moisture is lower than or equal to $1 \times 10^{-5}$ [g/(m$^2$·day)], preferably lower than or equal to $1 \times 10^{-6}$ [g/(m$^2$·day)], further preferably lower than or equal to $1 \times 10^{-7}$ [g/(m$^2$·day)], still further preferably lower than or equal to $1 \times 10^{-8}$ [g/(m$^2$·day)].

There is no particular limitation on the structure of the transistor in the light-emitting panel. For example, a forward staggered transistor or an inverted staggered transistor may be used. Furthermore, a top-gate transistor or a bottom-gate transistor may be used. A semiconductor material used for the transistors is not particularly limited, and for example, silicon, germanium, or an organic semiconductor can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be inhibited.

For stable characteristics of the transistor, a base film is preferably provided. The base film can be formed to have a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

The conductive film that transmits visible light and can be used as an electrode of the light-emitting element can be formed using, for example, indium oxide, indium tin oxide (ITO), indium zinc oxide, zinc oxide (ZnO), or ZnO to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like can be formed thin so as to have a light-transmitting property. Alternatively, a stacked film of any of the above materials can be used as the conductive layer. For example, a stacked film of ITO and an alloy of silver and magnesium is preferably used, in which case conductivity can be increased. Further alternatively, graphene or the like may be used.

Examples of the conductive film that reflects visible light and can be used as an electrode of the light-emitting element include a metal material, such as aluminum, gold, platinum, silver, nickel, tungsten, chromium, molybdenum, iron, cobalt, copper, or palladium, and an alloy including any of these metal materials. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium, or an alloy containing silver such as an alloy of silver and copper, an alloy of silver, palladium, and copper, or an alloy of silver and magnesium can be used for the conductive film. An alloy of silver and copper is preferable because of its high heat resistance. Moreover, a metal film or a metal oxide film is stacked on an aluminum alloy film, whereby oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, a stacked film of silver and ITO or a stacked film of an alloy of silver and magnesium and ITO can be used.

The electrodes can be formed separately by an evaporation method or a sputtering method. Alternatively, a discharging method such as an ink-jet method, a printing method such as a screen printing method, or a plating method may be used.

The EL layer 933 may include a plurality of light-emitting layers. In the EL layer 933, the plurality of light-emitting layers may be stacked in contact with one another or may be stacked with a separation layer provided therebetween. The separation layer may be provided between a fluorescent layer and a phosphorescent layer, for example.

The separation layer can be provided, for example, to prevent energy transfer by the Dexter mechanism (particularly triplet energy transfer) from a phosphorescent material in an excited state which is generated in the phosphorescent layer to a fluorescent material in the fluorescent layer. The thickness of the separation layer may be several nanometers. Specifically, the thickness of the separation layer may be greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in a light-emitting layer in contact with the separation layer. This facilitates the manufacture of the light-emitting element and reduces the drive voltage. For example, in the case where the phosphorescent layer includes a host material, an assist material, and a phosphorescent material (guest material), the separation layer may be formed using the host material and the assist material. In other words, the separation layer includes a region not containing the phosphorescent material and the phosphorescent layer includes a region containing the phosphorescent material in the above structure. Accordingly, the separation layer and the phosphorescent layer can be evaporated separately depending on whether a phosphorescent material is used or not. With such a structure, the separation layer and the phosphorescent layer can be formed in the same chamber. Thus, the manufacturing costs can be reduced.

Moreover, the light-emitting element 930 may be a single element including one EL layer or a tandem element in which EL layers are stacked with a charge generation layer provided therebetween.

The light-emitting element is preferably provided between a pair of insulating films with high resistance to moisture. In that case, entry of an impurity such as water into the light-emitting element can be inhibited, leading to inhibition of a decrease in the reliability of the light-emitting panel. Specifically, the use of an insulating film with high resistance to moisture for the insulating layer 903 and the insulating layer 993 allows the light-emitting element to be located between a pair of insulating films with high resistance to moisture, by which decrease in reliability of the light-emitting panel can be prevented.

As the insulating layers 907 and 909, for example, an inorganic insulating film such as a silicon oxide film, a silicon oxynitride film, or an aluminum oxide film can be used. For example, as the insulating layer 943 and the insulating layer 945, an organic material such as polyimide, acrylic, polyamide, polyimide amide, or a benzocyclobutene-based resin can be used. Alternatively, a low-dielectric constant material (a low-k material) or the like can be used. Furthermore, each insulating layer may be formed by stacking a plurality of insulating films.

The insulating layer 925 is formed using an organic insulating material or an inorganic insulating material. As the resin, for example, a polyimide resin, a polyamide resin, an acrylic resin, a siloxane resin, an epoxy resin, or a phenol resin can be used. It is particularly preferable that the insulating layer 925 be formed to have an inclined surface with curvature, using a photosensitive resin material. The partition 928 can be formed using a material which can be used for the insulating layer 925.

There is no particular limitation on the methods for forming the insulating layer 925 and the partition 298; a photolithography method, a sputtering method, an evaporation method, a droplet discharging method (e.g., an inkjet method), a printing method (e.g., a screen printing method or an off-set printing method), or the like can be used.

The spacer 926 can be formed using an inorganic insulating material, an organic insulating material, a metal material, or the like. As the inorganic insulating material and the organic insulating material, for example, a variety of materials that can be used for the insulating layer can be used. As the metal material, titanium, aluminum, or the like can be used. When the spacer 926 containing a conductive material is electrically connected to the upper electrode 935, a potential drop due to the resistance of the upper electrode 935 can be inhibited. The spacer 926 may have either a tapered shape or an inverse tapered shape.

For example, a conductive layer functioning as an electrode or a wiring of the transistor, an auxiliary electrode of the light-emitting element, or the like, which is used for the light-emitting panel, can be formed to have a single-layer structure or a stacked-layer structure using any of metal materials such as molybdenum, titanium, chromium, tantalum, tungsten, aluminum, copper, neodymium, and scandium, and an alloy material containing any of these elements. Alternatively, the conductive layer may be formed using a conductive metal oxide. As the conductive metal oxide, indium oxide (e.g., $In_2O_3$), tin oxide (e.g., $SnO_2$), ZnO, ITO, indium zinc oxide (e.g., $In_2O_3$—ZnO), or any of these metal oxide materials in which silicon oxide is contained can be used.

The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, a yellow (Y) color filter for transmitting light in a yellow wavelength range, or the like can be used. Each coloring layer is formed in a desired position with any of various materials by a printing method, an inkjet method, an etching method using a photolithography method, or the like. In a white sub-pixel, a transparent resin may be provided so as to overlap with the light-emitting element.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. As the light-blocking layer, a material that can block light from the light-emitting element can be used; for example, a black matrix can be formed using a resin material containing a metal material, pigment, or dye. Note that it is preferable to provide the light-blocking layer in a region other than the light-emitting portion, such as a driver circuit portion, in which case undesired leakage of guided light or the like can be inhibited.

Furthermore, an overcoat covering the coloring layer and the light-blocking layer may be provided. The overcoat can prevent an impurity and the like contained in the coloring layer from being diffused into the light-emitting element. The overcoat is formed with a material that transmits light emitted from the light-emitting element; for example, an inorganic insulating film such as a silicon nitride film or a silicon oxide film or an organic insulating film such as an acrylic film or a polyimide film can be used, and furthermore, a stacked-layer structure of an organic insulating film and an inorganic insulating film may be employed.

One embodiment of the present invention can be applied to not only a light-emitting device but also a display device. The display element included in the display device of one embodiment of the present invention is not limited to a light-emitting element such as an EL element, and for example, a liquid crystal element, an electrophoretic element, a display element using micro electro mechanical systems (MEMS), an electrowetting element, and a display element including a carbon nanotube can be given.

This embodiment can be combined as appropriate with any of the other embodiments.

Embodiment 3

In this embodiment, a secondary battery which can be used for the light-emitting device of one embodiment of the present invention is described with reference to FIGS. 8A and 8B and FIGS. 9A to 9F. In this embodiment, a laminated secondary battery which is a flexible secondary battery is described.

Figure 8A:
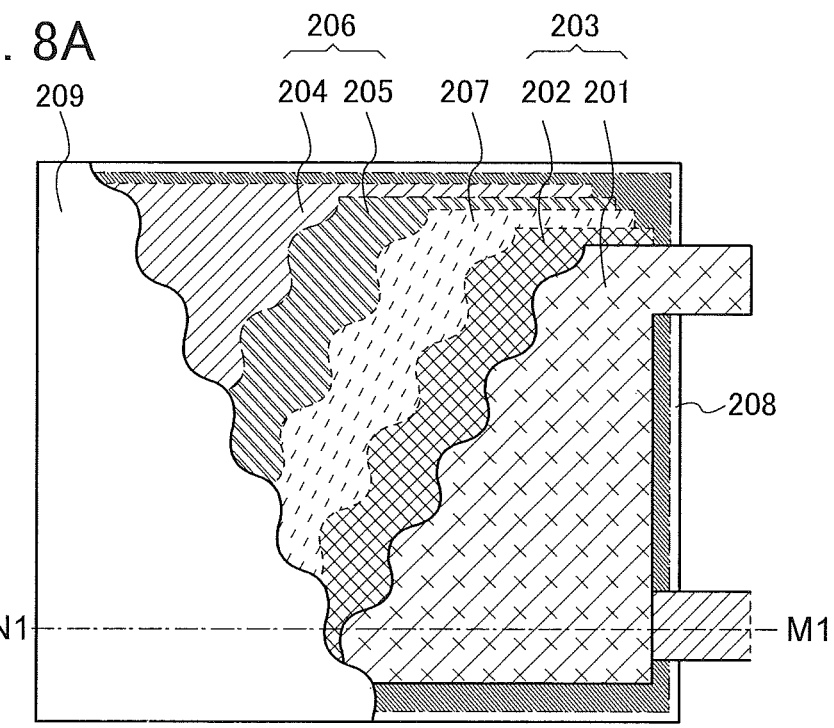
FIGS. 8A and 8B illustrate an example of a secondary battery.
Figure 8B:
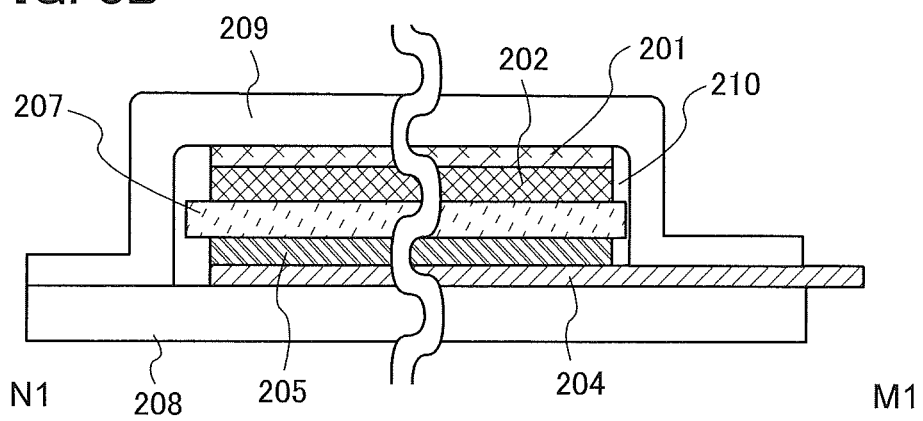

FIG. 8A illustrates a top view of the laminated secondary battery. FIG. 8B is a schematic cross-sectional view taken along dashed-dotted line M1-N1 in FIG. 8A.

The secondary battery illustrated in FIGS. 8A and 8B includes a positive electrode 203, a negative electrode 206, a separator 207, a film 208, a film 209, and an electrolytic solution 210. The positive electrode 203 includes a positive electrode current collector 201 and a positive electrode active material layer 202. The negative electrode 206 includes a negative electrode current collector 204 and a negative electrode active material layer 205.

The film 208 and the film 209 are exterior bodies. In a region surrounded by the exterior bodies, the sheet-like positive electrode 203, the separator 207, and the sheet-like negative electrode 206 are stacked. The region surrounded by the exterior bodies is filled with the electrolytic solution 210.

FIG. 8B illustrates an example in which the number of electrode layers is two (the positive electrode 203 and the negative electrode 206). By increasing the number of electrode layers to more than two, the area (size) of the secondary battery can be decreased without change in capacity of the secondary battery. However, if the number of electrode layers exceeds 40, the secondary battery has a large thickness and might lose its flexibility. Therefore, in the case where the secondary battery is desired to be flexible, the number of electrode layers is set to 40 or less, preferably 20 or less. In the case of double-sided coating by which both surfaces of the positive electrode current collector 201 are coated with the positive electrode active material layer 202, the case of double-sided coating by which both surfaces of the negative electrode current collector 204 are coated with the negative electrode active material layer 205, or the like, the number of electrode layers can be decreased to 10 or less without change in capacity of the secondary battery.

The stacked layer including the sheet-like positive electrode 203, the separator 207, and the sheet-like negative electrode 206 can be sealed by heat sealing.

In this specification, heat sealing refers to sealing by thermocompression bonding, and means that an adhesive layer partly covering a base film or an outermost or innermost layer with a low melting point in a laminate film is melted by heat and attached by pressure.

In the secondary battery, a thin flexible film (such as a laminate film) is used as an exterior body. The laminate film refers to a stacked film of a base film and an adhesive synthetic resin film, or a stacked film of two or more kinds of films. For the base film, polyester such as PET or polybutylene terephthalate (PBT), polyamide such as nylon 6 or nylon 66, an inorganic film formed by evaporation, or paper can be used. For the adhesive synthetic resin film, polyolefin such as polyethylene (PE) or polypropylene (PP), an acrylic-based synthetic resin, an epoxy-based synthetic resin, or the like can be used. An object is laminated with the laminate film by thermocompression bonding using a laminating apparatus. Note that an anchor coat agent is preferably applied as pretreatment for the laminating step so that the adhesion between the laminate film and the object can be increased. As the anchor coat agent, an isocyanate-based material or the like can be used.

The positive electrode current collector 201 and the negative electrode current collector 204 also serve as terminals for electrical contact with the outside. For this reason, the positive electrode current collector 201 and the negative electrode current collector 204 are provided so that part of the positive electrode current collector 201 and part of the negative electrode current collector 204 are exposed outside the film 208 and the film 209 as illustrated in FIG. 8A. In the case where a larger number of electrode layers are stacked, a plurality of positive electrode current collectors 201 are electrically connected by ultrasonic welding, and a plurality of negative electrode current collectors 204 are electrically connected by ultrasonic welding. Note that in FIG. 8B, part of the negative electrode current collector 204 extends to the outside beyond the film 209.

Although FIG. 8A illustrates the example of sealing with the film 208 and the film 209, the present invention is not particularly limited to this example, and a single film folded in half may be used as an exterior body. An example different from that in FIGS. 8A and 8B is illustrated in FIGS. 9A to 9F. A film 218 is folded in half so that two end portions overlap, and is sealed on three sides with an adhesive layer. A manufacturing method in this example is described below with reference to FIGS. 9A to 9F.

First, the film 218 is folded in half as illustrated in FIG. 9A. In addition, a positive electrode current collector 211, a separator 217, and a negative electrode current collector 214 which are components of a secondary battery and stacked as illustrated in FIG. 9B are prepared. Furthermore, two lead electrodes 226 with sealing layers 225 illustrated in FIG. 9C are prepared. The lead electrodes 226 are each also referred to as a lead terminal and provided in order to lead a positive electrode or a negative electrode of a secondary battery to the outside of an exterior film. Then, one of the lead electrodes is electrically connected to a protruding portion of the positive electrode current collector 211 by ultrasonic welding or the like. Aluminum is used as a material of the lead electrode connected to the protruding portion of the positive electrode current collector 211. The other lead electrode is electrically connected to a protruding portion of the negative electrode current collector 214 by ultrasonic welding or the like. Nickel-plated copper is used as a material of the lead electrode connected to the protruding portion of the negative electrode current collector 214. Then, two sides of the film 218 are sealed by thermocompression bonding, and one side is left open for introduction of an electrolytic solution. In thermocompression bonding, the sealing layers 225 provided over the lead electrodes are also melted, thereby fixing the lead electrodes and the film 218 to each other. After that, in a reduced-pressure atmosphere or an inert atmosphere, a desired amount of electrolytic solution is introduced to the inside of the film 218 in the form of a bag. Lastly, the side of the film which has not been subjected to thermocompression bonding and is left open is sealed by thermocompression bonding. In this manner, the secondary battery 20 illustrated in FIG. 9D can be manufactured. An edge region indicated by a dotted line in FIG. 9D is a thermocompression-bonded region 227.

An example of a cross-section taken along a dashed-dotted line M2-N2 in FIG. 9D is illustrated in FIG. 9E. As illustrated in FIG. 9E, the positive electrode current collector 211, a positive electrode active material layer 212, the separator 217, a negative electrode active material layer 215, and the negative electrode current collector 214 are stacked in this order and placed inside the folded film 218, an end portion is sealed with an adhesive layer 231, and the other space is provided with an electrolytic solution 232.

Here, a current flow in charging a secondary battery will be described with reference to FIG. 9F. When a secondary battery using lithium is regarded as a closed circuit, lithium ions transfer and a current flows in the same direction. Note that in the secondary battery using lithium, an anode and a cathode change places in charge and discharge, and an oxidation reaction and a reduction reaction occur on the corresponding sides; hence, an electrode with a high redox potential is called a positive electrode and an electrode with a low redox potential is called a negative electrode. For this reason, in this specification, the positive electrode is referred to as a "positive electrode" and the negative electrode is referred to as a "negative electrode" in all the cases where charge is performed, discharge is performed, a reverse pulse current is supplied, and a charging current is supplied. The use of the terms "anode" and "cathode" related to an oxidation reaction and a reduction reaction might cause confusion because the anode and the cathode change places at the time of charging and discharging. Thus, the terms "anode" and "cathode" are not used in this specification. If the term "anode" or "cathode" is used, it should be mentioned that the anode or the cathode is which of the one at the time of charging or the one at the time of discharging and corresponds to which of a positive electrode or a negative electrode.

Two terminals in FIG. 9F are connected to a charger, and the secondary battery 20 is charged. As the charge of the secondary battery 20 proceeds, a potential difference between electrodes increases. The positive direction in FIG. 9F is the direction in which a current flows from one terminal outside the secondary battery 20 to the positive electrode current collector 211, flows from the positive electrode current collector 211 to the negative electrode current collector 214 in the secondary battery 20, and flows from the negative electrode current collector 214 to the other terminal outside the secondary battery 20. In other words, a current flows in the direction of a flow of a charging current.

This embodiment can be combined as appropriate with any of the other embodiments.

Embodiment 4

In this embodiment, a light-emitting panel of one embodiment of the present invention will be described with reference to FIGS. 10A and 10B, FIGS. 11A and 11B, FIG. 12, FIG. 13, FIGS. 14A to 14C, FIGS. 15A to 15F, FIGS. 16A to 16F, FIGS. 17A and 17B, and FIGS. 18A to 18E.

The light-emitting panel of this embodiment includes a capacitor, a light-emitting element, and a switch (also referred to as a switching element). In the light-emitting panel of this embodiment, the voltage between the electrodes of the capacitor is held by turning the switch off; thus, data can be stored even when the supply of power is stopped. Therefore, the light-emitting device of one embodiment of the present invention enables reduction in power consumption. Furthermore, a light-emitting device which can be used for a long time per charge can be provided.

Specifically, the light-emitting panel of this embodiment includes a first switch, a second switch, a capacitor, and a light-emitting element. The first switch is electrically connected to one electrode of the capacitor. The second switch is electrically connected to the other electrode of the capacitor. The capacitor has a function of holding a voltage corresponding to a video signal. The light-emitting element has a function of emitting light in accordance with the voltage. In a period during which the capacitor holds the voltage, the first switch and the second switch are off and are electrically disconnected from a driver circuit used for supplying a video signal.

Alternatively, the light-emitting panel of this embodiment includes a first transistor, a second transistor, a third transistor, a capacitor, and a light-emitting element. A gate of the first transistor is electrically connected to a first wiring. One of a source and a drain of the first transistor is electrically connected to a second wiring, and the other of the source and the drain of the first transistor is electrically connected to one electrode of the capacitor and a gate of the third transistor. One of a source and a drain of the second transistor is electrically connected to a third wiring, and the other of the source and the drain of the second transistor is electrically connected to the other electrode of the capacitor and one of a source and a drain of the third transistor. The other of the source and the drain of the third transistor is electrically connected to a fourth wiring. The capacitor has a function of holding a voltage corresponding to a video signal. The light-emitting element has a function of emitting light in accordance with the voltage. In a period during which the capacitor holds a potential, the first transistor and the second transistor may be off and electrically disconnected from a driver circuit used for supplying a video signal. Alternatively, in a period during which the capacitor holds a potential, an operation in which the potential of the second wiring is set to the potential of the first wiring, an operation in which the potential of the fourth wiring is set to the potential of the third wiring, and an operation in which the supply of potentials to the first wiring, the second wiring, the third wiring, and the fourth wiring is stopped may be performed.

As the switch, a transistor including an oxide semiconductor is preferably used. The oxide semiconductor has a wider bandgap than silicon or the like; thus, the off-state current value of the transistor can be extremely low. The transistor including the oxide semiconductor has lower temperature dependence than a transistor including amorphous silicon, polysilicon, or the like; thus, the light-emitting panel including the transistor including the oxide semiconductor can be used in a wide temperature range. For example, the first transistor and the second transistor each preferably include an oxide semiconductor.

Figure 10A:
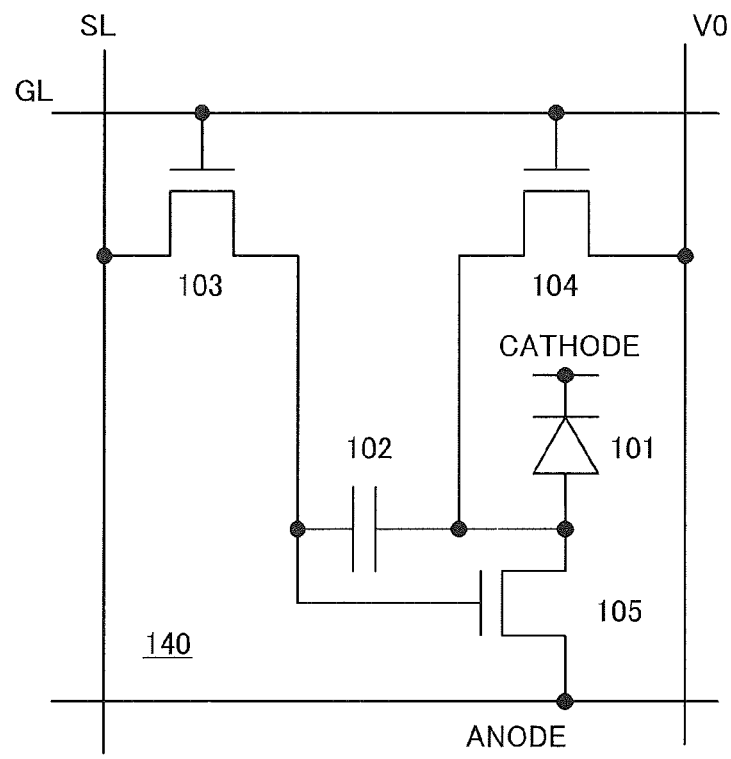
FIGS. 10A and 10B each illustrate an example of a circuit included in a light-emitting panel.

FIG. 10A shows an example of a circuit (also referred to as a pixel or a pixel circuit) included in the light-emitting panel.

Figure 10B:
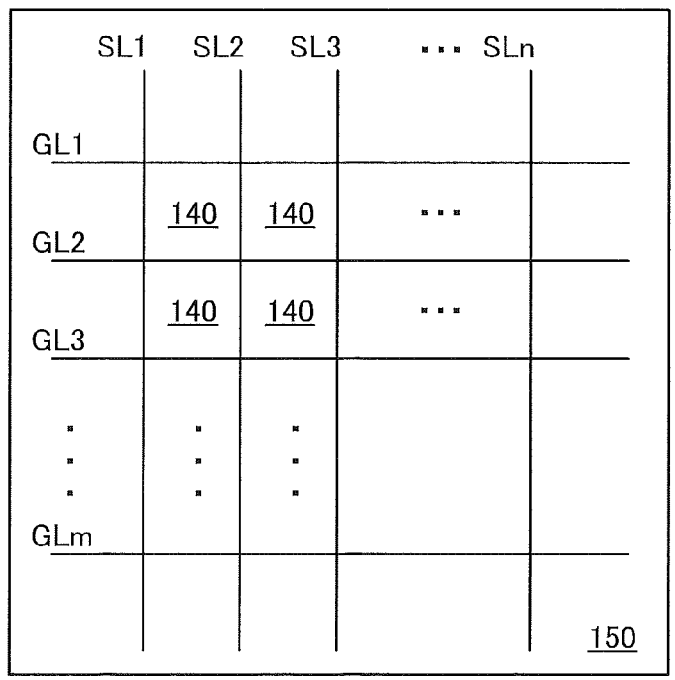

A circuit 140 in FIG. 10A includes a light-emitting element 101, a capacitor 102, a first transistor 103, a second transistor 104, and a third transistor 105. The light-emitting panel includes one or more circuits 140. As shown in FIG. 10B, the light-emitting panel may include a circuit 150 in which the circuits 140 are arranged in a matrix.

A gate of the first transistor 103 is electrically connected to a wiring GL (also referred to as gate line). One of a source and a drain of the first transistor 103 is electrically connected to a wiring SL (also referred to as source line). The other of the source and the drain of the first transistor 103 is electrically connected to one electrode of the capacitor 102 and a gate of the third transistor 105.

A gate of the second transistor 104 is electrically connected to the wiring GL. One of a source and a drain of the second transistor 104 is electrically connected to the other electrode of the capacitor 102, one electrode of the light-emitting element 101, and one of a source and a drain of the third transistor 105. The other of the source and the drain of the second transistor 104 is electrically connected to a wiring V0.

The other of the source and the drain of the third transistor 105 is electrically connected to a wiring ANODE.

The other electrode of the light-emitting element 101 is electrically connected to a wiring CATHODE.

Although the wiring ANODE, the wiring CATHODE, and the wiring V0 are not illustrated in the circuit 150 shown in FIG. 10B, they are arranged in each circuit 140 in a manner similar to that in FIG. 10A. Alternatively, the wirings may be shared with the plurality of circuits 140. For example, the wiring V0 may be shared between two circuits 140 adjacent to each other in the wiring GL direction. The wiring CATH- ODE may be shared between two circuits 140 adjacent to each other in the wiring SL direction.

The wiring GL has a function of supplying (inputting or transmitting) a potential that controls on/off (also referred to as conduction state/non-conduction state) of the first transistor 103 and a potential that controls on/off of the second transistor 104.

The wiring SL has a function of supplying a potential corresponding to a video signal (also referred to as data, a signal, an image signal, or the like).

The wiring V0 has a function of supplying a power supply potential to the other electrode of the capacitor 102. The wiring ANODE has a function of supplying a power supply potential to the one electrode (anode electrode in FIG. 10A) of the light-emitting element 101. The wiring CATHODE has a function of supplying a power supply potential to the other electrode (cathode electrode in FIG. 10A) of the light-emitting element 101.

The light-emitting element 101 is, for example, a light-emitting element such as an EL element and has a function of performing display (emitting light) in accordance with the amount of current flowing from the anode electrode to the cathode electrode.

The first transistor 103 has a function of supplying the potential of the wiring SL (the potential is also referred to as Vin) to the one electrode of the capacitor 102 and the gate of the third transistor 105.

The second transistor 104 has a function of supplying the potential of the wiring V0 (the potential is also referred to as V0) to the other electrode of the capacitor 102.

The capacitor 102 has a function of keeping the voltage (Vin−V0) corresponding to the potential difference between the wiring SL and the wiring V0. In other words, the capacitor 102 has a function of keeping the voltage corresponding to the video signal. In addition, the capacitor 102 has a function of keeping the voltage corresponding to the potential difference between the gate and one of the source and the drain of the third transistor 105. Note that the voltage corresponding to the video signal refers to the voltage (Vin−V0) corresponding to the difference between the potential Vin of the wiring SL and the potential V0 of the wiring V0.

The third transistor 105 has a function of adjusting the amount of current flowing in the light-emitting element 101 in accordance with the voltage held by the capacitor 102.

Thus, the light-emitting element 101 has a function of performing display in accordance with the voltage held by the capacitor 102.

Next, an operation of the circuit 140 shown in FIGS. 10A and 10B will be described.

<Writing Operation>

The writing operation of a video signal is performed as follows. First, a potential at which both the first transistor 103 and the second transistor 104 are turned on is supplied to the wiring GL. When the first transistor 103 and the second transistor 104 are turned on, the one electrode of the capacitor 102 and the wiring SL are electrically connected, and the other electrode of the capacitor 102 and the wiring V0 are electrically connected. Then, the voltage corresponding to the potential difference between the wiring SL and the wiring V0 is applied between the electrodes of the capacitor 102. In other words, the voltage corresponding to a video signal is applied to the capacitor 102. In such a manner, the video signal is written to the circuit 140. Note that the wiring V0 can be regarded as a supplier of a potential at which the circuit 140 is initialized (initialization operation). In other words, in the circuit 140, the writing operation and the initialization operation can be concurrently performed.

Note that the initialization operation and the writing operation may be independently performed. In that case, the gate of the first transistor 103 and the gate of the second transistor 104 may be connected to respective wirings. The second transistor 104 is turned on, and the wiring V0 and the other electrode of the capacitor 102 are electrically connected, whereby initialization is performed. Then, the first transistor 103 is turned on, and the wiring SL and the one electrode of the capacitor 102 are electrically connected, whereby writing of the video signal can be performed.

In the case of writing operation, the potential of the wiring V0 is set to be higher than or equal to that of the wiring CATHODE, whereby current can be made to flow in the light-emitting element 101 during the writing operation. In contrast, the potential of the wiring V0 is set to be lower than or equal to that of the wiring CATHODE, whereby current can be prevented from flowing in the light-emitting element 101 during the writing operation. Furthermore, the potential of the wiring V0 and the potential of the wiring CATHODE are set to equal to each other, whereby the number of power supplies can be small. For example, the potential of the wiring V0 can be 0 V but not limited thereto.

<Storage Operation>

The storage operation of a video signal is performed as follows. The potential at which both the first transistor 103 and the second transistor 104 are turned off is supplied to the wiring GL. When the first transistor 103 and the second transistor 104 are turned off, the one electrode of the capacitor 102 and the wiring SL are brought out of conduction, and the other electrode of the capacitor 102 and the wiring V0 are brought out of conduction. The voltage input during the writing operation is kept between the electrodes of the capacitor 102. In other words, the capacitor 102 stores the voltage corresponding to the video signal. While the voltage is held by the capacitor 102, the light-emitting element 101 can perform display in accordance with the held voltage.

<Display Operation>

The display operation is performed as follows. The current flows in the third transistor 105 in accordance with the voltage applied between the gate and the source. Specifically, the current flows when the voltage is higher than the threshold voltage of the third transistor 105. Then, in the direction from the wiring ANODE toward the wiring CATHODE, the current flows through the light-emitting element 101 that is electrically connected in series to the third transistor 105. Thus, the light-emitting element 101 can perform display in accordance with the amount of current. The voltage between the gate and the source of the third transistor 105 corresponds to the voltage held by the capacitor 102; thus, the light-emitting element 101 performs display in accordance with the voltage held by the capacitor 102.

As described above, in the circuit 140, the first transistor 103 is provided between the capacitor 102 and the wiring SL, and the second transistor 104 is provided between the capacitor 102 and the wiring V0. When the first transistor 103 and the second transistor 104 are turned off, a fluctuation or loss of the voltage held by the capacitor 102 can be suppressed as much as possible. As a result, the video signal written to the circuit 140 can be held.

Even in the case where the supply of the potential to the wiring GL, the wiring SL, the wiring V0, the wiring ANODE, and the wiring CATHODE is stopped in the circuit 140, the capacitor 102 can hold the voltage. In other words, even in the case where the power supply is stopped, the capacitor 102 can hold the voltage. Thus, even in the case where the circuit 140 and a driver circuit (also referred to as a driving device) used to write a video signal are electrically disconnected, the voltage can be held by the capacitor 102. The detachment of the driver circuit is possible; thus, a reduction in size of the light-emitting device or a reduction in cost can be achieved. Note that it is effective to electrically disconnect with the circuit 140 without detachment of the driver circuit.

<Redisplaying Operation>

In the case where display is performed again (redisplaying operation), the potential is supplied at least to the wiring ANODE and the wiring CATHODE, whereby display can be performed in accordance with the stored video signal. Thus, in the redisplaying operation, the number of power supplies can be smaller than that in the writing operation, and the power consumption can be reduced as compared with the case of writing operation. Moreover, a circuit used for the redisplaying operation can be reduced in size, power consumption, and the like as compared with the driver circuit.

Four periods of the writing operation, the storage operation, the display operation, and the redisplaying operation may be called a writing period, a storage period, a display period, and a redisplaying period, respectively.

Next, an example of a method for suppressing a fluctuation of the voltage held by the capacitor 102 in the circuit 140 is described.

First, as in the circuit 140 described above, the first transistor 103 is provided between the one electrode of the capacitor 102 and the wiring SL, and the second transistor 104 is provided between the other electrode of the capacitor 102 and the wiring V0.

It is preferable that the amount of current flowing in the first transistor 103 and the second transistor 104 that are off (the current is also referred to as off-state current or leakage current) be as small as possible.

As a method for reducing the off-state current, a transistor including an oxide semiconductor is used for the first transistor 103 and the second transistor 104. The oxide semiconductor has, for example, a wider band gap than silicon. Thus, a transistor including an oxide semiconductor can have extremely low off-state current.

For a material of the transistor, any of a variety of semiconductors such as a semiconductor containing a semiconductor belonging to Group 14 of the periodic table (e.g., silicon), an organic semiconductor, and a compound semiconductor can be used, besides the oxide semiconductor. Moreover, an amorphous semiconductor, a microcrystalline semiconductor, a polycrystalline semiconductor, a single crystal semiconductor, or the like can be used.

In addition, as another method for reducing the off-state current, the channel lengths of the first transistor 103 and the second transistor 104 may be made large. For example, in at least one of the first transistor 103 and the second transistor 104, the channel length may be larger than the channel width. Alternatively, in at least one of the first transistor 103 and the second transistor 104, the channel length may be larger than the channel length of the third transistor.

As another method for reducing the off-state current, the channel widths of the first transistor 103 and the second transistor 104 are made small. For example, in at least one of the first transistor 103 and the second transistor 104, the channel width may be smaller than the channel length. Alternatively, in at least one of the first transistor 103 and the second transistor 104, the channel width may be smaller than the channel width of the third transistor.

As another method for reducing the off-state current, the first transistor 103 and the second transistor 104 are formed to have a multi-gate structure. At least one of the first transistor 103 and the second transistor 104 may have a multi-gate structure.

Note that the transistors can have sizes different from those described above. For example, in at least one of the first transistor 103 and the second transistor 104, the channel length may be the same as or larger than the channel width. Alternatively, in at least one of the first transistor 103 and the second transistor 104, the channel length may be smaller than the channel length of the third transistor 103. Alternatively, in at least of the first transistor 103 and the second transistor 104, the channel width may be larger than the channel length. Alternatively, in at least one of the first transistor 103 and the second transistor 104, the channel width may be larger than the channel width of the third transistor. With such a structure, the switching speed of the transistor can be increased.

As another method for reducing the off-state current, the leakage current due to a gate insulating film of the transistor is reduced. When the gate insulating film contains a material with a high dielectric constant, the leakage current can be reduced. For example, the gate insulating film may contain hafnium oxide, zirconium oxide, lanthanum oxide, or the like. Besides, when the thickness of the gate insulating film is increased, the leakage current can be reduced. For example, the gate insulating film may have a region thicker than that of the gate electrode.

For the third transistor 105, any of a variety of semiconductors such as an oxide semiconductor, a semiconductor containing a semiconductor belonging to Group 14 of the periodic table (e.g., silicon), an organic semiconductor, and a compound semiconductor can be used. Moreover, an amorphous semiconductor, a microcrystalline semiconductor, a polycrystalline semiconductor, a single crystal semiconductor, or the like can be used. In particular, a transistor including an oxide semiconductor is preferably used because it has better electrical characteristics such as field-effect mobility or reliability than a transistor including amorphous silicon, for example. Moreover, an oxide semiconductor is preferably used for all of the first transistor 103, the second transistor 104, and the third transistor 105 because the transistors can be formed through one process.

Figure 11A:
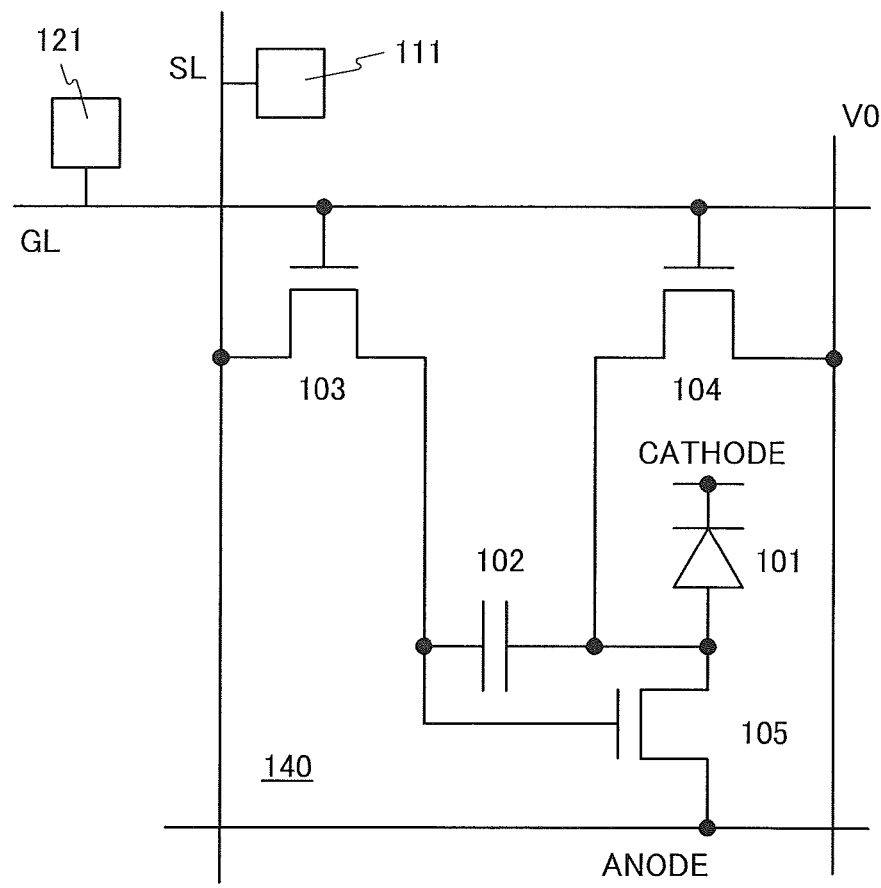
FIGS. 11A to 11C each illustrate an example of a circuit included in a light-emitting panel.

FIG. 11A shows another embodiment of the circuit included in the light-emitting panel. As illustrated in FIG. 11A, the wiring SL may be electrically connected to a protective circuit 111. The wiring GL may be electrically connected to a protective circuit 121.

Figure 11B:
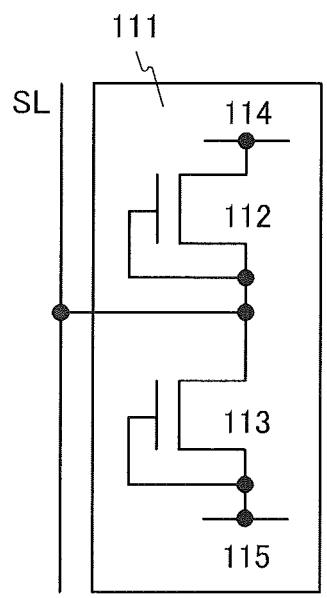

FIG. 11B shows an example of the protective circuit 111 electrically connected to the wiring SL. The wiring SL is electrically connected to a wiring 114 through the transistor 112 that is diode-connected. In addition, the wiring SL is electrically connected to a wiring 115 through the transistor 113 that is diode-connected. The high power supply potential is supplied to the wiring 114, and the low power supply potential is supplied to the wiring 115.

Figure 11C:
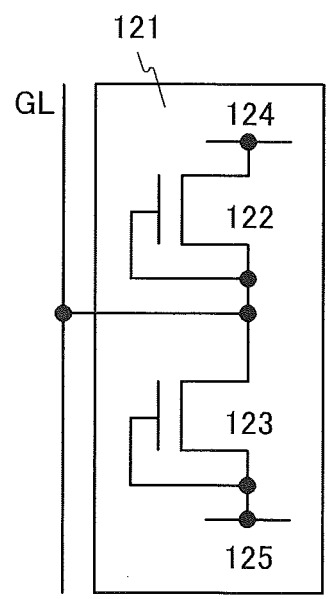

FIG. 11C shows an example of the protective circuit 121 electrically connected to the wiring GL. The wiring GL is electrically connected to a wiring 124 through a transistor 122 that is diode-connected. In addition, the wiring GL is electrically connected to a wiring 125 through a transistor 123 that is diode-connected. The high power supply potential is supplied to the wiring 124, and the low power supply potential is supplied to the wiring 125.

For each of the transistors 112, 113, 122, and 123, any of a variety of semiconductors such as an oxide semiconductor, a semiconductor containing a semiconductor belonging to Group 14 of the periodic table (e.g., silicon), an organic semiconductor, and a compound semiconductor can be used. Moreover, an amorphous semiconductor, a microcrystalline semiconductor, a polycrystalline semiconductor, a single crystal semiconductor, or the like can be used.

Figure 12:
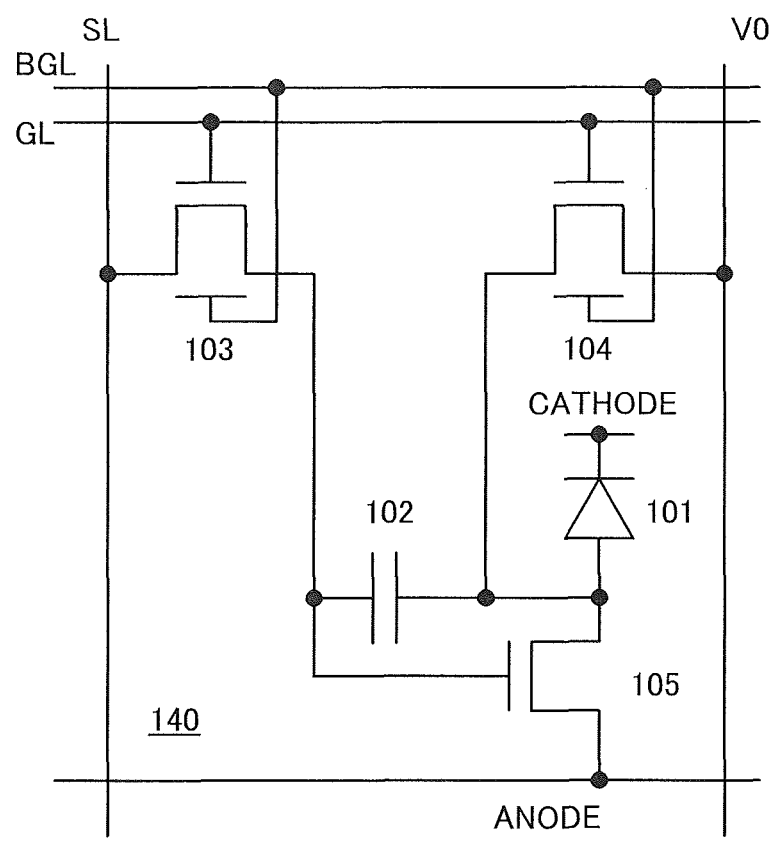
FIG. 12 illustrates an example of a circuit included in a light-emitting panel.

FIG. 12 shows another embodiment of the circuit included in the light-emitting panel. In the circuit in FIG. 12, each of the first transistor 103 and the second transistor 104 has a back gate (also referred to as a second gate). The back gate of the first transistor 103 is electrically connected to a wiring BGL. The back gate of the second transistor 104 is electrically connected to the wiring BGL. The wiring BGL has a function of adjusting the threshold voltages of the first transistor 103 and the second transistor 104. Thus, even in the case where the first transistor 103 and the second transistor 104 are normally-on transistors, on/off of the transistor can be controlled by supplying the potential from the wiring BGL. Note that each back gate may be electrically connected to the wiring GL without the wiring BGL.

In the light-emitting panel in FIG. 12, the back gate of the first transistor 103 and the back gate of the second transistor 104 may be electrically connected to respective wirings different from each other. The third transistor 105 may also have a back gate. The gate and the back gate of the third transistor 105 are electrically connected, whereby the current supply capability of the third transistor 105 can be improved. The gate and the back gate of the third transistor 105 are electrically connected to respective wirings different from each other, whereby the back gate has a function of adjusting the threshold voltage.

When at least one of the above methods is used, the off-state current can be reduced. Furthermore, when any of the above methods are used in combination, the methods are synergistically affected, and the off-state current can be further reduced.

<Stopping Operation>

Next, an operation where the driving of the circuit 140 is stopped in a period during which a video signal is stored by the circuit 140 (the operation is also referred to as stopping operation) is described. Here, the operation of stopping the driving is referred to as the operation where the supply of the potential to each wiring of the circuit 140 is stopped.

First, the initial state of the storage period is set to such a state that both the first transistor 103 and the second transistor 104 are off and the light-emitting element 101 performs display. Note that the storage operation may be regarded as part of the stopping operation. In that case, as an operation (0), the potential at which both the first transistor 103 and the second transistor 104 are turned off is supplied to the wiring GL, whereby the initial state is made. The potential at which the transistors are turned off is set to the same potential as that of the wiring CATHODE, whereby the number of power supplies in the redisplaying operation can be reduced. The same potential indicates not only the potential that is completely the same but also the potential that is substantially the same in consideration of a slight error in design.

Next, as an operation (1), the potential of the wiring SL and the potential of the wiring V0 are set to the same potential as that of the wiring GL. By the operation (1), the number of power supplies in the redisplaying operation can be reduced. Alternatively, the operation (0) and the operation (1) may be performed concurrently, so that the wiring GL, the wiring SL, and the wiring V0 are set to have the same potential at the same time. When the operation (0) and the operation (1) are separately performed, a fluctuation or loss of voltage at the capacitor 102 can be suppressed. Furthermore, after the potential of the wiring SL is set to the same potential as the wiring GL, the potential of the wiring V0 may be set to the same potential as the wiring GL. Alternatively, the setting of potentials may be changed in the reverse order. Note that the operation (1) may be skipped.

Next, as an operation (2), the potential of the wiring ANODE is set to the same potential of the wiring CATHODE. Thus, the displayed image on the light-emitting element 101 disappears. By this operation (2), a rapid reduction of potential at the time of stopping supplying the potential in a subsequent operation (operation (3)) can be prevented, so that a fluctuation or loss of voltage of the capacitor 102 can be suppressed as much as possible. It is possible to perform the operation (1) and the operation (2) concurrently; however, when the operations are performed separately, a fluctuation or loss of voltage of the capacitor 102 can be further suppressed. It is possible to reverse the order of the operation (1) and the operation (2); however, when the operation (2) is performed after the operation (1), a fluctuation or loss of voltage of the capacitor 102 can be further suppressed. Note that when there is no problem of a rapid reduction of potential, the operation (2) may be skipped.

Lastly, as the operation (3), the supply of potential to each wiring of the circuit 140 is stopped, and the driving of the circuit 140 is stopped. Specifically, the circuit 140 and the driver circuit used for writing the video signal are electrically disconnected. Even when the driver circuit is stopped, the voltage at the capacitor 102 can be held. Thus, the driver circuit can be detached, and the light-emitting panel including the circuit 140 but not including the driver circuit can be used. When the driver circuit is detached and the driver circuit and the light-emitting panel are separated, the size and weight of the light-emitting panel can be reduced, and the durability thereof can be improved, for example.

Note that with the circuit configuration of the circuit 140, the voltage at the capacitor 102 can be held; thus, the driving of the circuit 140 in an initial state can be stopped without the stopping operation. In contrast, when the stopping operation is performed, the number of power supplies used in the redisplaying operation can be reduced, or a fluctuation or loss of the voltage during the storage period can be suppressed. Thus, it is extremely effective to perform the stopping operation in the circuit configuration in the circuit 140.

When the stored video signal is erased and writing data is performed again, the writing operation is performed again.

Furthermore, when the circuits 140 are arranged in a matrix as shown in FIG. 10B, a plurality of images can be stored. For example, a first video signal is stored in a plurality of circuits 140 electrically connected to wirings GL1 to GLm (in is an integer greater than or equal to 1) in odd-numbered rows (m=1, 3, 5, 7, or the like), and a second video signal is stored in a plurality of circuits electrically connected to the wirings GL2 to GLm in even-numbered rows (m=2, 4, 6, 8, or the like). During the redisplaying period, the circuits 140 in the odd-numbered rows and the circuits 140 in the even-numbered rows are switched to be driven, whereby a plurality of images can be displayed. Specifically, during a first period in the redisplaying period, the potential may be supplied to the wirings ANODE and CATHODE of the circuits 140 in the odd-numbered rows, and during a second period in the redisplaying period, the potential may be supplied to the wirings ANODE and CATHODE of the circuits 140 in the even-numbered rows. A selection circuit may be provided to switch supplying the potential to the circuits 140 in the odd-number rows and the even-number rows. In addition, three or more images can be stored in a manner similar to the above.

Another example of the stopping operation of the circuit 140 is described. With the following example, data retention capability can be further increased compared with the above stopping operation.

In the above stop operation, the potential at which the first transistor 103 and the second transistor 104 are turned off is supplied to the wiring GL. For example, at a potential of 0 V, the transistors can be turned off. However, in the case where the first transistor 103 and the second transistor 104 are normally-on transistors, the transistors are not off even at a potential of 0 V supplied to the wiring GL, and current may flow.

Thus, in one embodiment of the present invention, the potential supplied to the wiring SL or the wiring V0 is set to higher in the operation (1) of the stopping operation. With the high potential, flowing current can be suppressed even in the case where the first transistor 103 or the second transistor 104 is a normally-on transistor. As a result, a loss of the video signal in the circuit 140 can be suppressed. Because the wiring SL or the wiring V0 is set to have the high potential, in the redisplaying operation of the circuit 140, redisplaying images can be performed in accordance with the stored video signal.

For example, the potential of the wiring SL or the wiring V0 may be set to higher than that of the wiring GL. In particular, the potential of the wiring SL or the wiring V0 is set to have the same potential as the wiring ANODE, whereby the number of power supplies can be reduced. Note that it is not necessary to set the potential of the wiring SL or the wiring V0 to the same as the wiring ANODE.

Alternatively, both the wiring SL and the wiring V0 may have the high potential. In that case, the potential of the wiring SL is set to the same as that of the wiring V0, whereby the number of power supplies can be reduced. Note that it is possible to set the potential of the wiring SL and the potential of the wiring V0 to be different from each other. For example, in the case where current flows more easily through the first transistor 103 than through the second transistor 104, the potential of the wiring SL is set to higher than that of the wiring V0, whereby current can be made to be less likely to flow through the first transistor 103. Alternatively, the potential of the wiring SL may be set to lower than that of the wiring V0.

Note that in the case where the wiring SL is electrically connected to the protective circuit 111 as shown in the light-emitting panel in FIGS. 11A to 11C, the high potential that is supplied to the wiring SL can be supplied from the wiring 114 or the wiring 115. With this structure, the power supply potential supplied to the protective circuit 111 in the stopping operation can be used as the high potential that is supplied to the wiring SL.

Alternatively, in one embodiment of the present invention, the potential of the wiring GL is set low in the operation (0) of the stopping operation. Even when the first transistor 103 or the second transistor 104 is a normally-on transistor, the low potential enables the flow of current to be suppressed. For example, the potential of the wiring GL is preferably lower than 0 V. As a result, a loss of video signal of the circuit 140 can be suppressed. Because the potential of the wiring GL is set low, in the redisplaying operation of the circuit 140, redisplaying images can be performed in accordance with the stored video signal.

Note that in the case where the first transistor 103 or the second transistor 104 is an n-channel transistor, the potential of the wiring GL is set low as described above, and in the case where the first transistor 103 or the second transistor 104 is a p-channel transistor, the potential of the wiring GL may be set high.

In the case where the wiring GL is electrically connected to the protective circuit 121 as shown in the semiconductor device in FIGS. 11A to 11C, the low potential that is supplied to the wiring GL can be supplied from the wiring 124 or the wiring 125. With this structure, the power supply potential supplied to the protective circuit 121 in the stopping operation can be used as the low potential that is supplied to the wiring GL.

Modification Example

Figure 13:
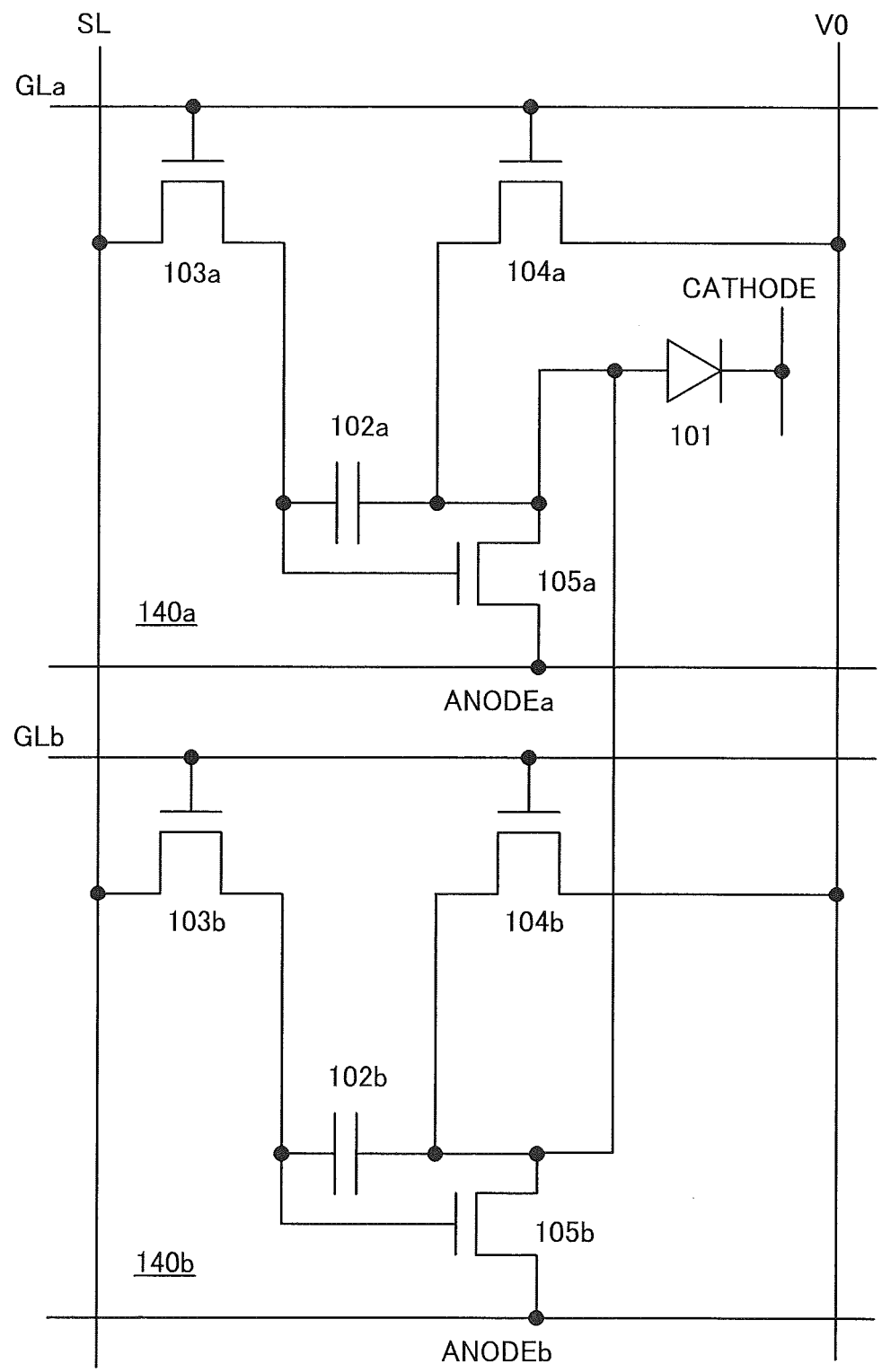
FIG. 13 illustrates an example of a circuit included in a light-emitting panel.

FIG. 13 shows an example of a circuit included in the light-emitting panel. A circuit 140a and a circuit 140b in FIG. 13 each have a connection relation similar to that of the circuit 140 in FIG. 10A. In the configuration of FIG. 13, the light-emitting element 101 is shared between the circuit 140a and the circuit 140b, which is different from the configuration of FIG. 10A. In other words, one electrode of the light-emitting element 101 is electrically connected to a wiring ANODEa through a third transistor 105a of the circuit 140a and also electrically connected to a wiring ANODEb through a fourth transistor 105b of the circuit 140b.

In the case of the circuit 140 in FIGS. 10A and 10B, burn-in may be caused in a pixel due to the storage of one video signal for a long time. In the light-emitting panel shown in FIG. 13, a video signal that is to be displayed is written to the circuit 140a, and an inverted signal of the video signal is written to the circuit 140b. Then, the light-emitting element 101 is made to display an image in accordance with the video signal of the circuit 140a, and after a predetermined period, the light-emitting element 101 is made to display an image in accordance with the inverted signal of the circuit 140b. Every predetermined period, the video signal and the inverted signal are switched, whereby burn-in can be suppressed.

The wiring ANODEa and the wiring ANODEb are switched so that the potential is supplied to the wiring ANODEa during a period where the display is performed by the video signal and the potential is supplied to the wiring ANODEb during a period where the display is performed by the inverted signal. For example, a selection circuit may be provided to switch a conduction state between the wiring ANODEa and the wiring ANODEb in the light-emitting panel. Alternatively, a switch may be provided between the wiring ANODEb and the third transistor 105b to turn the switch on in the case where the display is performed by the inverted signal. The switch may be provided between the light-emitting element 101 and the third transistor 105b or between the third transistors 105b of pixels that are adjacent to each other in the wiring GL direction.

Furthermore, the circuit 140b may store a signal based on a single-color image or a single gray scale image such as a black image, which is effective in suppressing burn-in as in the case of writing an inverted signal.

<Driver Circuit>

Figure 14A:
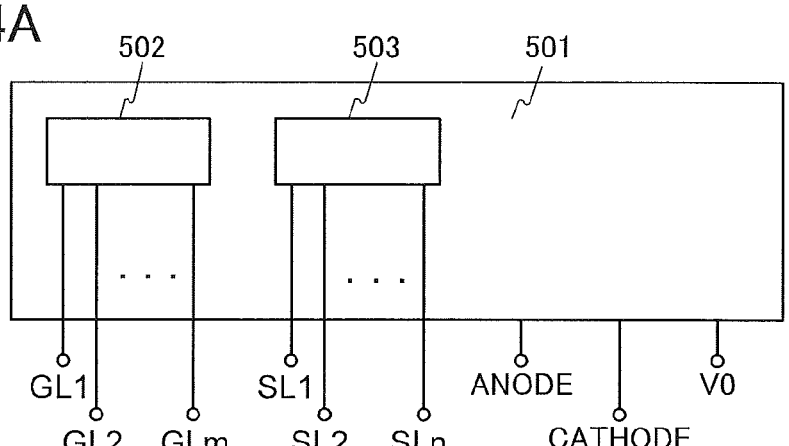
FIGS. 14A to 14C illustrate an example of a driver circuit.
Figure 14B:
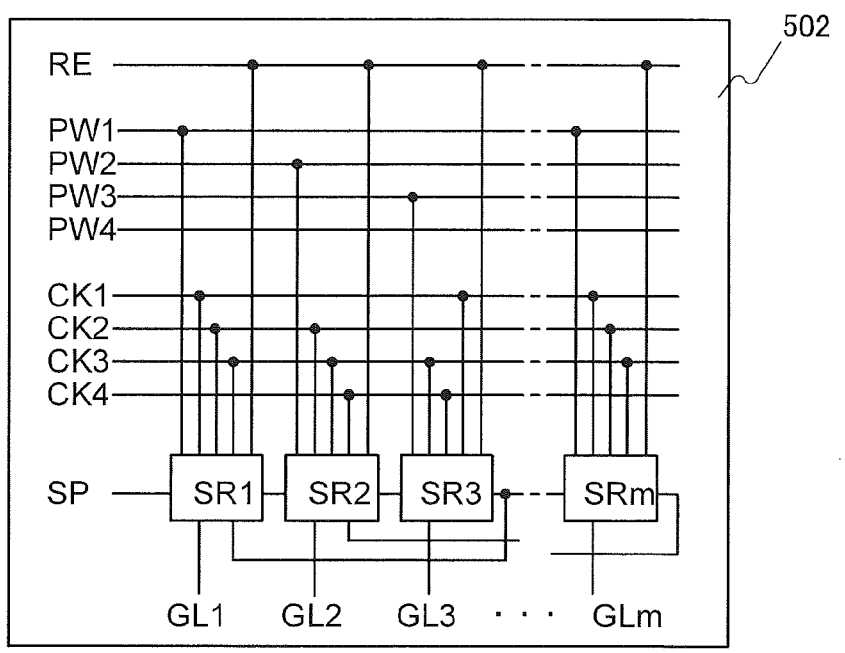
Figure 14C:
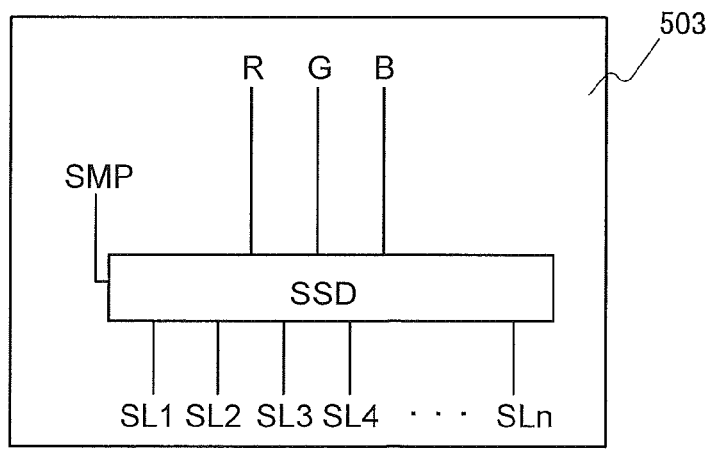

A driver circuit 501 illustrated in FIGS. 14A to 14C has, for example, a function of driving the circuit 140 illustrated in FIGS. 10A and 10B.

The driver circuit 501 includes a first circuit 502 (also referred to as a gate driver) and a second circuit 503 (also referred to as a source driver). In addition, the driver circuit 501 may include a CPU, a memory, or the like.

The first circuit 502 has a function of supplying the potential to the wiring GL1 to the wiring GLm. For example, any of the wiring GL1 to the wiring GLm is electrically connected to the wiring GL shown in FIG. 10A or the like. In addition, the first circuit 502 has a function of supplying the potential to gates of the first transistor 103 and the second transistor 104. Moreover, the first circuit 502 may have a function of supplying the potential to the wiring 124 or the wiring 125 in FIGS. 11A to 11C or the wiring BGL in FIG. 12.

The second circuit 503 has a function of supplying the potential to the wiring SL1 to the wiring SLn (n is an integer greater than or equal to 1). For example, any of the wiring SL1 to the wiring SLn is electrically connected to the wiring SL shown in FIG. 10A or the like. In addition, the second circuit 503 has a function of supplying the potential to one electrode of the capacitor 102 through the first transistor 103.

In the case where m and n are each greater than or equal to 2, the wiring GL1 to the wiring GLm and the wiring SL1 to the wiring SLn in FIGS. 14A to 14C correspond to the wiring GL1 to the wiring GLm and the wiring SL1 to the wiring SLn of the circuit 150 in FIG. 10B.

The driver circuit 501 is electrically connected to the wiring ANODE shown in FIG. 10A or the like and has a function of supplying the potential to the wiring ANODE. In addition, the driver circuit 501 is electrically connected to the wiring CATHODE shown in FIG. 10A or the like and has a function of supplying the potential to the wiring CATHODE. Furthermore, the driver circuit 501 is electrically connected to the wiring V0 shown in FIG. 10A and has a function of supplying the potential to the wiring V0. Moreover, the driver circuit 501 may have a function of supplying the potential to the wiring ANODEa and the wiring ANODEb in FIG. 13.

As described above, the driver circuit 501 has a function of supplying the potential to each wiring of the circuit 140 shown in FIG. 10A or the like to write a video signal, a function of storing the video signal, and a function of making image display in accordance with the video signal.

Furthermore, the driver circuit 501 has a function of performing the stopping operation. When the driver circuit 501 performs the stopping operation, a loss of the video signal during the storage period of the circuit 140 can be suppressed as much as possible, for example.

In addition, the stopping operation is performed when the circuit 140 and the driver circuit 501 are electrically disconnected regardless of the storage period of the video signal, whereby a rapid reduction of voltage in the circuit 140 can be suppressed.

Although in this embodiment, an example in which the driver circuit 501 makes the circuit 140 to stop is described, the driver circuit 501 can be used for another circuit. The driver circuit 501 enables a circuit other than the circuit 140 having a storage function or the like to be driven. For example, before the driver circuit 501 and a circuit without a storage function are electrically disconnected, the stopping operation is performed, whereby a rapid reduction of voltage can be suppressed.

FIG. 14B shows an example of the first circuit 502. The first circuit 502 includes shift registers SR1 to SRm. To the shift registers, a signal RE, signals PW1 to PW4, signals CK1 to CK4, and a signal SP are inputted. The signal RE is a reset signal, the signals PW1 to PW4 are pulse width control signals, the signals CK1 to CK4 are clock signals, and the signal SP is a start pulse signal. With each signal, signals output from the shift registers SR1 to SRm to the wiring GL1 to wiring GLm are controlled. The first circuit 502 is not limited to the circuit shown in FIG. 14B.

FIG. 14C shows an example of the second circuit 503. The second circuit 503 includes a selection circuit SSD. To the selection circuit SSD, a signal R, a signal G, a signal B, and a signal SMP are supplied. The signal R is a video signal used for displaying red gradation image, the signal G is a video signal used for displaying green gradation image, the signal B is a video signal used for displaying blue gradation image, and the signal SMP is a sampling signal. Each voltage value of the video signals is adjusted depending on the gray scale level to be displayed. The selection circuit SSD is driven by time division using a video signal shared between a plurality of wirings. Video signals are supplied in series from the selection circuit SSD to three wirings SL that are regarded as one wiring; for example, the signal R is supplied to the wiring SL1, the signal G is supplied to the wiring SL2, and the signal B is supplied to the wiring SL3. In other words, video signals are output to the wirings SL by time division. To the wiring SL4, the signal R is supplied. With each signal, signals output from the shift registers SR1 to SRm to the wirings SL1 to SLn are controlled. The second circuit 503 is not limited to the circuit shown in FIG. 14C.

<Redisplaying Circuit>

The redisplaying operation is such an operation that the circuit 140 shown in FIGS. 10A and 10B and the driver circuit 501 shown in FIGS. 14A to 14C are electrically disconnected and then an image is redisplayed on the light-emitting element 101. FIGS. 15A to 15F show examples of circuits performing the redisplaying operation (the circuit is also referred to as redisplaying circuit or power supply circuit).

Figure 15A:
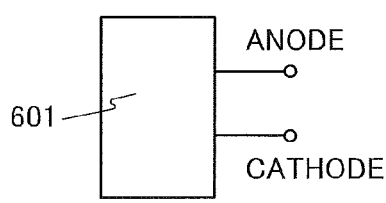
FIGS. 15A to 15F show examples of redisplaying circuits.

A redisplaying circuit 601 shown in FIG. 15A is an example of a circuit having two power supplies. For example, in the circuit 140, the potential can be supplied to the wiring ANODE and the wiring CATHODE.

Figure 15B:
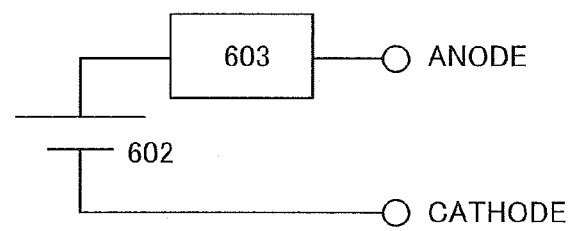

FIG. 15B shows an example of the redisplaying circuit 601. The redisplaying circuit 601 includes a power supply 602 and a converting circuit (also referred to as a converter) 603. As the converter 603, a DC-DC converting circuit (also referred to as a DC-DC converter) or the like can be used.

As the power supply 602, a power storage device such as a lithium ion battery is used for example. Another power storage device such as a nickel-metal hydride battery, a nickel-cadmium battery, or a lithium ion capacitor may be used. Note that it is preferable to use a secondary battery that can perform charge/discharge. A primary battery may be used.

In the case where the power supply 602 can be charged, wireless charging may be performed. In such a case, the redisplaying circuit 601 includes an antenna for wireless charging or the like.

The converter 603 has a function of converting the potential of the power supply 602 to a desired potential and supplying the desired potential to the wiring ANODE. Note that a configuration without the converter 603 may be employed.

Figure 15C:
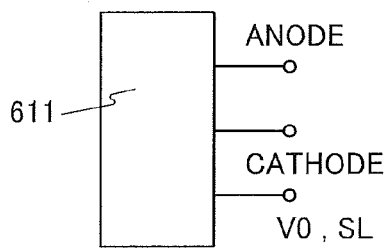
Figure 15D:
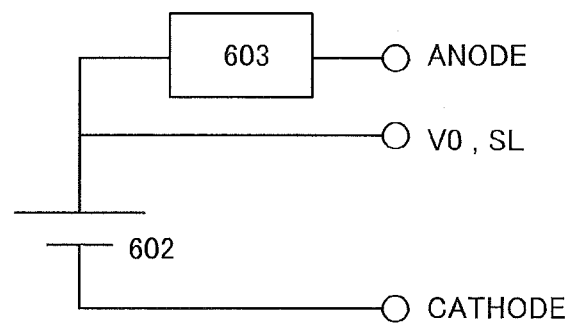

A redisplaying circuit 611 shown in FIG. 15C is an example of a circuit having three power supplies. For example, in the circuit 140, the potential can be supplied to the wiring ANODE, the wiring CATHODE, the wiring V0, and the wiring SL. The redisplaying circuit 611 can be employed when the potential is supplied to the wiring V0 and the wiring SL. In the case where the wiring V0 and the wiring SL are supplied with different potentials from each other, the number of converters 603 may be increased, and the number of output terminals may be increased. In the case where the wiring V0 and the wiring SL are supplied with the same potential as that of the wiring ANODE or the wiring CATHODE, the redisplaying circuit 601 shown in FIG. 15A may be employed. FIG. 15D shows an example of the redisplaying circuit 611, which includes another power supply for supplying the potential to the wiring V0 and the wiring SL, in addition to the configuration in FIG. 15B (i.e., the circuit in FIG. 15D includes three power supplies). As for the power supply for supplying the potential to the wiring V0 and the wiring SL, the potential of the power supply 602 can be used. As described above, the number of converters 603 and the number of output terminals are changed in accordance with the number of needed power supplies.

Figure 15E:
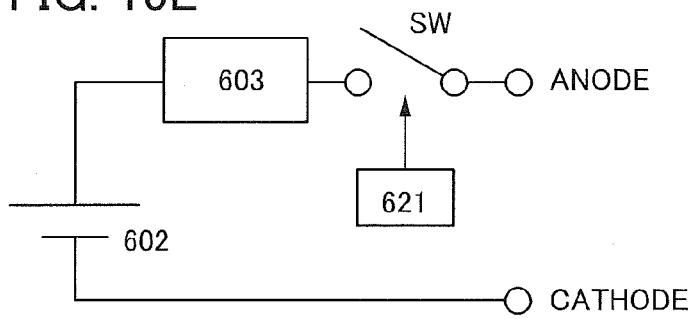

FIG. 15E is a modified example of FIG. 15B. A switch SW is provided between the power supply 602 and the wiring ANODE. In addition, a timer 621 that controls the timing of on/off of the switch SW is provided. With the switch SW and the timer 621, conduction between the power supply 602 and the wiring ANODE can be controlled. With this configuration, a blinking display can be performed in the redisplaying operation. Note that the switch SW may be provided between the power supply 602 and the wiring CATHODE, and the switch SW is preferably provided between the redisplaying circuit and the circuit 140 or the like. In addition, the switch SW and the timer 621 may be employed for a configuration in FIG. 15D.

Figure 15F:
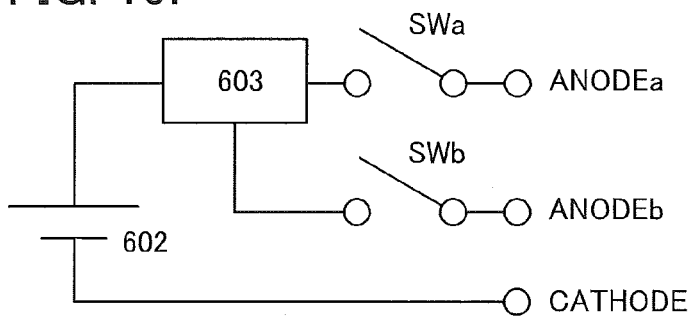

FIG. 15F shows an example of a circuit performing the redisplaying operation in the circuit shown in FIG. 13. In the case where display is performed by a video signal, a switch SWa is turned on and a switch SWb is turned off, whereby the conduction between the power supply 602 and the wiring ANODEa is made. In the case where display is performed by an inverted signal, the switch SWb is turned on and the switch SWa is turned off, whereby the conduction between the power supply 602 and the wiring ANODEb is made. With such a switching circuit including the switch SWa and the switch SWb, a video signal and an inverted signal can be switched every predetermined period. In addition, the redisplaying circuit shown in FIG. 15F may be connected to the light-emitting panel storing a plurality of images. In such a case, the wiring ANODEa can be electrically connected to the wirings ANODE in odd-numbered rows, and the wiring ANODEb can be electrically connected to the wirings ANODE in even-numbered rows.

With the use of the above redisplaying circuit, display can be performed even when the driver circuit is detached from the light-emitting panel. Thus, this is extremely effective for a light-emitting panel on which a driver circuit cannot be mounted. As an example of a semiconductor device in which a driver circuit cannot be mounted, a small-sized semiconductor device, a lightweight semiconductor device, a semiconductor device in which the number of power supplies is restricted, or the like can be given.

In the case where the driver circuit 501 is not detached, the potential is supplied from the driver circuit 501 to the wiring ANODE, the wiring CATHODE, the wiring V0, and the wiring SL; thus, it is not necessary to use the redisplaying circuit.

<Light-Emitting Panel>

Figure 16A:
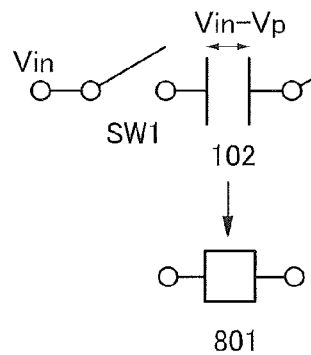

A light-emitting panel shown in FIG. 16A includes a light-emitting element 801, a capacitor 102, a switch SW1, and a switch SW2.

When the switch SW1 and the switch SW2 are turned on, a video signal is written to the light-emitting panel. Specifically, a potential Vin is supplied to one electrode of the capacitor 102 through the switch SW1. A potential Vp is supplied to the other electrode of the capacitor 102 through the switch SW2. Then, the switch SW1 and the switch SW2 are turned off, whereby a potential difference between the electrodes (Vin−Vp) is held between the electrodes of the capacitor 102. The potential difference is a voltage corresponding to the video signal.

The light-emitting element 101 has a function of performing display in accordance with the potential difference held by the capacitor 102. There is no particular limitation on the circuit configuration as long as the display element 101 has the above function. The switch SW1 may be provided between the one electrode of the capacitor 102 and a wiring through which the potential Vin is supplied, and the switch SW2 may be provided between the other electrode of the capacitor 102 and a wiring from which the potential Vp is supplied.

As the switch SW1 and the switch SW2, a transistor can be used. In such a case, the above-described method for reducing the off-state current of the transistor can be used.

For the light-emitting panel shown in FIG. 16A, the operation (0), the operation (1), and the operation (3) which are the above-described stopping operations can be employed. For example, as the operation (0), the switch SW1 and the switch SW2 are turned off. In the case where a transistor is used as a switch, the potential at which the transistor is turned off is supplied to a gate. Next, as the operation (1), the potential Vin and the potential Vp are set to the same as the potential supplied to the gate. Then, as the operation (3), driving of the light-emitting panel is stopped. Specifically, the light-emitting panel and a driver circuit used for writing a video signal are electrically disconnected. Note that the driver circuit has a function of supplying the potential Vin and the potential Vp and the potential that controls the on/off of the switch SW1 and the switch SW2.

As described above, by the stopping operation, a fluctuation or loss of the voltage of the capacitor 102 can be suppressed in the light-emitting panel in FIG. 16A.

Figure 16D:
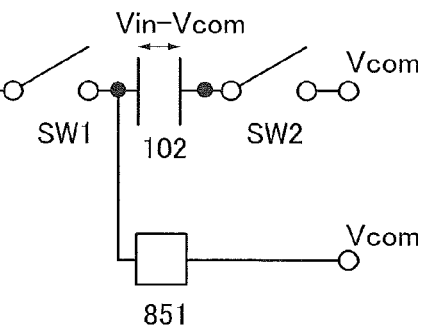
Figure 16B:
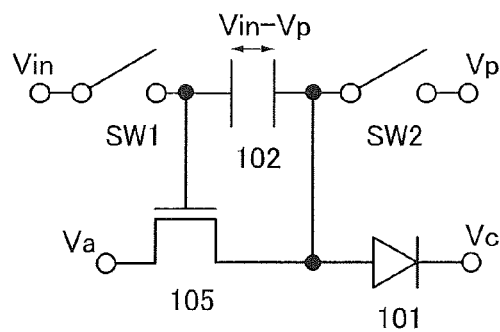

A light-emitting panel shown in FIG. 16B is a specific example of the light-emitting panel in FIG. 16A. The current flowing through the transistor 105 is controlled in accordance with the voltage held by the capacitor 102, and the current is made to flow in the light-emitting element 101. Note that the circuit 140 in FIGS. 10A and 10B corresponds to the specific circuit configuration in FIG. 16B. In the case of using the circuit 140 in FIGS. 10A and 10B, the potential Vin is supplied from the wiring SL, the potential Vp is supplied from the wiring V0, and a potential Va is supplied from the wiring ANODE, and a potential Vc is supplied from the wiring CATHODE. Note that a switch is provided between the wiring ANODE and the transistor 105 and the on/off of the switch is controlled during the display period or the redisplaying period, whereby display or non-display may be controlled.

Figure 16E:
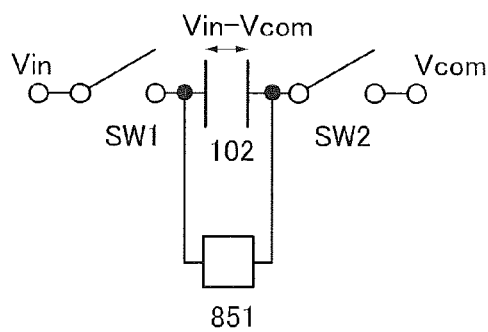
Figure 16C:
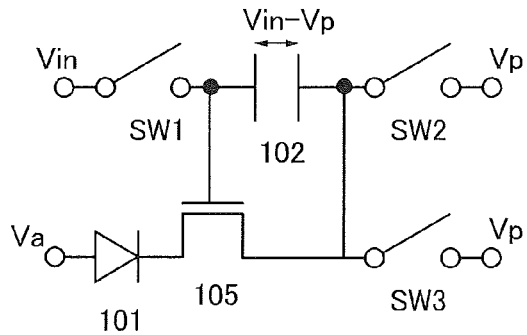

A light-emitting panel shown in FIG. 16C is a modified example of the light-emitting panel in FIG. 16B. As in the case of FIG. 16B, the amount of current flowing through the transistor 105 is adjusted in accordance with the voltage held by the capacitor 102, and the current can be made to flow in the light-emitting element 101. Note that in the case of FIG. 16C, the potential at which the switch SW3 is turned off may be supplied during the storage operation, and the potential at which the switch SW3 which is provided between the wiring CATHODE and the transistor 105 is turned on may be supplied during the redisplaying operation. The potential Vp is the same as the potential Vc of the wiring CATHODE.

A light-emitting panel shown in FIG. 16D is a specific example of the light-emitting panel in FIG. 16A. The light-emitting panel in FIG. 16D includes a light-emitting element 851, the capacitor 102, the switch SW1, and the switch SW2. As the light-emitting element 851, a liquid crystal element, an electrophoretic element, or the like can be used. One electrode of the light-emitting element 851 is electrically connected to one electrode of the capacitor 102. The other electrode of the light-emitting element 851 is electrically connected to a common wiring Vcom.

The one electrode of the capacitor 102 is supplied with the potential Vin through the switch SW1 when the switch SW1 is on. In a similar manner, the one electrode of the light-emitting element 851 is supplied with the potential Vin. The other electrode of the capacitor 102 is supplied with the potential Vcom through the switch SW2 when the switch SW2 is on. Then, the switch SW1 and the switch SW2 are turned off, whereby the potential difference (Vin−Vcom) between the electrodes of the capacitor 102 is held. The potential difference is the voltage corresponding to the video signal.

The light-emitting element 851 has a function of performing display in accordance with the voltage held by the capacitor 102.

A light-emitting panel shown in FIG. 16E is a modified example of the semiconductor device in FIG. 16D. A difference from FIG. 16D is that the other electrode of the light-emitting element 851 is electrically connected to the other electrode of the capacitor 102 and also electrically connected to the common wiring Vcom through the switch SW2.

Figure 16F:
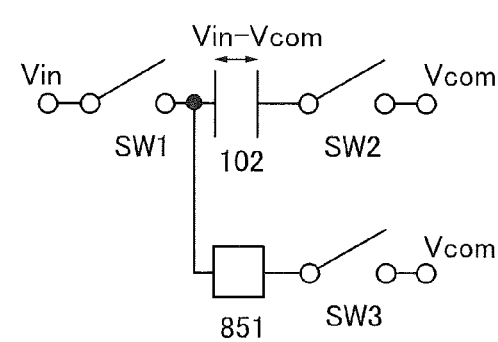

A light-emitting panel shown in FIG. 16F is a modified example of the light-emitting panel in FIG. 16D. A difference from FIG. 16D is that the other electrode of the light-emitting element 851 is electrically connected to the common wiring Vcom through the switching element SW3. The switch SW3 may be turned on during the writing period of a video signal or the display period.

For the semiconductor devices shown in FIGS. 16D to 16F, the operation (0), the operation (1), and the operation (3) which are the stopping operations can be employed as in the case of the semiconductor device in FIG. 16A. For example, as the operation (0), the switch SW1, the switch SW2, and the switch SW3 are turned off. In the case of using a transistor as the switch, the potential at which the transistor is turned off is supplied to a gate. Next, as the operation (1), the potential Vin and the potential Vcom are set to the same as the potential supplied to the gate. Then, as the operation (3), the driving of the semiconductor device is stopped. Specifically, the light-emitting panel and a driver circuit used for writing the video signal are electrically disconnected. Note that the driver circuit has a function of supplying the potential that controls the potential Vin and the potential Vcom and the on/off of the switch SW1 and the switch SW2. As described above, by the stopping operation, a fluctuation or loss of the voltage of the capacitor 102 can be suppressed in the light-emitting panels shown in FIGS. 16D to 16F.

In each of the light-emitting panels shown in FIGS. 16A to 16F, one electrode and the other electrode of the capacitor are electrically connected to respective switches, whereby the voltage between the electrodes of the capacitor can be held by turning the switch off.

As the switch SW1, the switch SW2, and the switch SW3, transistors can be used. In that case, the above-described method for reducing the amount of off-state current of the transistor can be employed.

An example of a case where a circuit connected to a light-emitting panel is switched between a driver circuit and a redisplaying circuit is described below.

Figure 17A:
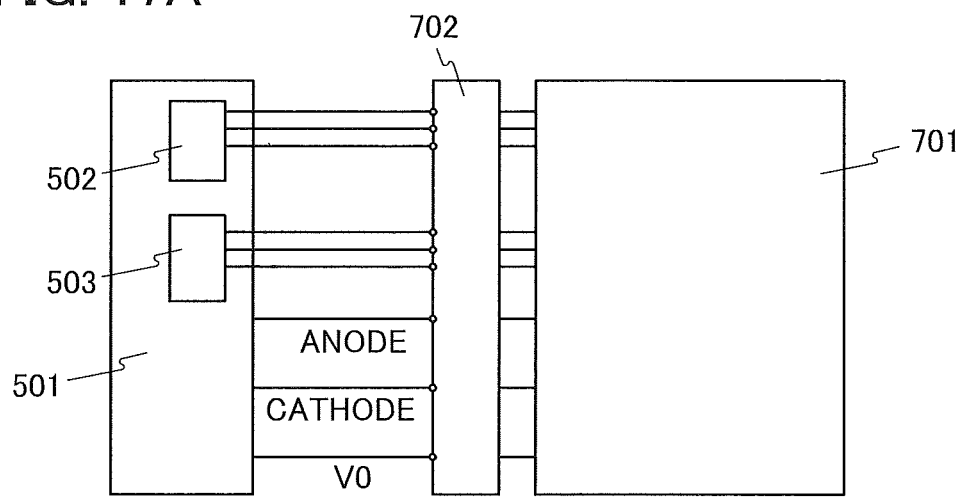

FIG. 17A shows a state where the driver circuit 501 is connected to a light-emitting panel 701. The light-emitting panel 701 includes the circuit 140 or the circuit 150 illustrated in FIGS. 10A and 10B, FIGS. 11A to 11C, FIG. 12, and FIG. 13. The light-emitting panel 701 and the driver circuit 501 are connected through a connection portion 702. In this state, the writing operation, the storage operation, the display operation, and the stopping operation can be performed. The connection portion 702 can include an FPC or the like.

Figure 17B:
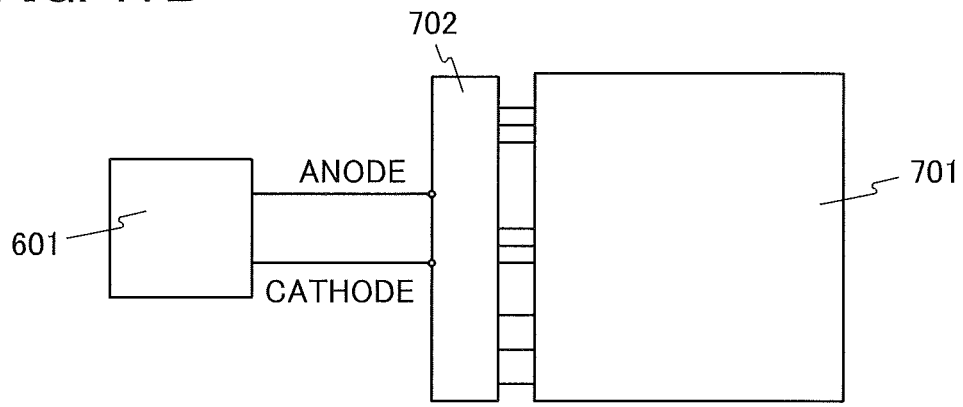

FIG. 17B shows a state where the redisplaying circuit 601 is connected to the light-emitting panel 701. The light-emitting panel 701 and the redisplaying circuit 601 are connected through the connection portion 702. In this state, the redisplaying operation can be performed. Note that instead of the redisplaying circuit 601, another circuit that is any of the circuits shown in FIGS. 15C to 15F may be used.

As described above, the light-emitting panel 701 can be electrically connected or disconnected with the driver circuit 501 or the redisplaying circuit 601 with the use of the connection portion 702. Thus, it is possible to detach the driver circuit 501 and to attach the redisplaying circuit 601.

Although the light-emitting panel 701 and the connection portion 702 are separately provided in FIGS. 17A and 17B, the light-emitting panel 701 may include the connection portion 702.

Specific description is made with reference to FIGS. 18A to 18E.

Figure 18A:
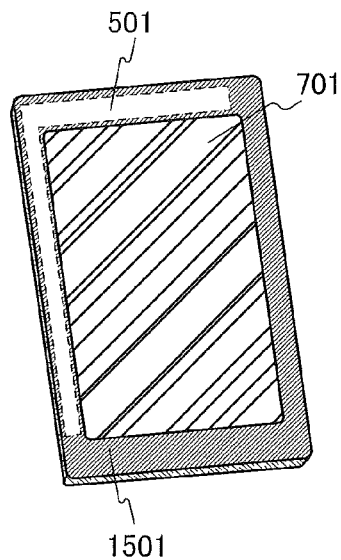

FIG. 18A illustrates a state where the light-emitting panel 701 is provided on a component 1501 including the driver circuit 501. In this state, the light-emitting panel 701 is electrically connected to the driver circuit 501 through the connection portion 702 shown in FIGS. 17A and 17B (but not shown in FIGS. 18A to 18E). A video signal is written from the driver circuit 501 to the light-emitting panel 701.

In the storage period, the light-emitting panel 701 and the driver circuit 501 are electrically disconnected, and then, the light-emitting panel 701 is detached from the component 1501.

Figure 18B:
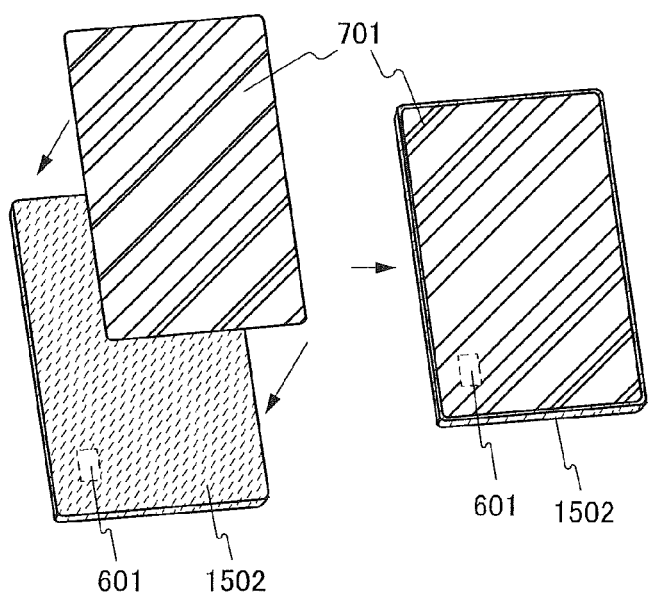

FIG. 18B illustrates a state before the detached light-emitting panel 701 is provided on a component 1502 including the redisplaying circuit 601 and a state after the detached light-emitting panel 701 is provided on the component 1502.

Figure 18C:
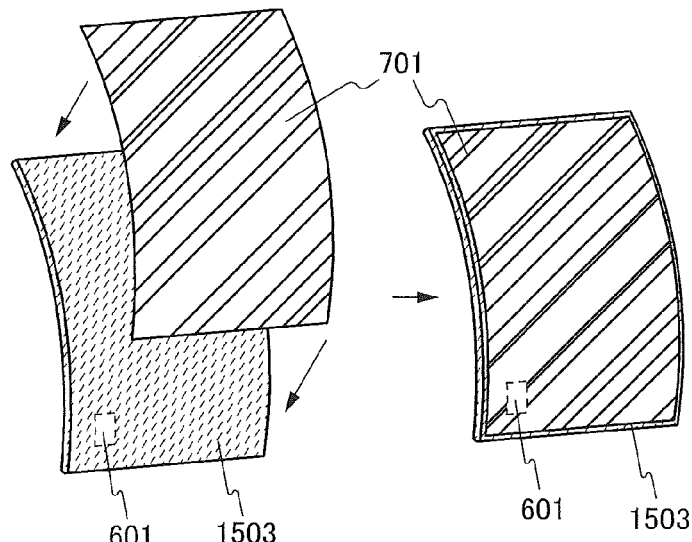

FIG. 18C illustrates a modified example of FIG. 18B, in which the light-emitting panel 701 is attached to a component 1503 having a curved surface. The component 1503 is provided with the redisplaying circuit 601. Note that as the component 1503, a component that constantly keeps a curved shape can be used. Alternatively, the component 1503 may be a component that has flexibility and can be changed between a flat shape and a curved shape. Thus, the semiconductor device 701 is preferably fainted using a flexible substrate. Examples of the flexible component 1503 or the flexible substrate include a plastic substrate.

Figure 18D:
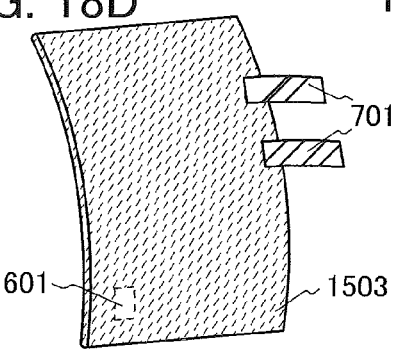

FIG. 18D illustrates a modified example of FIG. 18C. A plurality of light-emitting panels 701 can be provided on the component 1503 provided with the redisplaying circuit 601. The light-emitting panels 701 can be attached to the component 1503 as stamps or tags. In that case, a plurality of light-emitting panels 701 can be provided on the component 1503 with only one redisplaying circuit 601.

Figure 18E:
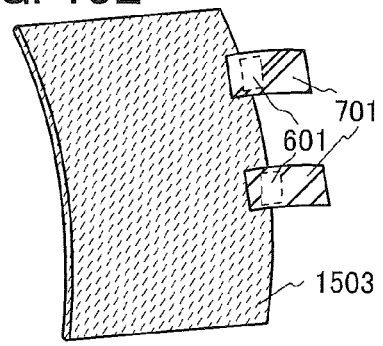

FIG. 18E illustrates a modified example of FIG. 18D. The light-emitting panel 701 provided with the redisplaying circuit 601 can be provided on the component 1503. As in the case of FIG. 18D, the light-emitting panel 701 can be attached to the component 1503 as a stamp or a tag. Note that the redisplaying circuit 601, a connection wiring, or the like is not needed for the component 1503; thus, the range of application of the component 1503 is markedly increased.

Furthermore, a sensor is provided for the component 1502 or the component 1503, and display, non-display, blinking, image switching, or the like of the light-emitting panel 701 may be performed in accordance with a signal from the sensor. Examples of sensors include an acceleration sensor, an angular sensor, a temperature sensor, and an optical sensor. By the sensor, the motion of the light-emitting panel, the surrounding temperature, the intensity of incident light can be sensed.

This embodiment can be combined as appropriate with any of the other embodiments.

Embodiment 5

In this embodiment, application examples of the light-emitting device of one embodiment of the present invention will be described with reference to FIGS. 19A to 19D, FIGS. 20A to 20I, and FIGS. 21A to 21E.

With the use of the light-emitting device of one embodiment of the present invention, an electronic device or a lighting device which can be used in a wide temperature range can be manufactured. Alternatively, with the use of the light-emitting device of one embodiment of the present invention, a small or thin electronic device or lighting device can be manufactured.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

The electronic device or the lighting device of one embodiment of the present invention has flexibility and therefore can be incorporated along a curved inside-outside wall surface of a house or a building or a curved interior/exterior surface of a car.

Figure 19A:
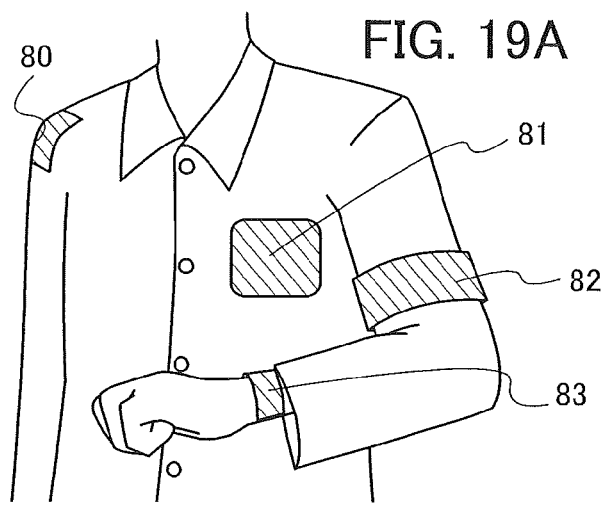
FIGS. 19A to 19D each illustrate a usage example of a light-emitting panel.

As illustrated in FIG. 19A, the light-emitting device of one embodiment of the present invention can be used for devices 80 and 81 attached to clothes. Similarly, it can be used for a lighting device attached to an assault jacket. Moreover, it can be used for an armband device 82 or a wristband device 83.

Figure 19B:
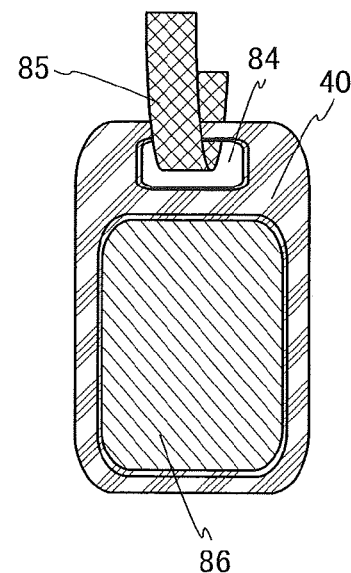

As illustrated in FIG. 19B, in the light-emitting device of one embodiment of the present invention, part of the sealing structure 40 may include an opening 84 through which a strap 85 or the like can pass. It is preferable that the opening 84 or a light-emitting portion 86 be sealed to prevent entry of moisture or impurities in the air into the light-emitting panel or the like.

The light-emitting device of one embodiment of the present invention can be used in an environment at such a high or low temperature that a human cannot enter because it can be used in a wide temperature range. For example, it can be favorably used as a lighting device included in an industrial robot.

Figure 19C:
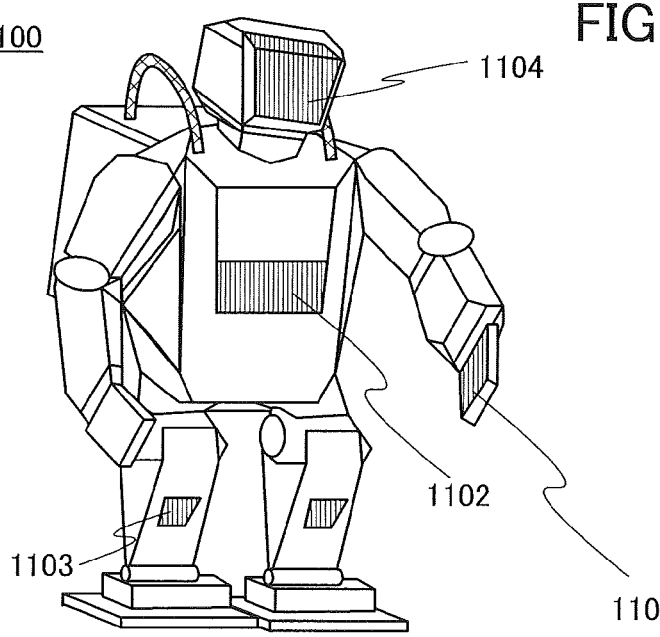

FIG. 19C illustrates a robot 1100, which has a trunk portion, leg portions, a head portion, and arm portions. The robot 1100 can be used for assisting a person in nursing care, for example. The robot can also be used as an industrial robot in a factory. The robot can be provided with a variety of sensors or elements in accordance with the usage of the robot.

As the sensor, a sensor that has a function of measuring, for example, force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays can be used. With the sensor, for example, data on an environment (e.g., temperature) where the robot 1100 is placed can be acquired. The robot 1100 may include a memory for storing an acquired result.

For example, the robot needs to have a tactile sensor measuring pressure and the like with high accuracy in order to hold a person or an object. For this reason, tactile sensors are preferably distributed throughout the body of the robot 1100 with high density.

The light-emitting device of one embodiment of the present invention can be incorporated in at least one of the trunk portion, the leg portions, the head portion, and the arm portions of the robot 1100. For example, the robot 1100 may include at least one of a lighting unit 1102 in the trunk portion, a lighting unit 1103 in the leg portion, a lighting unit 1104 in the head portion, and a lighting unit 1105 in the arm portion. The light-emitting device of one embodiment of the present invention can be used as any of these lighting units.

The light-emitting device of one embodiment of the present invention is favorably used for a display portion of the interior or exterior of a moving object (an automobile, an airplane, a train, a vessel, or the like) because it can be used in a wide temperature range.

For example, it is possible to send a package by an unmanned transport aircraft. The unmanned transport aircraft is provided with the global positioning system (GPS). A package may be stored in the unmanned transport aircraft, or a portion for fixing a package may be provided on the exterior of the unmanned transport aircraft.

Figure 19D:
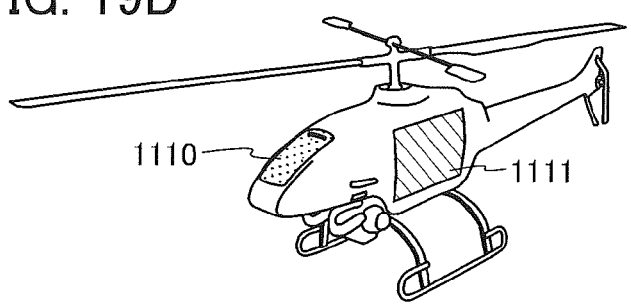

FIG. 19D illustrates a helicopter as an example of the unmanned transport aircraft. A display portion 1111 is provided on the exterior of the body of the helicopter. As the display portion 1111, the flexible light-emitting device of one embodiment of the present invention is preferably used.

A person who received the package can confirm the contents, address, sender, and the like of the package with the display portion 1111. A package can be taken out from or put in the helicopter through a door 1110.

Furthermore, the display portion 1111 may have a function of a touch panel. For example, a person who receives a package may unlock the door 1110 by inputting a password for receiving the package.

The display portion 1111 may include a biological sensor (a finger print sensor, a retina sensor, a vein sensor, or the like). For example, with a biological sensor, the door 1110 may be unlocked when a person who operates the display portion 1111 is judged to be a person who should receive a package.

An aircraft including the light-emitting device of one embodiment of the present invention is not limited to a helicopter, and may be an airship, an airplane, or the like. An unmanned moving object is not limited to an aircraft, and may be an automobile or the like.

FIGS. 20A to 20D illustrate examples of an electronic device including a display portion 7000 with a curved surface. The display surface of the display portion 7000 is bent, and images can be displayed on the bent display surface. Note that the display portion 7000 may be flexible.

The display portion 7000 is formed using the light-emitting device of one embodiment of the present invention.

FIG. 20A illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 20A includes a touch sensor in the display portion 7000. Moreover, operations such as making a call and inputting a letter can be performed by touch on the display portion 7000 with a finger, a stylus, or the like.

With the operation buttons 7103, power ON or OFF can be switched. In addition, types of images displayed on the display portion 7000 can be switched; switching images from a mail creation screen to a main menu screen, for example.

FIG. 20B illustrates an example of a television set. In the television set 7200, the display portion 7000 is incorporated into the housing 7201. Here, the housing 7201 is supported by a stand 7203.

The television set 7200 illustrated in FIG. 20B can be operated with an operation switch of the housing 7201 or a separate remote controller 7211. Furthermore, the display portion 7000 may include a touch sensor. The display portion 7000 can be performed by touching the display portion with a finger or the like. Furthermore, the remote controller 7211 may be provided with a display portion for displaying data output from the remote controller 7211. With operation keys or a touch panel of the remote controller 7211, channels and volume can be controlled and images displayed on the display portion 7000 can be controlled.

Note that the television set 7200 is provided with a receiver, a modem, and the like. A general television broadcast can be received with the receiver. Further, when the television set is connected to a communication network with or without wires via the modem, one-way (from a transmitter to a receiver) or two-way (between a transmitter and a receiver or between receivers) data communication can be performed.

FIG. 20C is a perspective view of a portable information terminal 7300, and FIG. 20D is a top view of the portable information terminal 7300. The portable information terminal 7300 includes a housing 7301 and the display portion 7000. Furthermore, the portable information terminal 7300 may also include an operation button, an external connection port, a speaker, a microphone, an antenna, a battery, or the like. The display portion 7000 is provided with a touch sensor. An operation of the portable information terminal 7300 can be performed by touching the display portion 7000 with a finger, a stylus, or the like.

Each of the portable information terminals illustrated in this embodiment functions as, for example, one or more of a telephone set, a notebook, and an information browsing system. Specifically, each of the portable information terminals can be used as a smartphone. Each of the portable information terminals illustrated in this embodiment is capable of executing a variety of applications such as mobile phone calls, e-mailing, reading and editing texts, music reproduction, Internet communication, and a computer game, for example.

The portable information terminal 7300 can display characters and image information on its plurality of surfaces. For example, as illustrated in FIG. 20C, three operation buttons 7302 can be displayed on one surface, and information 7303 indicated by a rectangle can be displayed on another surface. FIGS. 20C and 20D illustrate an example in which information is displayed at the top of the portable information tee urinal.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed in place of the information.

For example, a user of the portable information terminal 7300 can see the display (here, the information 7303) with the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

FIGS. 20E to 20H each illustrate an example of a portable information terminal including a display portion 7001 having flexibility.

The display portion 7001 is formed using the light-emitting device of one embodiment of the present invention. For example, a light-emitting device that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like.

FIGS. 20E and 20F illustrate an example of a foldable portable information terminal. FIG. 20E illustrates a portable information terminal 7650 that is folded so that the display portion 7001 is on the inside. FIG. 20F illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged.

FIG. 20G illustrates an example of a flexible portable information terminal. A portable information terminal 7700 includes a housing 7701 and the display portion 7001. In addition, the portable information terminal 7700 may include buttons 7703a and 7703b which serve as input means, speakers 7704a and 7704b which serve as sound output means, an external connection port 7705, a microphone 7706, or the like. A flexible battery 7709 can be mounted on the portable information terminal 7700. The battery 7709 may be arranged to overlap with the display portion 7001, for example.

The housing 7701, the display portion 7001, the battery 7709 are flexible. Thus, it is easy to curve the portable information terminal 7700 into a desired shape or to twist the portable information terminal 7700. For example, the portable information terminal 7700 can be curved so that the display portion 7001 is on the inside or in the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 can be used effectively in various situations because the portable information terminal 7700 is lightweight. For example, the portable information terminal 7700 can be used in the state where the upper portion of the housing 7701 is suspended by a clip or the like, or in the state where the housing 7701 is fixed to a wall by magnets or the like.

FIG. 20H illustrates an example of a wrist-watch-type portable information terminal. The portable information terminal 7800 includes a band 7801, a display portion 7001, an input-output terminal 7802, operation buttons 7803, or the like. The band 7801 has a function of a housing. In addition, a flexible battery 7805 can be mounted on the portable information terminal 7800. The battery 7805 may overlap with the display portion 7001 and the band 7801, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation button 7803 can be set freely by the operating system incorporated in the portable information terminal 7800.

By touching an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

Alternatively, the portable information terminal 7800 may include the input-output terminal 7802. In the case where the input-output terminal 7802 is included, data can be directly transmitted to and received from another information terminal via a connector. Charging through the input-output terminal 7802 is also possible. Note that charging of the portable information terminal described as an example in this embodiment can be performed by non-contact power transmission without using the input-output terminal.

Figure 21A:
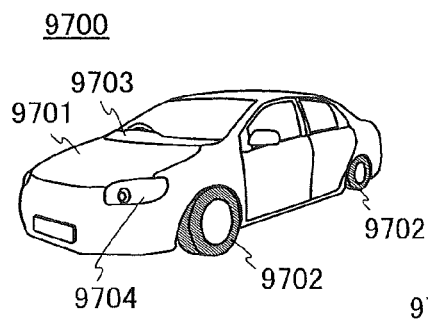
FIGS. 21A to 21E each illustrate an example of an electronic device.
Figure 21B:
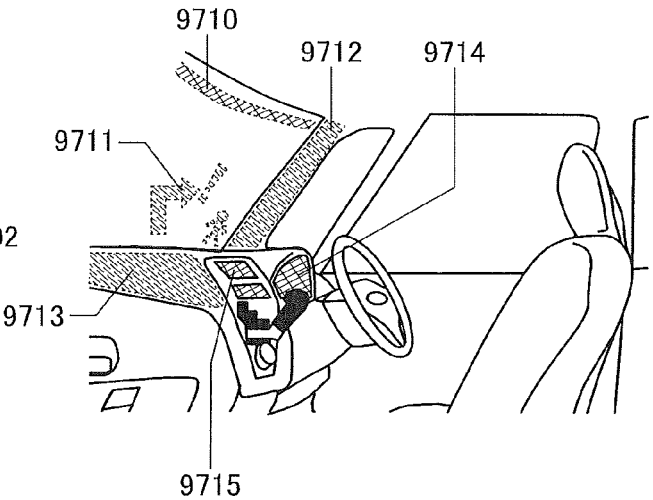

FIG. 21A is an external view of an automobile 9700. FIG. 21B illustrates a driver's seat of the automobile 9700. The automobile 9700 includes a car body 9701, wheels 9702, a dashboard 9703, lights 9704, and the like. The light-emitting device of one embodiment of the present invention can be used in a display portion or the like of the automobile 9700. For example, the light-emitting device of one embodiment of the present invention can be used in display portions 9710 to 9715 illustrated in FIG. 21B.

The display portion 9710 and the display portion 9711 are display devices provided in an automobile windshield. The light-emitting device of one embodiment of the present invention can be a see-through light-emitting device, through which the opposite side can be seen, by using a light-transmitting conductive material for its electrodes and wirings. For example, when the display portion 9710 and the display portion 9711 are see-through display portions, driver's vision during driving the automobile 9700 is not hindered. Therefore, the light-emitting device of one embodiment of the present invention can be provided in the windshield of the automobile 9700. Note that in the case where a transistor or the like for driving the light-emitting device is provided in the light-emitting device, a transistor having light-transmitting properties, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see, makes it possible for the driver to confirm safety easily and comfortably.

Figure 21C:
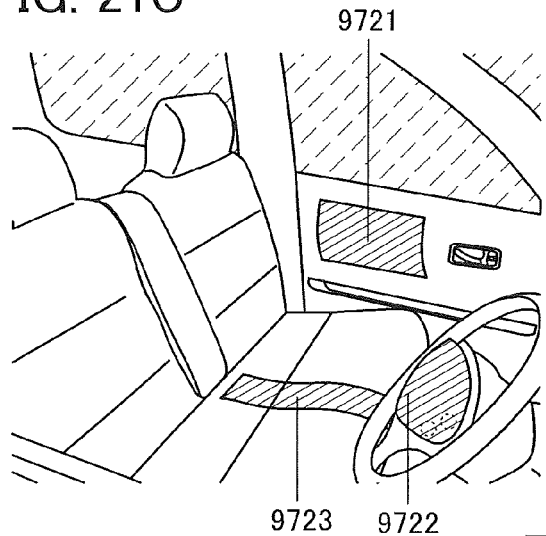

FIG. 21C illustrates the inside of a car in which bench seats are used for a driver seat and a front passenger seat. A display portion 9721 is a display device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can provide a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

A display portion to which the light-emitting device of one embodiment of the present invention or the like is applied may be flat. In this case, the light-emitting device of one embodiment of the present invention or the like need not necessarily have a curved surface or flexibility.

Figure 21D:
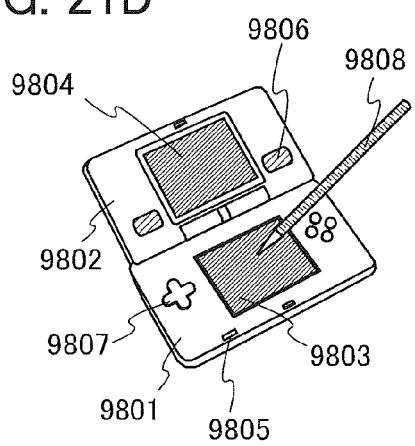

FIG. 21D illustrates a portable game console including a housing 9801, a housing 9802, a display portion 9803, a display portion 9804, a microphone 9805, a speaker 9806, an operation key 9807, a stylus 9808, and the like.

The portable game console shown in FIG. 21D includes two display portions 9803 and 9804. Note that the number of display portions of an electronic device of one embodiment of the present invention is not limited to two and can be one or three or more as long as at least one display portion includes the light-emitting device of one embodiment of the present invention.

Figure 21E:
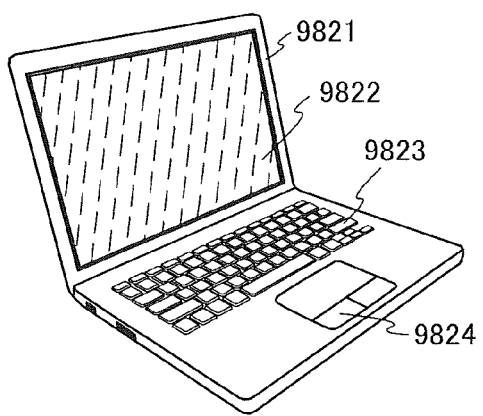

FIG. 21E illustrates a laptop personal computer including a housing 9821, a display portion 9822, a keyboard 9823, a pointing device 9824, and the like.

This embodiment can be combined as appropriate with any of the other embodiments.

Embodiment 6

In this embodiment, an example of a pixel circuit which can be used for the light-emitting device of one embodiment of the present invention is described with reference to FIGS. 22A and 22B, FIGS. 23A and 23B, FIGS. 24A and 24B, and FIGS. 25A and 25B.

In this embodiment, a pixel circuit having a function of compensating the influence of changes in threshold voltage or the like of a transistor.

Figure 22A:
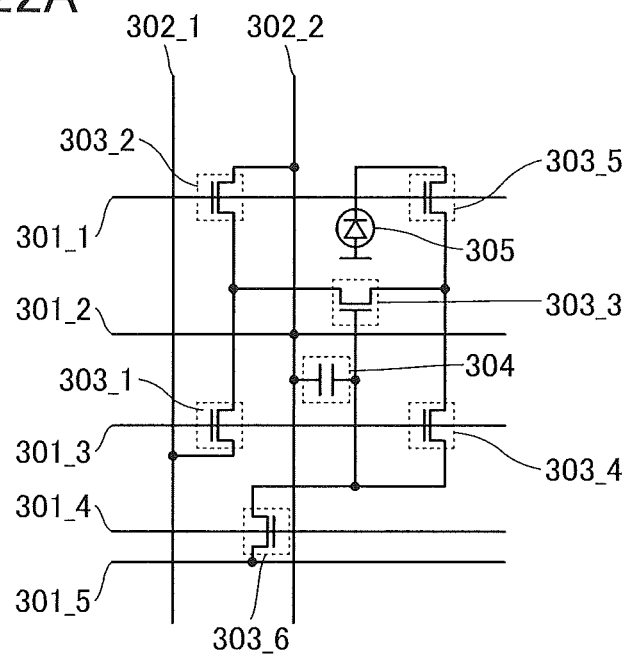
FIGS. 22A and 22B each illustrate an example of a pixel circuit.
Figure 24A:
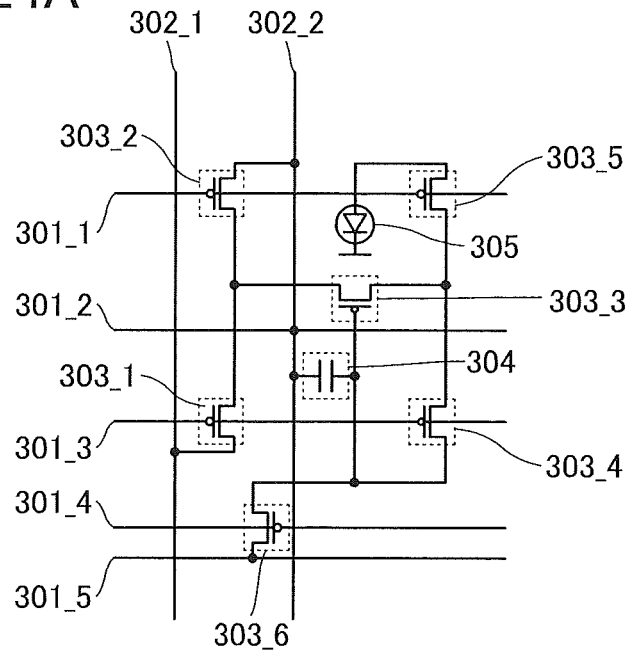
FIGS. 24A and 24B each illustrate an example of a pixel circuit.

The pixel circuit shown in FIG. 22A includes six transistors (transistors 303_1 to 303_6), a capacitor 304, and a light-emitting element 305. Wirings 301_1 to 301_5 and wirings 302_1 and 302_2 are electrically connected to the pixel circuit shown in FIG. 22A. As the transistors 303_1 to 303_6, n-channel transistors can be used, for example. Note that p-channel transistors may be used as illustrated in FIG. 24A.

Figure 22B:
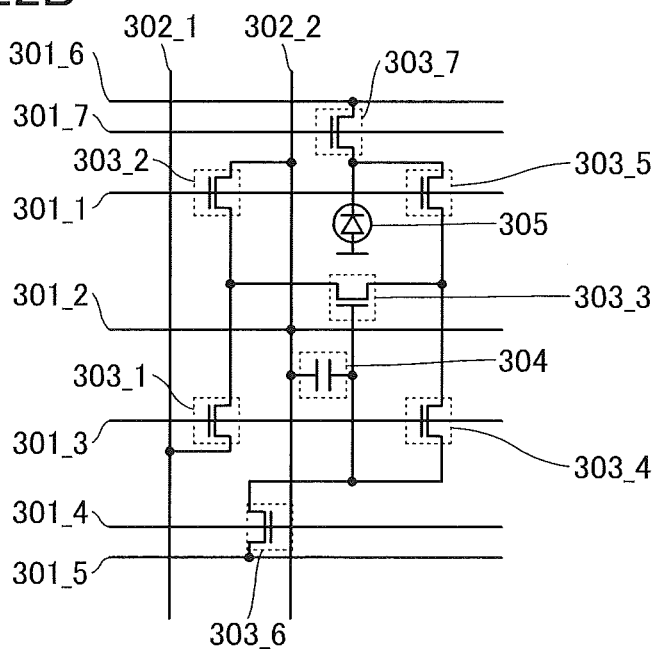
Figure 24B:
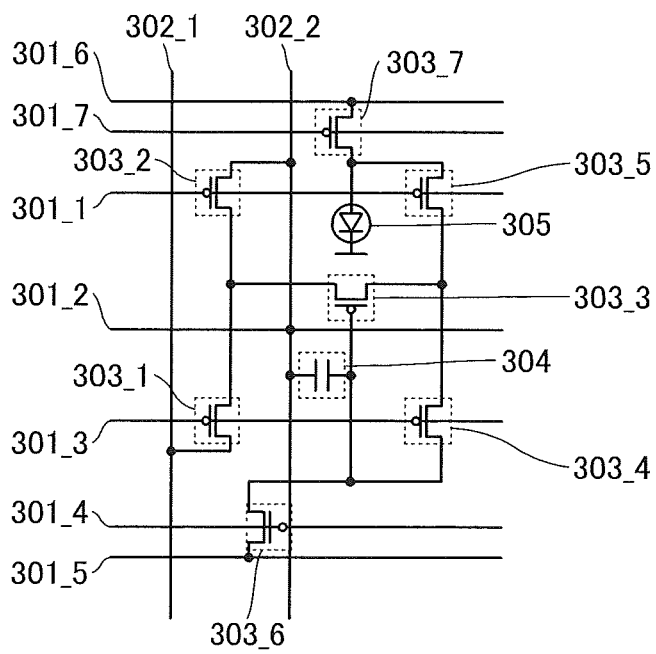

The pixel circuit shown in FIG. 22B has a configuration in which a transistor 303_7 is added to the pixel circuit shown in FIG. 22A. A wiring 301_6 and a wiring 301_7 are electrically connected to the pixel circuit shown in FIG. 22B. Here, the wiring 301_5 and the wiring 301_6 may be electrically connected to each other. As the transistor 3037, an n-channel transistor can be used, for example. Note that a p-channel transistor may be used as illustrated in FIG. 24B.

Figure 23A:
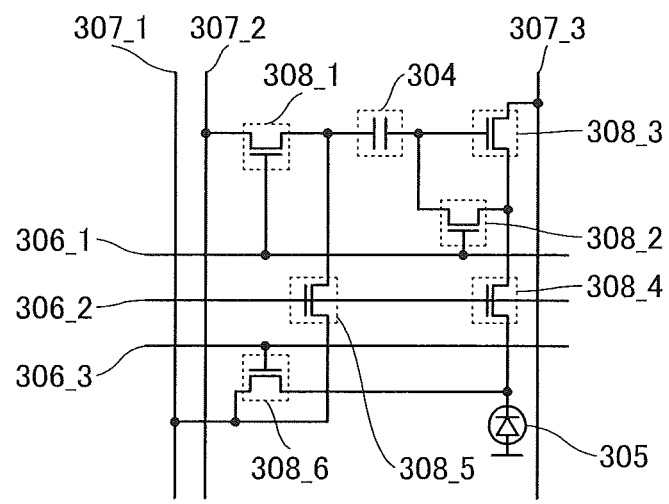
FIGS. 23A and 23B each illustrate an example of a pixel circuit.
Figure 25A:
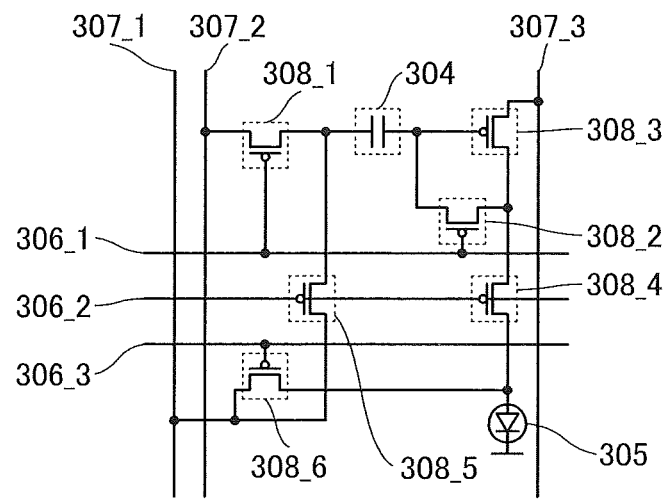
FIGS. 25A and 25B each illustrate an example of a pixel circuit.

The pixel circuit shown in FIG. 23A includes six transistors (transistors 308_1 to 308_6), the capacitor 304, and the light-emitting element 305. Wirings 306_1 to 306_3 and wirings 307_1 to 307_3 are electrically connected to the pixel circuit shown in FIG. 23A. Here, the wiring 306_1 and the wiring 306_3 may be electrically connected to each other. Note that n-channel transistors can be used as the transistors 308_1 to 308_6, for example. Note that p-channel transistors may be used as illustrated in FIG. 25A.

Figure 23B:
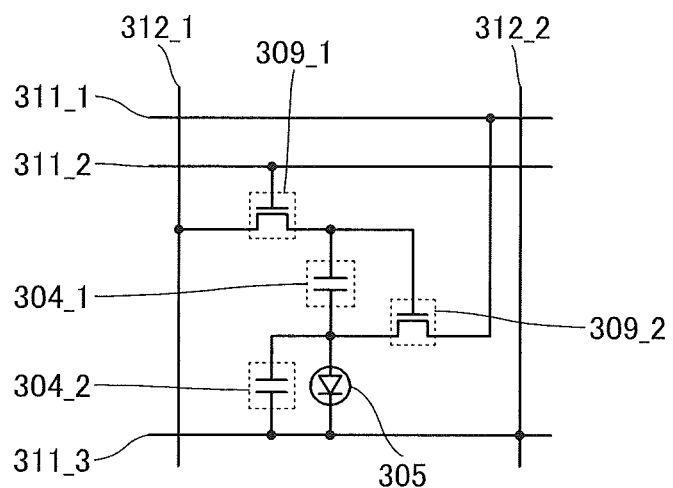
Figure 25B:
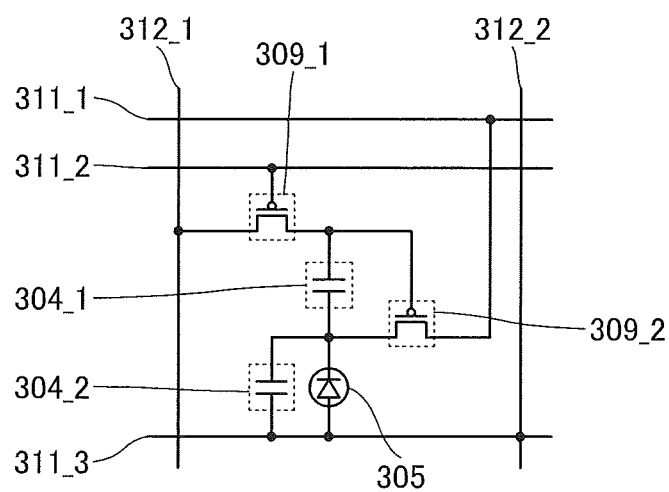

The pixel circuit illustrated in FIG. 23B includes two transistors (transistors 309_1 and 309_2), two capacitors (capacitors 304_1 and 304_2), and the light-emitting element 305. The pixel circuit illustrated in FIG. 23B is electrically connected to wirings 311_1 to 311_3 and wirings 312_1 and 312_2. With the configuration of the pixel circuit illustrated in FIG. 23B, the pixel circuit illustrated in FIG. 23B can be driven by a voltage inputting current driving method (also referred to as CVCC). Note that as the transistors 309_1 and 309_2, for example, n-channel transistors can be used. Note that p-channel transistors may be used as illustrated in FIG. 25B.

This embodiment can be combined as appropriate with any of the other embodiments.

Embodiment 7

In this embodiment, an example of a display element using MEMS which can be used for the display device of one embodiment of the present invention is described with reference to FIG. 26, FIG. 27, FIG. 28, and FIG. 29. The display element using MEMS has high heat resistance and can be favorably used for the display device of one embodiment of the present invention.

Figure 26:
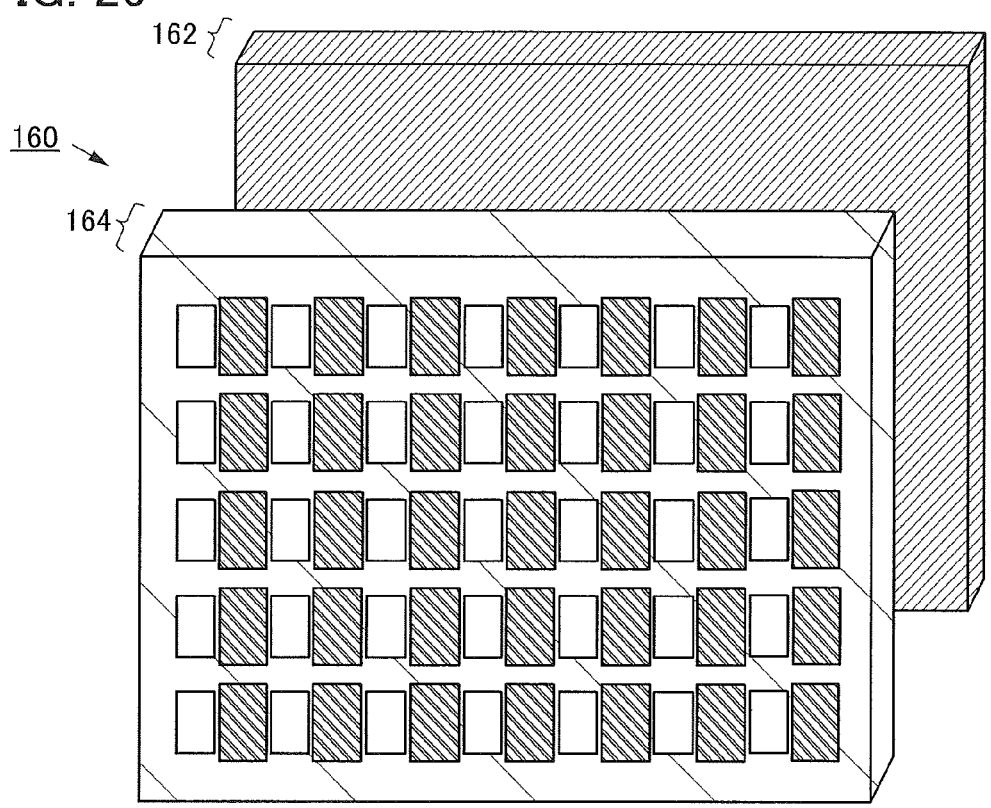
FIG. 26 illustrates an example of a display device.

A display device 160 illustrated in FIG. 26 includes a display portion 162 and a shutter-like light-blocking unit 164.

The shutter-like light-blocking unit 164 allows switching between a light-blocking state and a transmission state. Note that the light-blocking unit 164 may be any unit having a function of switching between the light-blocking state and the transmission state; for example, it may be a shutter including a light-blocking layer having an opening and a movable light-blocking layer capable of blocking light passing through the opening.

Figure 27:
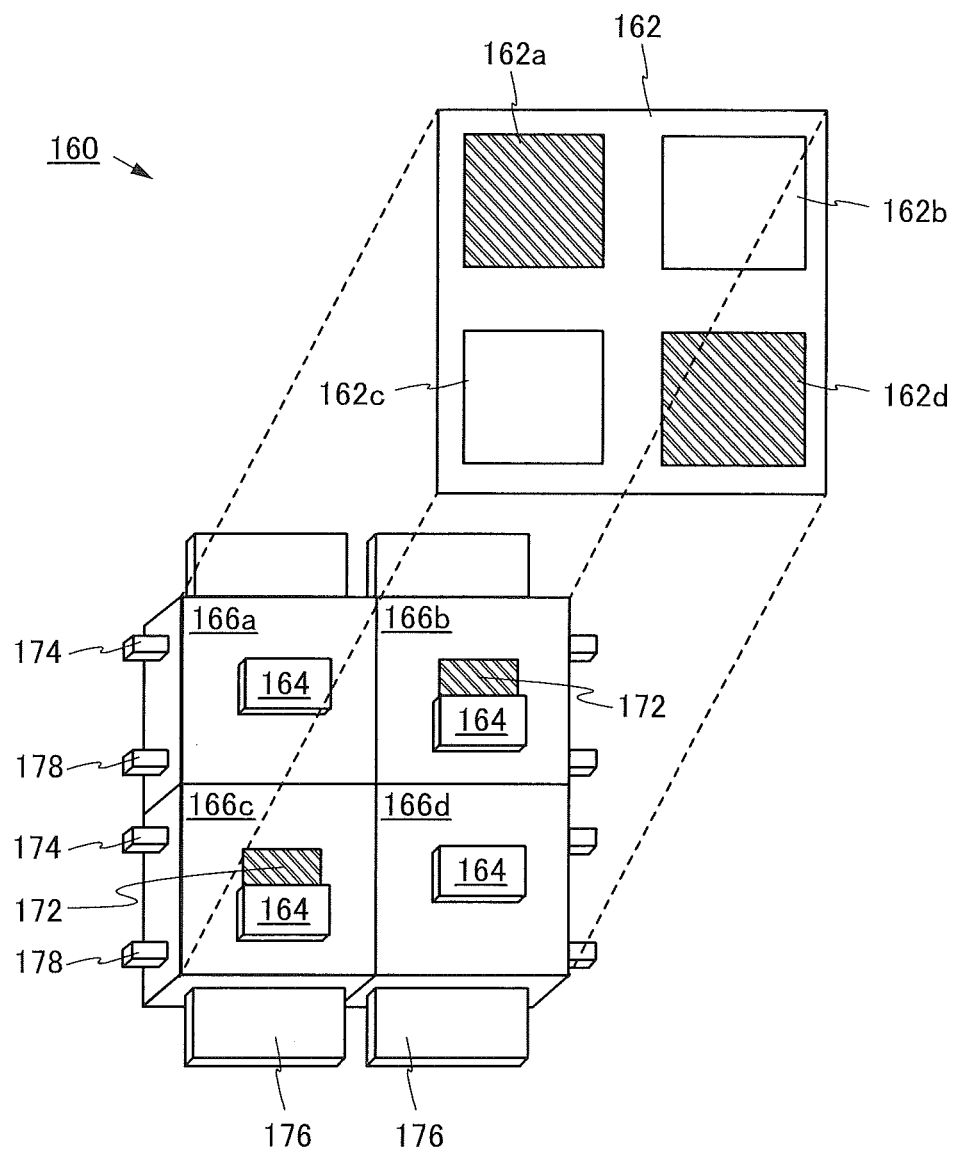
FIG. 27 illustrates an example of a display device.

FIG. 27 is an isometric drawing showing the display device 160 specifically. The display device 160 includes a plurality of supports 166a to 166d (also collectively referred to as a support 166) which are arranged in rows and columns Each support 166 includes the light-blocking unit 164 and an opening 172. The support 166a corresponds to a pixel 162a. Similarly, the supports 166b to 166d correspond to pixels 162b to 162d, respectively. The pixels 162a to 162d constitute the display portion 162. The support 166 itself has light-transmitting properties. When one or more of supports 166 having specific colors corresponding to the respective pixels are selectively brought into a transmission state, pixels capable of color display can be produced in the display device 160.

The display portion 162 may be of a passive matrix type or an active matrix type; in the latter case, drive of elements is controlled by transistors. In either case, wirings electrically connected to pixels need to be provided in a grid pattern. In order to improve aperture ratio, a conductive film used as the wirings in the display portion preferably has a light-transmitting property.

When the display portion 162 is of the active matrix type, a transistor is preferably formed using a light-transmitting material. An oxide semiconductor film is preferably used as a light-transmitting semiconductor film. Examples of the oxide semiconductor film include an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, and a Sn—Zn oxide.

The light-blocking unit 164 is a MEMS shutter using MEMS technology. The light-blocking unit 164 includes a MEMS structure body and a MEMS driving element. The MEMS structure body has a three-dimensional structure and includes a plurality of shutters which are partly movable microstructure bodies.

The MEMS structure body also includes, in addition to the light-blocking layer and the movable light-blocking layer, an actuator for making the movable light-blocking layer slide parallel to the substrate surface, a structure body supporting the movable light-blocking layer, and the like. An example of the structure of the MEMS shutter will be described in detail later.

The MEMS driving element includes a transistor that drives the movable light-blocking layer through the actuator. The transistor used in the MEMS driving element is preferably made of a light-transmitting material and can be formed using a material similar to that of a transistor used in the display portion 162. A conductive film used as a wiring in the MEMS driving element preferably has a light-transmitting property.

Each support 166 is electrically connected to a scan line 174, a signal line 176, and a power source line 178. The light-blocking unit 164 is switched between the light-blocking state and the transmission state depending on potentials supplied from these lines.

Next, an example of the structure of the MEMS shutter that can be used as the light-blocking unit 164 will be described with reference to FIG. 28.

Figure 28:
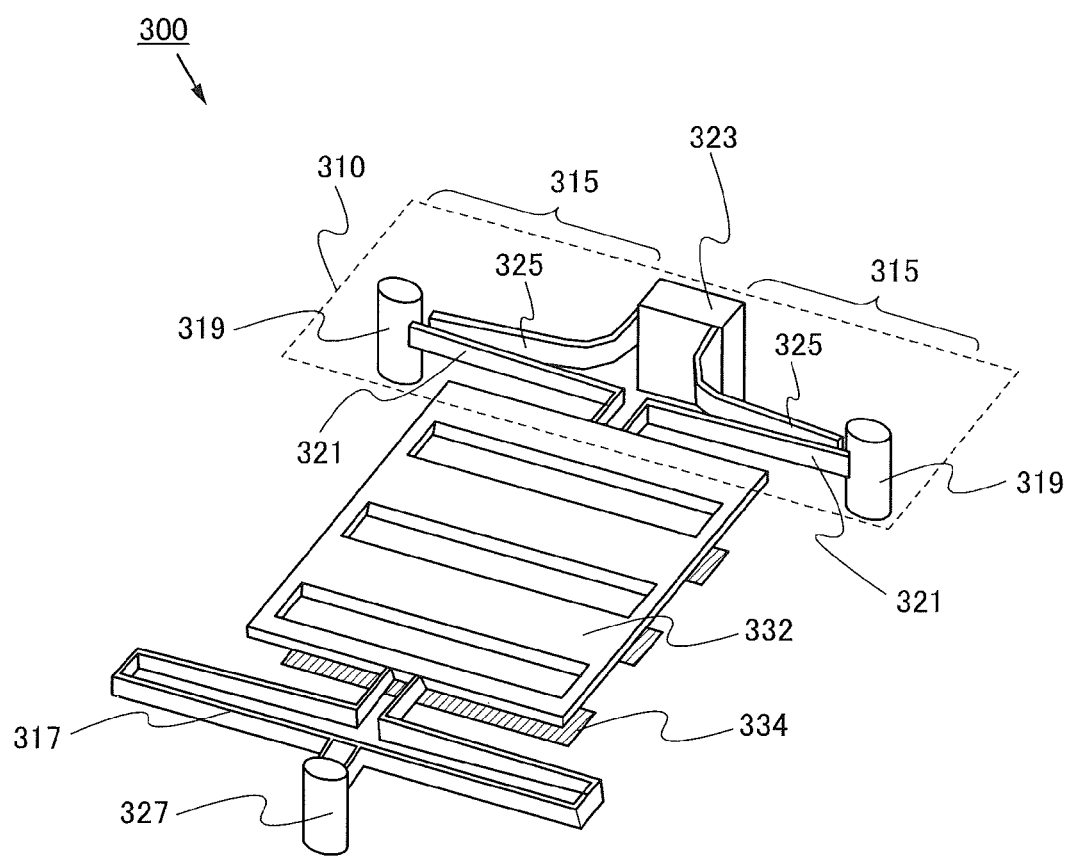
FIG. 28 illustrates an example of a shutter.

FIG. 28 illustrates a shutter 300. The shutter 300 includes a movable light-blocking layer 332 bonded to an actuator 310. The actuator 310 is provided over a light-blocking layer (not illustrated for simplicity) having an opening 334 and includes two flexible actuators 315. A side of the movable light-blocking layer 332 is electrically connected to the actuators 315. The actuators 315 have a function of moving the movable light-blocking layer 332 in the direction of the line connecting a structure body 323 and a structure body 327.

The actuators 315 each include a movable electrode 321 electrically connected to the movable light-blocking layer 332 and a structure body 319, and a movable electrode 325 electrically connected to the structure body 323. The movable electrode 325 is adjacent to the movable electrode 321. One end of the movable electrode 325 is electrically connected to the structure body 323, and the other end thereof can be freely moved. The other end of the movable electrode 325 that can be moved freely is curved so as to be closest to the movable electrode 321 at a connection portion of the movable electrode 321 and the structure body 319.

The other side of the movable light-blocking layer 332 is connected to a spring 317 which returns to its original shape after force is applied by the actuator 310. The spring 317 is connected to the structure body 327.

The structure bodies 319, the structure body 323, and the structure body 327 function as mechanical supports to make the movable light-blocking layer 332, the actuators 315, and the spring 317 float in the vicinity of the surface of the light-blocking layer having the opening 334.

Under the movable light-blocking layer 332, the opening 334 surrounded by the light-blocking layer is provided. Note that the shapes of the movable light-blocking layer 332 and the opening 334 are not limited to these.

The structure body 323 included in the shutter 300 is electrically connected to a transistor (not illustrated). The transistor drives the movable light-blocking layer. Thus, a given voltage can be applied from the transistor to the movable electrode 325 connected to the structure body 323. The structure bodies 319 and 327 are each connected to a ground electrode (GND). Accordingly, the movable electrode 321 connected to the structure body 319 and the spring 317 connected to the structure body 327 each have a potential of GND. Note that the structure bodies 319 and 327 may be electrically connected to a common electrode which can apply a given voltage. The structure bodies 319 and 327 may be replaced with another actuator 310 so that the shutter includes the two actuators 310.

When voltage is applied to the movable electrode 325, the movable electrode 325 and the movable electrode 321 are electrically attracted to each other by a potential difference therebetween. As a result, the movable light-blocking layer 332 connected to the movable electrode 321 is drawn toward the structure body 323 to move to the structure body 323. Because the movable electrode 321 functions as a spring, when the potential difference between the movable electrodes 321 and 325 is eliminated, the movable electrode 321 releases the stress accumulated therein so that the movable light-blocking layer 332 returns to its original position. In a state where the movable electrode 321 is drawn to the movable electrode 325, the movable light-blocking layer 332 may block the opening 334 or may be positioned so as not to overlap with the opening 334.

A method for manufacturing the shutter 300 will be described below. A sacrificial layer with a predetermined shape is formed by a photolithography process over the light-blocking layer having the opening 334. The sacrificial layer can be formed using, for example, an organic resin such as polyimide or acrylic, or an inorganic insulating film such as silicon oxide, silicon nitride, silicon oxynitride, or silicon nitride oxide.

Next, a film of a light-blocking material is formed over the sacrificial layer by a printing method, a sputtering method, an evaporation method, or the like and then is selectively etched, whereby the shutter 300 is formed. Examples of the light-blocking material include a metal such as chromium, molybdenum, nickel, titanium, copper, tungsten, tantalum, neodymium, or aluminum, or a semiconductor such as silicon, and an alloy or an oxide thereof. Alternatively, the shutter 300 is formed by an inkjet method. The shutter 300 is preferably formed to a thickness of 100 nm to 5 μm.

Then, the sacrificial layer is removed, whereby the shutter 300 which can be moved in a space can be formed. After that, a surface of the shutter 300 is preferably oxidized by oxygen plasma, thermal oxidation, or the like so that an oxide film is formed. Alternatively, an insulating film of alumina, silicon oxide, silicon nitride, silicon oxynitride, silicon nitride oxide, DLC (diamond-like carbon), or the like is preferably formed on a surface of the shutter 300 by an atomic layer evaporation method or a CVD method. Formation of the insulating film on the shutter 300 can slow down the deterioration of the shutter 300 over time.

Next, a control circuit 250 including the light-blocking unit will be described with reference to FIG. 29.

Figure 29:
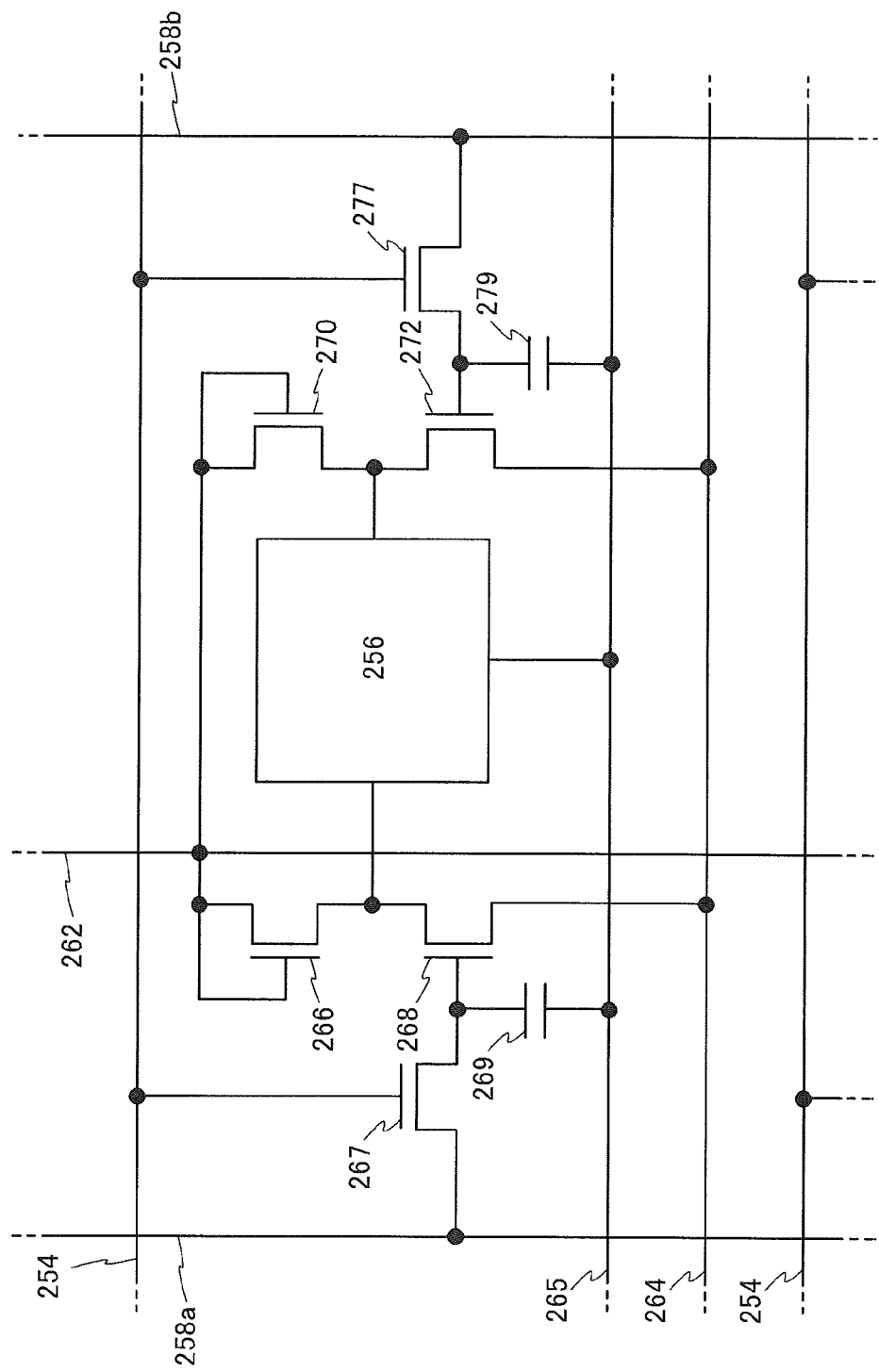
FIG. 29 illustrates an example of a control circuit.

FIG. 29 is a schematic view of the control circuit 250 in the display device. The control circuit 250 controls the array of pixels in each support 256 which includes a shutter provided with an actuator for making a light-blocking unit in a light-blocking state and an actuator for making the light-blocking unit in a transmission state. The pixels in the array each have a substantially square shape and the pitch, or the distance between the pixels, is 180 μm to 250 μm.

In the control circuit 250, a scan line 254 is provided for the pixels in each row, and a first signal line 258a and a second signal line 258b are provided for the pixels in each column. The first signal line 258a supplies a signal for making the light-blocking unit in the transmission state, whereas the second signal line 258b supplies a signal for making the light-blocking unit in the light-blocking state. The control circuit 250 also includes a charge line 262, an operation line 264, and a common power source line 265. The charge line 262, the operation line 264, and the common power source line 265 are shared between the pixels in rows and columns of the array.

The support 256 including each of the pixels is electrically connected to a transistor 266 charged to make the light-blocking unit in the transmission state, and a transistor 268 discharged to make the light-blocking unit in the transmission state. The transistor 268 is electrically connected to a transistor 267 to which data is written so that the light-blocking unit is brought into the transmission state, and a capacitor 269. The transistors 266 and 268 are electrically connected to the actuator for making the light-blocking unit in the transmission state.

The support 256 including each of the pixels is also electrically connected to a transistor 270 charged to make the light-blocking unit in the transmission state, and a transistor 272 discharged to make the light-blocking unit in the transmission state. The transistor 272 is electrically connected to a transistor 277 to which data is written so that the light-blocking unit is brought into the transmission state, and a capacitor 279. The transistors 270 and 272 are electrically connected to the actuator for making the light-blocking unit in the transmission state.

The transistors 266, 268, 270, and 272 include a material other than an oxide semiconductor material in a channel region, and therefore can operate at sufficiently high speed.

The transistors 267 and 277 include a highly purified oxide semiconductor in a channel region. When a transistor including a highly purified oxide semiconductor in a channel region is turned off, data can be retained in a floating node (e.g., a node at which the transistors 267 and 268 and the capacitor 269 are connected, or a node at which the transistors 272 and 277 and the capacitor 279 are connected). In addition, the transistor including a highly purified oxide semiconductor has an extremely low off-state current, which eliminates the need for a refresh operation or significantly reduces the frequency of the refresh operation, resulting in a sufficiently low power consumption.

A conductive film is formed on the same surface as an oxide semiconductor film of the transistors 267 and 277 and used as one electrode of each of the capacitors 269 and 279. There is a small step on the capacitors formed using such a conductive film, leading to easy integration and miniaturization of the display device. For example, part of a light-blocking unit or a transistor can be overlapped with the capacitor, thereby obtaining a miniaturized display device occupying a small area.

In the control circuit 250, voltage is applied to the charge line 262 first. Then, the transistors 266 and 270 are turned on because the charge line 262 is connected to a gate and a drain of each of the transistors 266 and 270. The minimum voltage needed to operate the shutter of the support 256 (e.g., 15 V) is applied to the charge line 262. The charge line 262 is set to 0 V after charge of the actuator for making the light-blocking unit in the light-blocking state and the actuator for making the light-blocking unit in the transmission state, whereby the transistors 266 and 270 are turned off. The charge in the two actuators is stored.

When a writing voltage $V_w$ is supplied to the scan line 254, data is sequentially written to the pixels in each row. During a period in which data is written to the pixels in a certain row, the control circuit 250 applies a data voltage to one of the first signal line 258a and the second signal line 258b corresponding to each column of the pixels. When the voltage $V_w$ is applied to the scan line 254 to which data is to be written, the transistors 267 and 277 in the corresponding row are turned on. When the transistors 267 and 277 are turned on, charge supplied from the first signal line 258a and the second signal line 258b is stored in the capacitors 269 and 279, respectively.

In the control circuit 250, the operation line 264 is connected to a source of each of the transistors 268 and 272. When the potential of the operation line 264 is much higher than that of the common power source line 265, the transistors 268 and 272 are not turned off regardless of the charge stored in the capacitors 269 and 279. In the control circuit 250, the transistors 268 and 272 are turned on/off depending on the charge of the data stored in the capacitor 269 or 279 when the potential of the operation line 264 is lower than or equal to that of the common power source line 265.

In the case where the transistor 268 or 272 is turned on, the charge of the actuator for making the light-blocking unit in the light-blocking state or the charge of the actuator for making the light-blocking unit in the transmission state flows through the transistor 268 or 272. For example, when only the transistor 268 is turned on, the charge of the actuator for making the light-blocking unit in the transmission state flows to the operation line 264 through the transistor 268. This causes a potential difference between the shutter of the support 256 and the actuator for making the light-blocking unit in the transmission state, so that the shutter is electrically attracted to the actuator and the transmission state is obtained.

This embodiment can be combined as appropriate with any of the other embodiments.

Example

In this example, the light-emitting device of one embodiment of the present invention was fabricated and operated in ice-called water (approximately 0° C.) or boiling water (approximately 100° C.).

FIGS. 2A and 2B illustrate a sealed object of the light-emitting device fabricated in this example.

In this example, an organic EL element was fabricated as a light-emitting element included in the light-emitting panel 10. A laminated secondary battery (also referred to as a thin secondary battery) was used as the secondary battery 20. In the circuit board 55, elements included in the switch 51, the circuit 30, and the circuit 50 were provided. A magnetic switch was used as the switch 51.

<Fabrication of Light-Emitting Panel>

In this example, four light-emitting panels including blue, green, orange, and red light-emitting elements were fabricated. A method for fabricating the light-emitting panels is described with reference to FIGS. 5A to 5D and FIG. 30. In this example, to operate the light-emitting panel at high temperature, the light-emitting element was fabricated with a material whose glass transition temperature was higher than or equal to a temperature at which the panel operated.

First, the insulating layer 903 was formed over the substrate 901. A glass substrate was used as the substrate 901. As the insulating layer 903, a silicon oxynitride film with a thickness of 200 nm was formed by a CVD method.

Next, the conductive layer 911, the conductive layer 912, and the auxiliary electrode 921 were formed over the insulating layer 903. As the conductive layer 911, the conductive layer 912, and the auxiliary electrode 921, a stacked structure of a 50-nm-thick titanium film, a 1200-nm-thick aluminum film, and a 50-nm-thick titanium film was formed by a sputtering method.

Next, the lower electrode 931 functioning as an anode was formed. As the lower electrode 931, an indium tin oxide film containing silicon (ITSO film) was formed by a sputtering method. Note that the thickness of the lower electrode 931 was 110 nm.

Next, in order to form a 1000-nm-thick insulating layer 925, photosensitive polyimide was applied, exposed to light, developed, and baked. This was followed by heat treatment in a nitrogen atmosphere at 300° C. for 1 hour.

Next, as pretreatment for forming the light-emitting element over the substrate 901, UV ozone treatment was performed for 370 seconds after washing of a surface of the substrate 901 with water and baking that was performed at 200° C. for 1 hour.

After that, the substrate 901 was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate 901 was cooled down for about 30 minutes.

Figure 30:
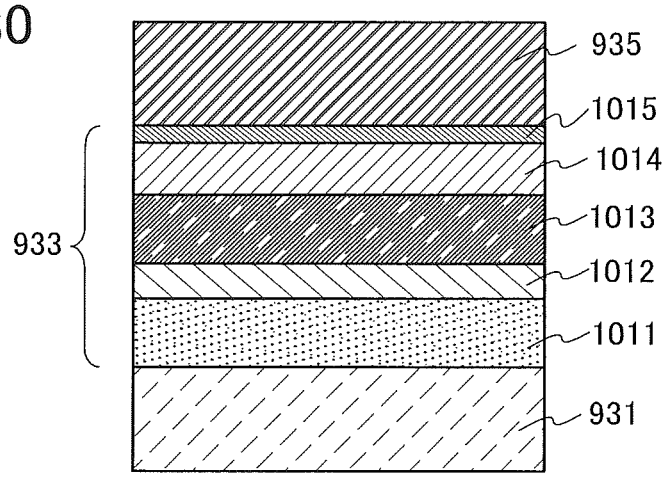
FIG. 30 illustrates a light-emitting element in Example.

Next, the EL layer 933 was formed over the lower electrode 931. Chemical formulae of materials used for the EL layer 933 are shown below. FIG. 30 illustrates a structure of the EL layer 933.

[Chemical Formula 1]
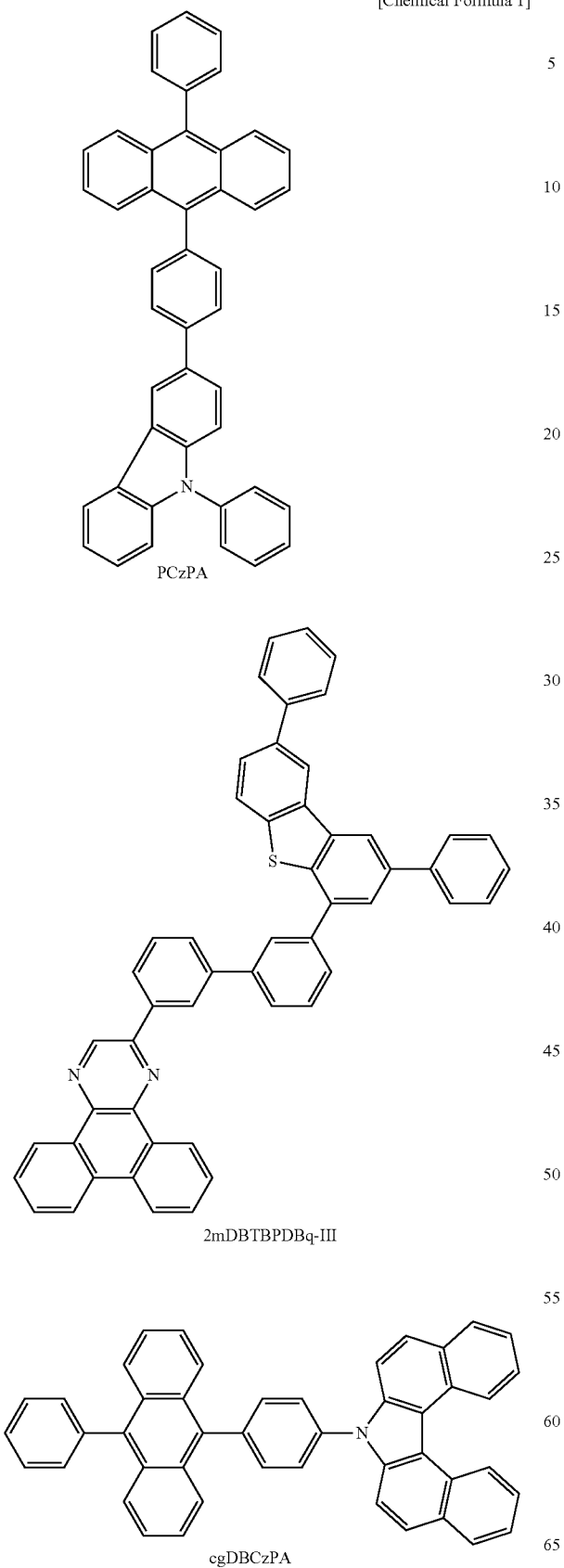
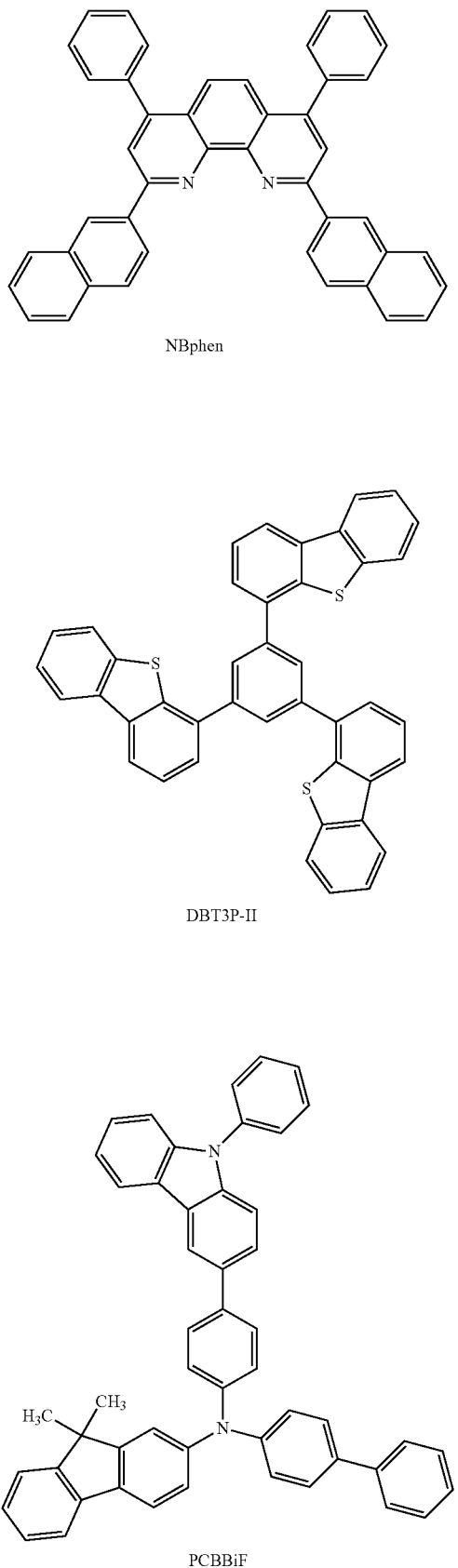

-continued

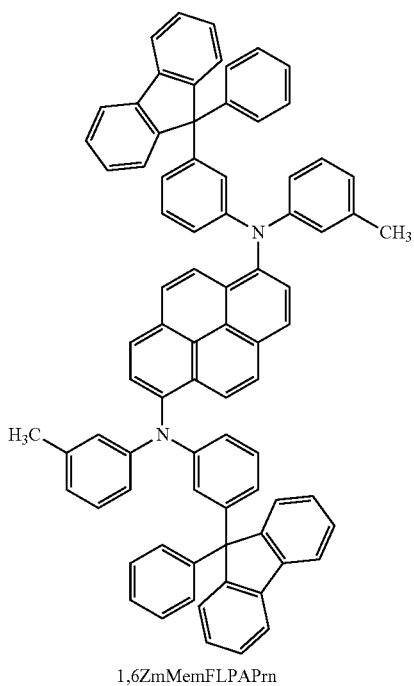

1,6ZmMemFLPAPrn

[Chemical Formula 2]

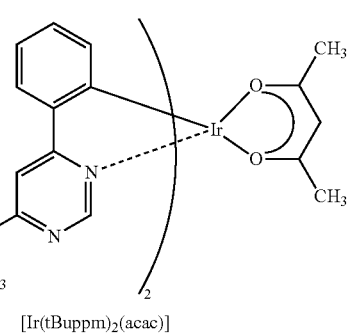

[Ir(tBuppm)₂(acac)]

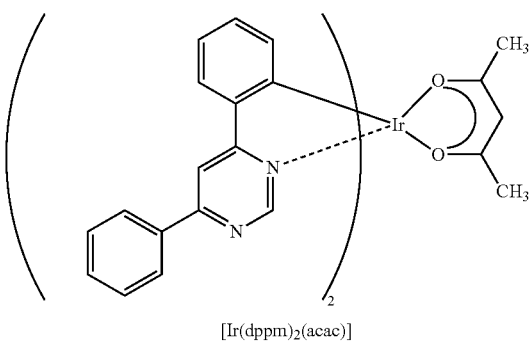

[Ir(dppm)₂(acac)]

-continued

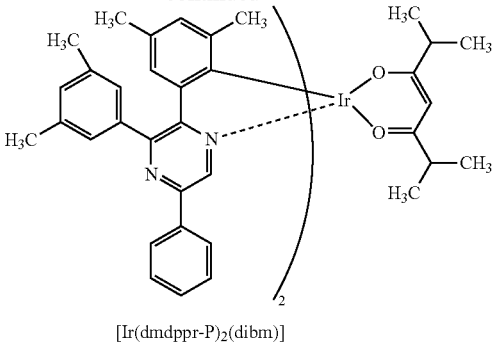

[Ir(dmdppr-P)₂(dibm)]

A method for forming the EL layer 933 is described. First, the substrate 901 provided with the lower electrode 931 was fixed to a substrate holder provided in a vacuum evaporation apparatus so that a side of the substrate 901 where the lower electrode 931 was provided faced downward, and then the pressure was reduced to approximately $10^{-4}$ Pa, so that a hole-injection layer 1011 was formed over the lower electrode 931.

The hole-injection layer 1011 of the blue light-emitting element was formed by co-evaporation of 9-phenyl-3-[4-(10-phenyl-9-anthryl)phenyl]-9H-carbazole (abbreviation: PCzPA) and molybdenum(VI) oxide. The weight ratio of PCzPA to molybdenum oxide was adjusted to 2:1 (=PCzPA: molybdenum oxide). The hole-injection layer 1011 had a thickness of 50 nm. Note that the co-evaporation method refers to an evaporation method in which evaporation is carried out from a plurality of evaporation sources at the same time in one treatment chamber.

The hole-injection layers 1011 of the green, orange, and red light-emitting elements were formed by co-evaporation of 4,4',4''-(1,3,5-benzenetriyl)tri(dibenzothiophene) (abbreviation: DBT3P-II) and molybdenum(VI) oxide. The weight ratio of DBT3P-II to molybdenum oxide was adjusted to 2:1 (=DBT3P-II:molybdenum oxide). The hole-injection layer 1011 of the green light-emitting element had a thickness of 10 nm, and that of each of the orange and red light-emitting elements had a thickness of 20 nm.

Then, a hole-transport layer 1012 was formed over the hole-injection layer 1011.

The hole-transport layer 1012 of the blue light-emitting element was formed by evaporation of PCzPA to a thickness of 10 nm. The glass transition temperature of PCzPA is 132° C.

The hole-transport layer 1012 of each of the green, orange, and red light-emitting elements was formed by evaporation of N-(1,1'-biphenyl-4-yl)-N-[4-(9-phenyl-9H-carbazol-3-yl)phenyl]-9,9-dimethyl-9H-fluor en-2-amine (abbreviation: PCBBiF). The hole-transport layer 1012 of the green light-emitting element had a thickness of 10 nm and the hole-transport layer 1012 of each of the orange and red light-emitting elements had a thickness of 20 nm. The glass transition temperature of PCBBiF is 166° C.

Next, the light-emitting layer 1013 was formed over the hole-transport layer 1012.

The light-emitting layer 1013 of the blue light-emitting element was formed by co-evaporation of 7-[4-(10-phenyl-9-anthryl)phenyl]-7H-dibenzo[c,g]carbazole (abbreviation: cgDBCzPA) and N,N-bis(3-methylphenyl)-N,N'-bis[3-(9-phenyl-9H-fluoren-9-yl)phenyl]pyrene-1,6-diamine (abbreviation: 1,6mMemFLPAPrn). The thickness of the light-emitting layer 1013 was 25 nm. The weight ratio of cgDBCzPA to 1,6mMemFLPAPrn was adjusted to 1:0.03 (=cgDBCzPA:1,6mMemFLPAPrn). The glass transition temperature of cgDBCzPA is 155° C.

The light-emitting layer 1013 of the green light-emitting element was formed by co-evaporation of 2-{3-[3-(2,8-diphenyldibenzothiophen-4-yl)phenyl]phenyl}dibenzo[f,h]quinoxaline (abbreviation: 2mDBTBPDBq-III), PCBBiF, and (acetylacetonato)bis(6-tert-butyl-4-phenylpyrimidinato)iridium(III) (abbreviation: [Ir(tBuppm)$_2$(acac)]). Here, a 20-nm-thick layer which was formed with the weight ratio of 2mDBTBPDBq-III, PCBBiF, and [Ir(tBuppm)$_2$(acac)] adjusted to 0.7:0.3:0.05 (=2mDBTBPDBq-III:PCBBiF:[Ir(tBuppm)$_2$(acac)]) and a 20-nm-thick layer which was formed with the weight ratio adjusted to 0.8:0.2:0.05 (=2mDBTBPDBq-III: PCBBiF:[Ir(tBuppm)$_2$(acac)]) were stacked. The glass transition temperature of 2mDBTBPDBq-III is 150° C.

The light-emitting layer 1013 of the orange light-emitting element was formed by co-evaporation of 2mDBTBPDBq-III, PCBBiF, and (acetylacetonato)bis(4,6-diphenylpyrimidinato)iridium(III) (abbreviation: [Ir(dppm)$_2$(acac)]). Here, a 20-nm-thick layer which was formed with the weight ratio of 2mDBTBPDBq-III, PCBBiF, and [Ir(dppm)$_2$(acac)] adjusted to 0.7:0.3:0.05 (=2mDBTBPDBq-III:PCBBiF:[Ir(dppm)$_2$(acac)]) and a 20-nm-thick layer which was forming with the weight ratio adjusted to 0.8:0.2:0.05 (=2mDBTBPDBq-III:PCBBiF:[Ir(dppm)$_2$(acac)]) were stacked.

The light-emitting layer 1013 of the red light-emitting element was formed by co-evaporation of 2mDBTBPDBq-III, PCBBiF, and bis{4,6-dimethyl-2-[3-(3,5-dimethylphenyl)-5-phenyl-2-pyrazinyl-κN]phenyl-κC}(2,6-dimethyl-3,5-heptanedionate-κ$^2$O,O')iridium(III) (abbreviation: [Ir(dmdppr-P)$_2$(dibm)]. Here, a 20-nm-thick layer which was formed with the weight ratio of 2mDBTBPDBq-III, PCBBiF, and [Ir(dmdppr-P)$_2$(dibm)] adjusted to 0.7:0.3:0.05 (=2mDBTBPDBq-III:PCBBiF:[Ir(dmdppr-P)$_2$(dibm)]) and a 20-nm-thick layer which was formed with the weight ratio adjusted to 0.8:0.2:0.05 (=2mDBTBPDBq-III:PCBBiF:[Ir(dmdppr-P)$_2$(dibm)]) were stacked.

Next, an electron-transport layer 1014 was formed over the light-emitting layer 1013.

The electron-transport layer 1014 of the blue light-emitting element was formed by evaporation of cgDBCzPA to a thickness of 10 nm and further evaporation of 2,9-di(2-naphthyl)-4,7-diphenyl-1,10-phenanthroline (abbreviation: NBPphen) to a thickness of 15 nm. The glass transition temperature of NBPhen is 165° C.

The electron-transport layer 1014 of each of the green, orange, and red light-emitting elements was formed to a thickness of 10 nm by evaporation of 2mDBTBPDBq-III and further evaporation of NBPhen. The thickness of 2mDBTBPDBq-III of the green light-emitting element was 10 nm, and the thickness of 2mDBTBPDBq-III of each of the orange and red light-emitting elements was 20 nm.

Next, the electron-injection layer 1015 was formed over the electron-transport layer 1014 by evaporation of lithium fluoride (LiF) to a thickness of 0.1 nm.

Lastly, aluminum was evaporated to a thickness of 200 nm as the upper electrode 935 functioning as a cathode. Thus, the light-emitting element of this example was fabricated.

Note that in all the above evaporation steps, evaporation was performed by a resistance-heating method.

An element structure of the light-emitting element obtained as described above is shown in Table 1.

TABLE 1

| | Lower electrode | Hole-injection layer\Hole-transport layer\Light-emitting layer\Electron-transport layer | Electron-injection layer | Upper electrode |
|---|---|---|---|---|
| Light-emitting element | ITSO 110 nm | see below | LiF 1 nm | Al 200 nm |

| | Hole-injection layer | Hole-transport layer | Light-emitting layer | | Electron-transport layer | |
|---|---|---|---|---|---|---|
| Blue | PCzPA:MoOx (=2:1) 50 nm | PCzPA 10 nm | cgDBCzPA:1,6mMemFLPAPrn (=1:0.03) 25 nm | | cgDBCzPA 10 nm | NBPhen 15 nm |
| Green | DBT3P-II:MoOx (=2:1) 10 nm | PCBBiF 10 nm | 2mDBTBPDBq-III:PCBBiF:[Ir(tBuppm)$_2$(acac)] (=0.7:0.3:0.05) 20 nm | (=0.8:0.2:0.05) 20 nm | 2mDBTBPDBq-III 10 nm | NBPhen 10 nm |
| Orange | DBT3P-II:MoOx (=2:1) 20 nm | PCBBiF 20 nm | 2mDBTBPDBq-III:PCBBiF:[Ir(dppm)$_2$(acac)] (=0.7:0.3:0.05) 20 nm | (=0.8:0.2:0.05) 20 nm | 2mDBTBPDBq-III 20 nm | NBPhen 10 nm |
| Red | DBT3P-II:MoOx (=2:1) 20 nm | PCBBiF 20 nm | 2mDBTBPDBq-III:PCBBiF:[Ir(dmdppr-P)$_2$(dibm)] (=0.7:0.3:0.05) 20 nm | (=0.8:0.2:0.05) 20 nm | 2mDBTBPDBq-III 20 nm | NBPhen 10 nm |

Next, the substrate 901 and a glass substrate serving as the substrate 991 were bonded to each other using an ultraviolet curable epoxy resin as the adhesive layer 927 in a nitrogen atmosphere. Note that the drying agent 913 was placed in the space 929 surrounded by the substrate 901, the substrate 991, and the adhesive layer 927. The adhesive layer 927 was irradiated with ultraviolet light in a state where light emitted from a light-emitting region was blocked, so that the resin was cured. After that, heat treatment was performed in an air atmosphere at 80° C. for 1 hour.

Through the above steps, the light-emitting panels were fabricated. The light-emitting region of the light-emitting panel fabricated in this example was 36 mm×40 mm. The light-emitting region includes a portion where the auxiliary electrode 921 was formed.

Characteristics of the light-emitting panels are shown in Table 2.

TABLE 2

|  | Voltage (V) | Chromaticity x | Chromaticity y | Luminance (cd/m$^2$) | Current efficiency (cd/A) |
| --- | --- | --- | --- | --- | --- |
| Blue | 2.8 | 0.15 | 0.20 | 120 | 8.3 |
| Green | 2.8 | 0.38 | 0.61 | 1400 | 97 |
| Orange | 2.8 | 0.55 | 0.48 | 1300 | 90 |
| Red | 2.8 | 0.68 | 0.31 | 300 | 21 |

<Fabrication of Secondary Battery>

Figure 31A:
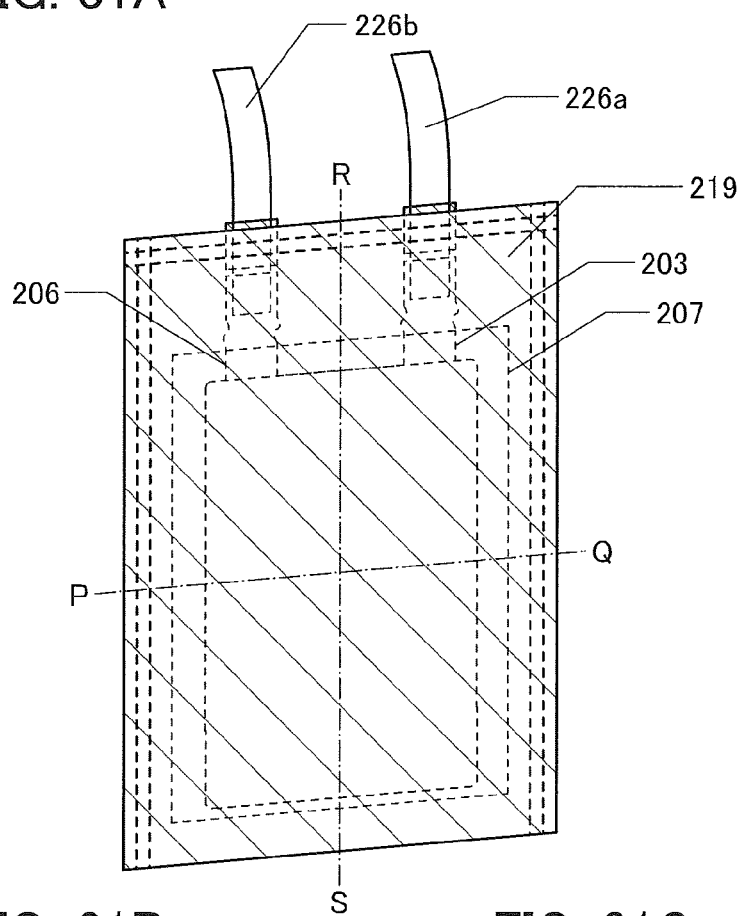
FIGS. 31A to 31C illustrate a secondary battery in Example.

FIG. 31A illustrates the thin secondary battery fabricated in this example.

The secondary battery of this example includes the positive electrode 203, the negative electrode 206, the separator 207, an exterior body 219, a positive electrode lead electrode 226a, and a negative electrode lead electrode 226b.

Figure 31B:
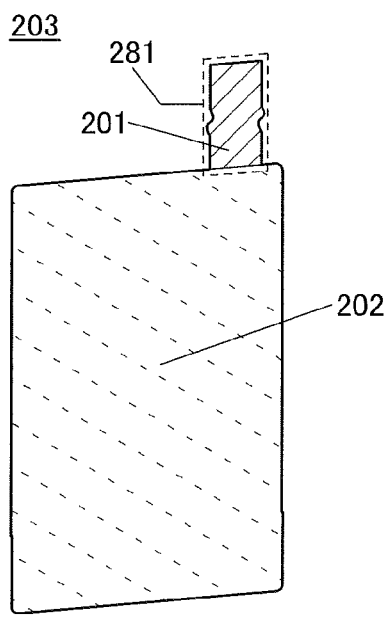

FIG. 31B illustrates the appearance of the positive electrode 203. The positive electrode 203 includes the positive electrode current collector 201, the positive electrode active material layer 202, and a tab region 281. The tab region 281 is welded to the positive electrode lead electrode 226a in a region where the positive electrode current collector 201 is exposed. In this example, the positive electrode 203 including the positive electrode active material layer 202 on one surface of the positive electrode current collector 201 and the positive electrode 203 including the positive electrode active material layer 202 on both surfaces of the positive electrode current collector 201 were used.

Figure 31C:
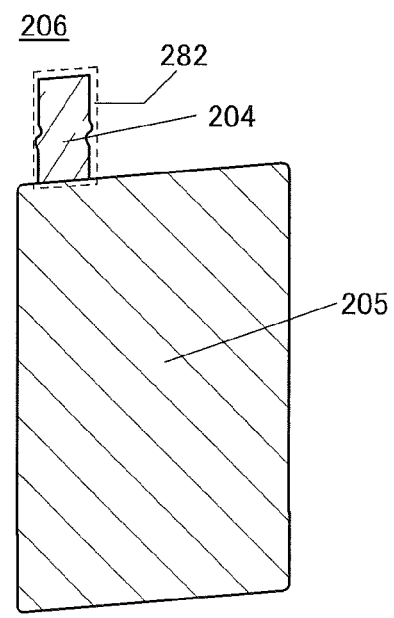

FIG. 31C illustrates the appearance of the negative electrode 206. The negative electrode 206 includes the negative electrode current collector 204, the negative electrode active material layer 205, and a tab region 282. The tab region 282 is welded to the negative electrode lead electrode 226b in a region where the negative electrode current collector 204 is exposed. In this example, the negative electrode 206 including the negative electrode active material layer 205 on both surfaces of the negative electrode current collector 204 was used.

Figure 32:
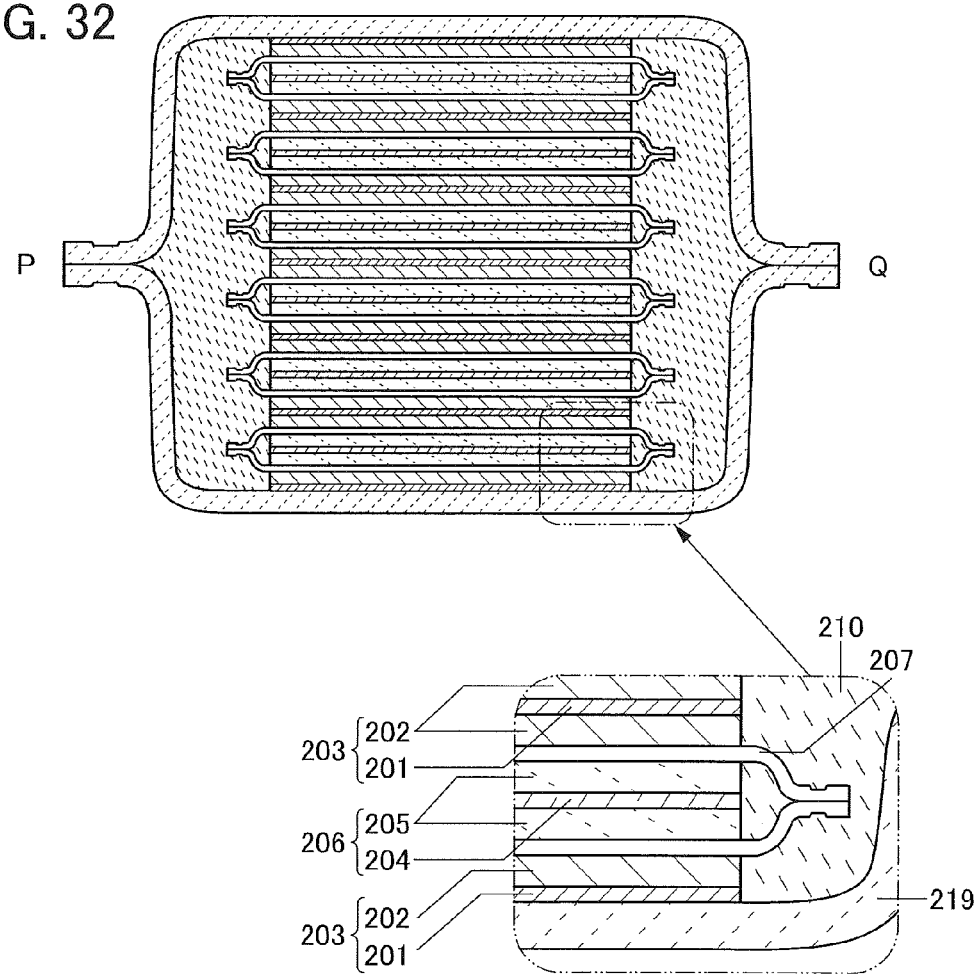
FIG. 32 illustrates a secondary battery in Example.
Figure 33:
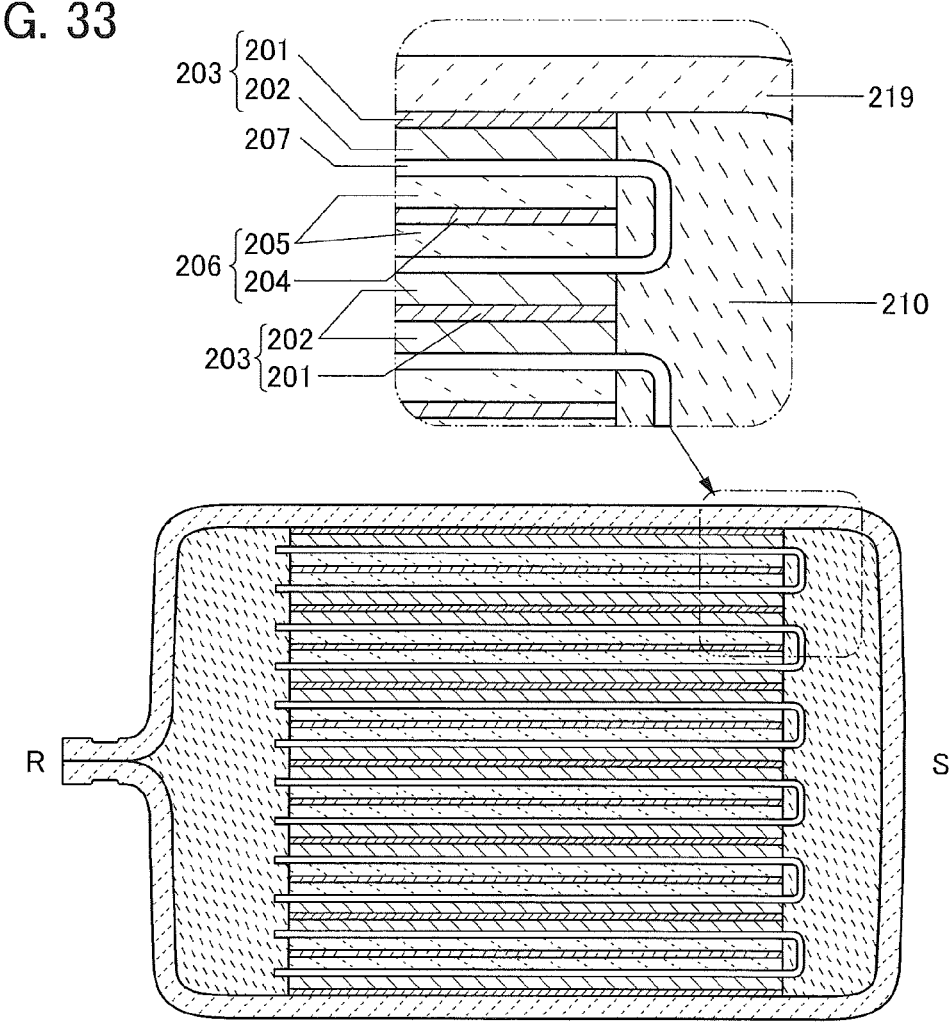
FIG. 33 illustrates a secondary battery in Example.

FIG. 32 is a cross-sectional view taken along dashed-dotted line P-Q in FIG. 31A. FIG. 33 is a cross-sectional view taken along dashed-dotted line R-S in FIG. 31A.

For the secondary battery of this example, two positive electrodes 203 each including the positive electrode active material layer 202 on one surface of the positive electrode current collector 201, five positive electrodes 203 each including the positive electrode active material layer 202 on both surfaces of the positive electrode current collector 201, and six negative electrodes 206 each including the negative electrode active material layer 205 on both surfaces of the negative electrode current collector 204 were used. A surface of the positive electrode 203 which is on the negative electrode 206 side and a surface of the negative electrode 206 which is on the positive electrode 203 side had substantially the same area.

The separator 207 was double-folded to sandwich the negative electrode 206. An end of the separator 207 was positioned on an outer side than ends of the positive electrode 203 and the negative electrode 206.

A region surrounded by the exterior body 219 was filled with the electrolytic solution 210.

A method for fabricating the secondary battery of this example is described below.

First, fabrication of the positive electrode and the negative electrode is described.

The compounding ratio and fabricating conditions of the negative electrode active material layer are described.

Spherical natural graphite having a specific surface area of 6.3 m$^2$/g and a particle size of 15 μm was used as an active material. As binders, sodium carboxymethyl cellulose (CMC-Na) and styrene-butadiene rubber (SBR) were used. The polymerization degree of CMC-Na that was used was 600 to 800, and the viscosity of a 1% CMC-Na aqueous solution was in the range from 300 mPa·s to 500 mPa·s. The compounding ratio of a slurry for fabricating the electrode was as follows: graphite:CMC-Na:SBR=97:1.5:1.5 (wt %).

Next, a method for fainting a paste for the negative electrode is described.

First, the active material was weighed and CMC-Na powder was added thereto, so that a first mixture was obtained.

Next, water was added to the first mixture and kneading was performed with a mixer, so that a second mixture was obtained. The weight of water added here was 38% of the total weight of the mixture. Here, "kneading" means "mixing something with a high viscosity".

Next, an SBR aqueous dispersion liquid was added to the second mixture, water was further added, and mixing was performed with a mixer, so that a third mixture was obtained.

Pure water serving as a dispersion medium was then added to the third mixture until a predetermined viscosity was obtained, and mixing was performed with a mixer, so that a fourth mixture was obtained.

Next, degasification was performed in a reduced-pressure atmosphere. Specifically, the pressure in the mixer containing the fourth mixture was reduced and degasification was performed. The pressure was adjusted so that a pressure difference from the atmospheric pressure was 0.096 MN or less. Through the above steps, the paste was formed.

Subsequently, the paste was applied to the negative electrode current collector with the use of a continuous coating device. An 18 μm-thick rolled copper foil was used as the negative electrode current collector. The coating speed was set to 0.75 m/min.

Next, the negative electrode current collector to which the paste was applied was moved to a drying furnace, and the solvent was vaporized. Drying was performed in an air atmosphere at 50° C. for 120 seconds, in an air atmosphere at 80° C. for 120 seconds, and then, in a reduced-pressure atmosphere at 100° C. for 10 hours. Through the above steps, the negative electrode active material layer was formed on both surfaces of the negative electrode current collector.

Next, the compounding ratio and fabricating conditions of the positive electrode are described. LiFePO$_4$ with a specific surface area of 9.2 m$^2$/g was used as an active material, PVDF was used as a binder, and acetylene black (AB) was used as a conductive additive. The compounding ratio of a paste for fabricating the electrode was as follows: LiFePO$_4$:AB:PVDF=85:7:8 (wt %).

Next, a method for forming a paste for the positive electrode is described.

First, PVDF and AB were mixed with a mixer, so that a first mixture was obtained.

Next, the active material was added to the first mixture and mixing was performed with a mixer, so that a second mixture was obtained.

Next, NMP serving as a dispersion medium was added to the second mixture and mixing was performed with a mixer, so that a third mixture was obtained.

Next, the third mixture was mixed with a mixer in a reduced-pressure atmosphere. Through the above steps, the paste was formed.

Subsequently, the paste was applied to the positive electrode current collector. A 20-μm-thick aluminum current collector which had been covered with an undercoat in advance was used as the positive electrode current collector. The application was performed with a continuous coating device at a coating speed of 1 m/min. After that, the solvent was vaporized using a drying furnace. The drying was performed at 80° C. for 4 minutes.

Subsequently, the positive electrode active material layer was pressed by a roll press method so as to be consolidated. Heat treatment was performed in a reduced-pressure atmosphere at 170° C. for 10 hours. Through the above steps, the positive electrode active material layer was formed on one or both of surfaces of the positive electrode current collector.

In the electrolytic solution, 1-butyl-3-methylimidazolium bis(fluorosulfonyl)amide (abbreviation: BMI-FSA) represented by the following structural formula was used as a solvent and lithium bis(fluorosulfonyl)amide (Li(FSO$_2$)$_2$N, abbreviation: LiFSA) was used as an electrolyte. LiFSA was dissolved in BMI-FSA, so that an electrolytic solution with a LiFSA concentration of 1.8 mol/kg was prepared.

[Chemical Formulae 3]

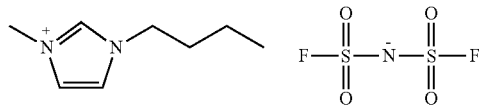

In this example, an ionic liquid was used as a solvent of an electrolytic solution. The ionic liquid that was used in this example has an extremely high flash point of 300° C. or higher, and the ionic liquid does not catch fire even in a high-temperature environment. Therefore, the ionic liquid can be favorably used for a secondary battery which is operated in a high-temperature environment.

Measurement results of a flash point of the electrolytic solution used in this example are described. The measurement of the flash point was performed using flash point tests employing the setaflash closed cup tester. First, a sample was placed in a sample cup and heated for 1 minute. Then, a burner was brought close to the sample and kept in the position for 2.5 seconds or more, and whether it caught fire or not was checked. The measurement was performed at 50° C. to 300° C., and different samples were used for different temperatures. In the tests, the electrolytic solution did not catch fire even when heated at 300° C.; thus, the flash point of the electrolytic solution was found to be 300° C. or higher.

As a separator, 50-μm-thick solvent-spun regenerated cellulosic fiber (TF40, produced by NIPPON KODOSHI CORPORATION) was used. As an exterior body, an aluminum film whose both surfaces were covered with a resin layer was used.

Next, a method for manufacturing the thin secondary battery is described. In this example, a secondary battery used for a light-emitting device to be operated in ice-cooled water and a secondary battery used for a light-emitting device to be operated in boiling water were fabricated.

First, a positive electrode, a negative electrode, and a separator were cut. The size of each of the positive electrode and the negative electrode was 20.49 cm$^2$. The separator was folded in half after the cutting, and two sides were fixed in the form of a bag.

Then, the positive electrode active material and the negative electrode active material in tab regions were removed to expose the current collectors.

Subsequently, the exterior body was folded in half so that the positive electrode, the separator, and the negative electrode that were stacked were sandwiched by the exterior body. In that case, the positive electrode and the negative electrode were stacked so that the positive electrode active material layer and the negative electrode active material layer faced each other. By stacking the negative electrode in a bag-like separator and the positive electrode alternately, the positive electrode and the negative electrode are stacked alternately to sandwich the separator therebetween.

Then, facing outer edges of the exterior body were bonded to each other by heating at sides except a side used for introduction of an electrolytic solution. At this time, the sealing layers provided for the lead electrodes were positioned so as to overlap with the sealing portion of the exterior body.

After the exterior body was sealed at the two sides, the exterior body and the positive electrode, the separator, and the negative electrode that were wrapped by the exterior body were heated under a reduced pressure at 80° C. for 10 hours.

Subsequently, the electrolytic solution was introduced into the exterior body in an argon gas atmosphere from one side that was not sealed. After that, the one side of the exterior body was sealed by heating in a reduced-pressure atmosphere. Through the above steps, thin secondary batteries were fabricated.

Next, the fabricated secondary batteries were subjected to aging.

First, constant current charging was performed at a rate of 0.01 C at 25° C. Charging was performed until the voltage reached an upper voltage limit of 3.2 V.

Here, a charge rate and a discharge rate are described. A charge rate of 1 C means a current value with which charging is terminated in exactly 1 hour in the case of charging a cell with a capacity of X (Ah) at a constant current. When 1 C=I(A), a charge rate of 0.2 C means I/5 (A), i.e., a current value with which charging is terminated in exactly 5 hours. Similarly, a discharge rate of 1 C means a current value with which discharging is terminated in exactly 1 hour in the case of discharging a cell with a capacity of X (Ah) at a constant current, and a discharge rate of 0.2 C means I/5 (A), i.e., a current value with which discharging is terminated in exactly 5 hours.

Here, the rate was calculated using the theoretical capacitor of LiFePO$_4$ which is a positive electrode active material (170 mAh/g) as a reference.

In an argon atmosphere, the exterior body was cut at one side to open, and degasification was performed. Then, the one side of the exterior body that was opened was sealed again in a reduced-pressure atmosphere.

Next, constant current charging was performed at a rate of 0.05 C at 25° C. Charging was performed until the voltage reached an upper voltage limit of 4.0 V. Then, constant current charging was performed at a rate of 0.2 C at 25° C. Discharging was performed until the voltage reached a lower voltage limit of 2.0 V. Moreover, charging and discharging were performed twice at a rate of 0.2 C at 25° C. Charging was performed until the voltage reached an upper limit of 4.0 V and discharging was performed until the voltage reached a lower limit of 2.0 V.

Figure 34A:
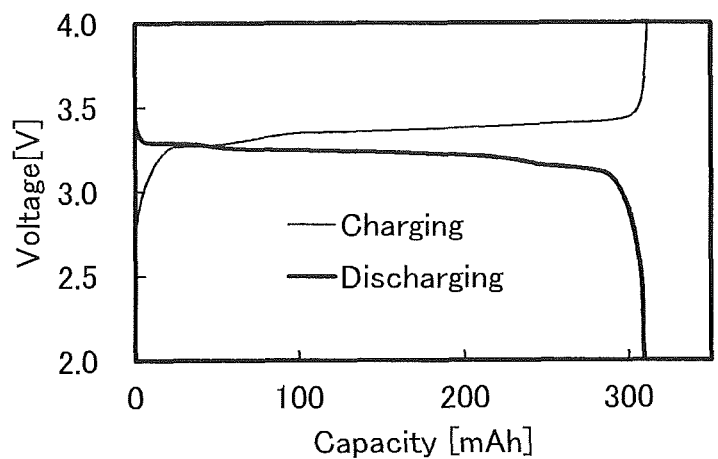
FIGS. 34A to 34C show charge and discharge characteristics of secondary batteries in Example.

Charge and discharge characteristics of the secondary batteries after the above aging treatment were measured. Charging and discharging were performed at 25° C. The charge time and the discharge time were each approximately 5 hours. FIG. 34A shows the results.

In the following description, the rate was calculated using the theoretical capacitor of LiFePO$_4$ which is a positive electrode active material (135 mAh/g) as a reference. Next, in only the secondary battery used for the light-emitting device which is operated in boiling water, charging was performed at a rate of 0.1 C at 25° C. and discharging was performed at a rate of 0.2 C at 100° C. Charging was performed until the voltage reached an upper limit of 4.0 V and discharging was performed until the voltage reached a lower limit of 2.0 V.

After that, in an argon atmosphere, the exterior body was cut at one side to open, and degasification was performed. Then, the one side of the exterior body that was opened was sealed again in a reduced-pressure atmosphere.

In both types of batteries, charging and discharging were performed once at a rate of 0.1 C at 25° C. to check operation. Charging was performed until the voltage reached an upper limit of 4.0 V and discharging was performed until the voltage reached a lower limit of 2.0 V.

Figure 34B:
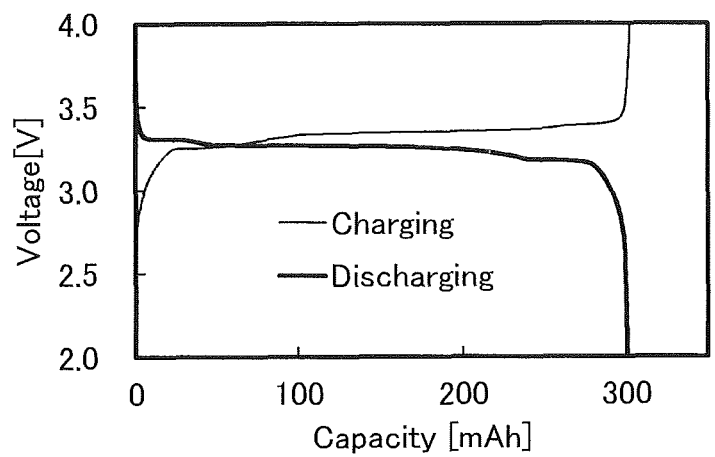
Figure 34C:
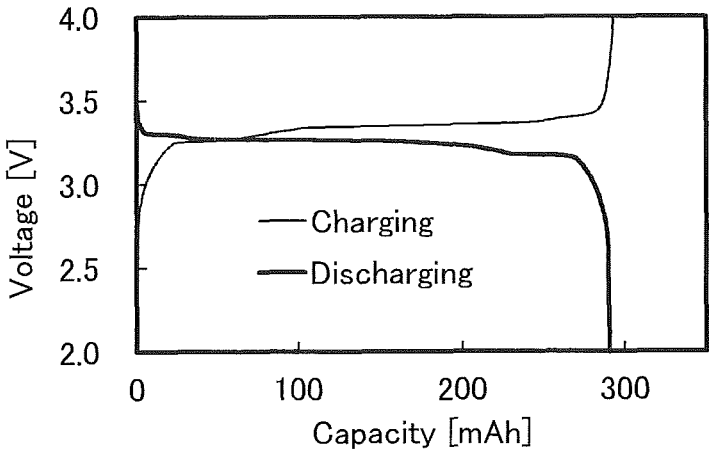

Through the above steps, the secondary batteries were fabricated. Charge and discharge characteristics of the secondary batteries of this example were measured. FIG. 34B shows measurement results of charge and discharge characteristics of the secondary battery used for the light-emitting device to be operated in ice-cooled water. FIG. 34C shows measurement results of charge and discharge characteristics of the secondary battery used for the light-emitting device to be operated in boiling water. The capacity of the secondary battery fabricated in this example was found to be approximately 300 mAh.

A light-emitting device of this example was fabricated using the light-emitting panel and the secondary battery which were fabricated through the above steps. In this example, a circuit having a function of driving a light-emitting element was used so that the light-emitting element blinks.

The light-emitting panel 10, the secondary battery 20, and the circuit board 55 were overlapped with each other as illustrated in FIGS. 2A and 2B and put into a plastic case which transmitted visible light. The size of the secondary battery 20 was approximately 75 mm×80 mm×2.9 mm and the weight thereof was approximately 15 g.

Figure 35A:
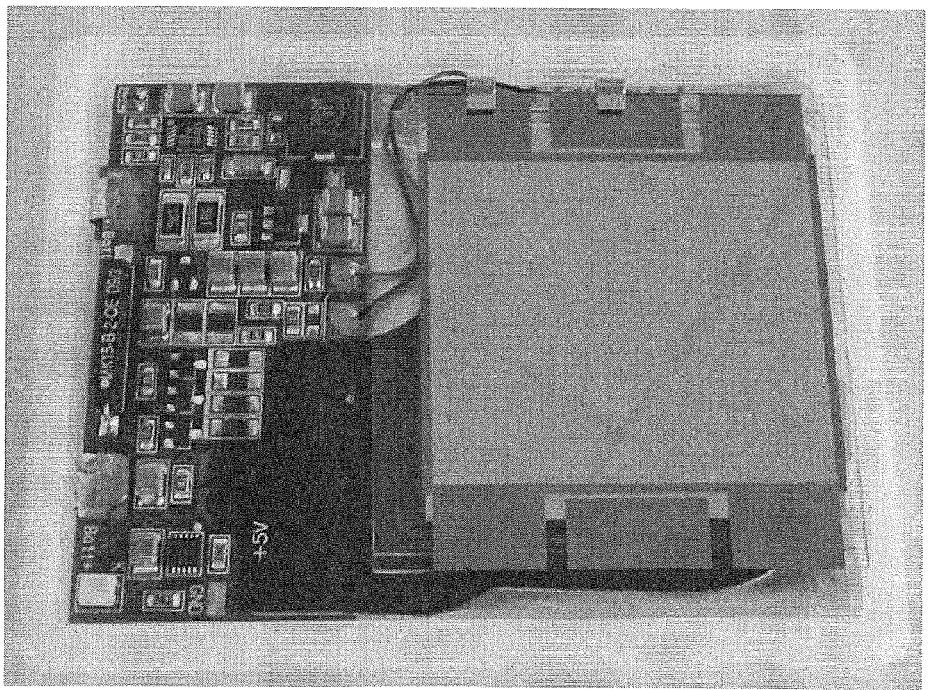
FIGS. 35A and 35B are photographs of a light-emitting device in Example.
Figure 35B:
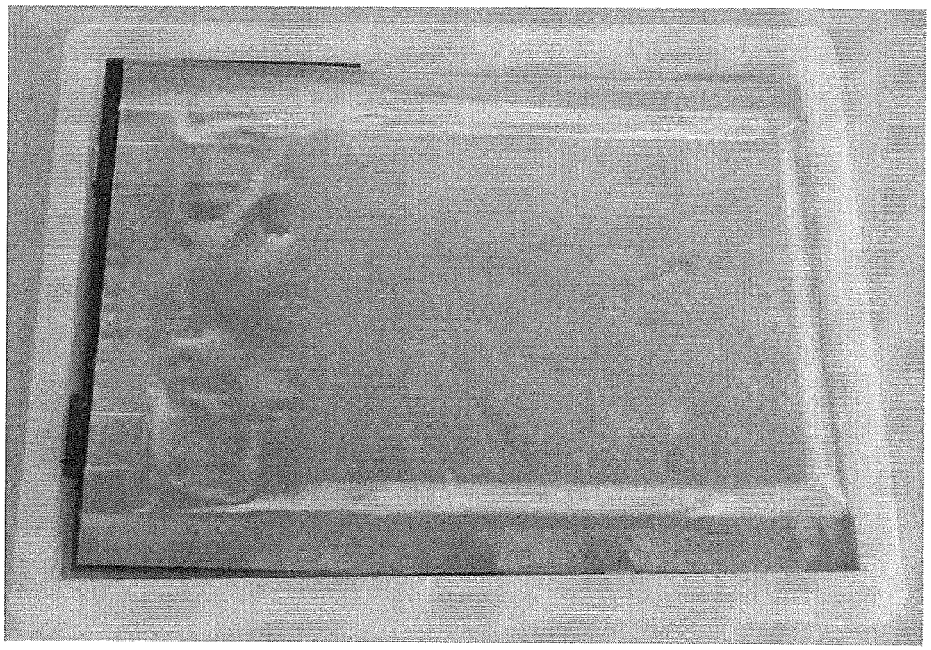

FIGS. 35A and 35B show a front surface (a light-emitting surface) and a rear surface (a surface facing the light-emitting surface) of a sealed object, respectively.

The plastic case was put into the sealing structure 40 and sealed, so that the light-emitting device of this example was fabricated. A plastic film which transmitted visible light was used as the sealing structure 40.

Figure 36:
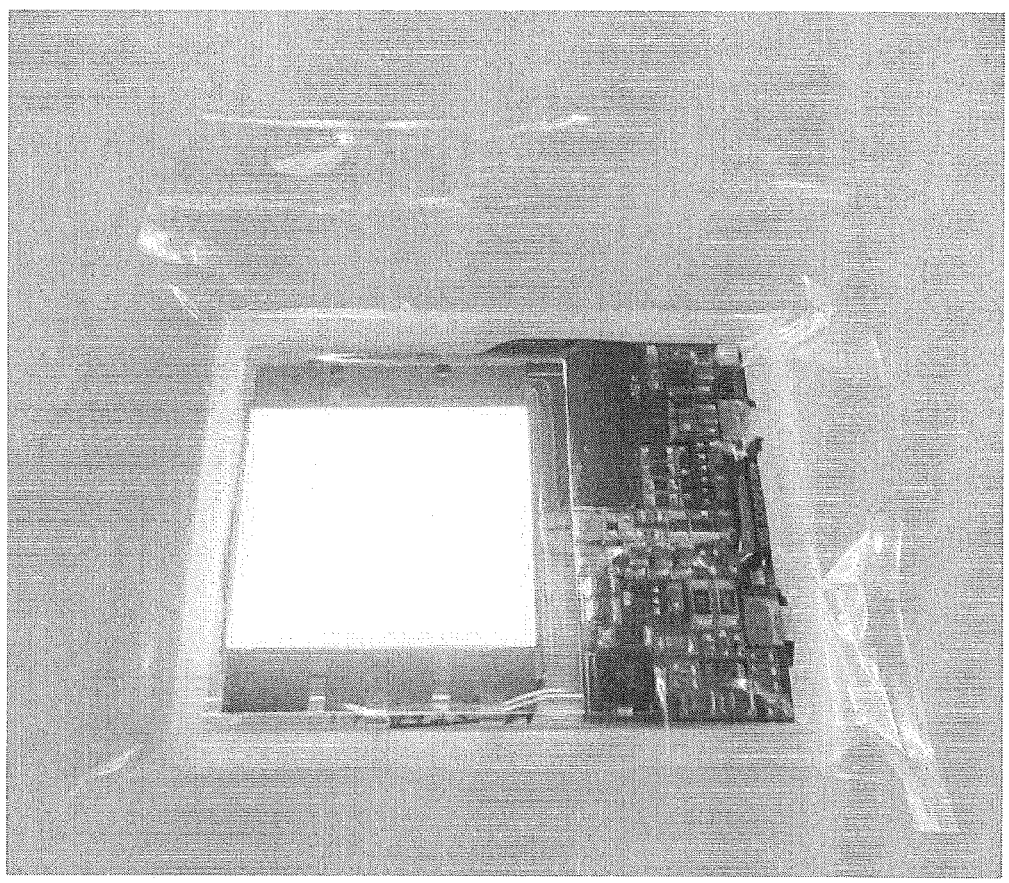
FIG. 36 is a photograph of a light-emitting device in Example.

FIG. 36 is a photograph when the light-emitting device of this example emits light in an air atmosphere at room temperature.

Figure 37A:
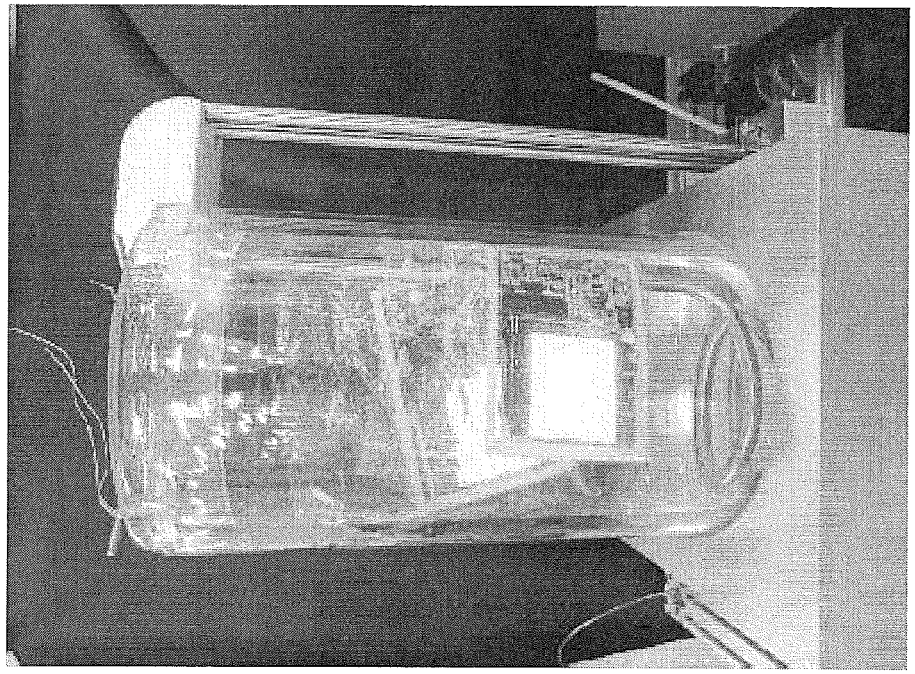
FIGS. 37A and 37B are photographs of light-emitting devices in Example.

FIG. 37A is a photograph when the light-emitting device of this example emits light in ice-cooled water (approximately 0° C.). The light-emitting device emitted light (blinked) without any problem in an antifreeze solution (containing water and ethylene glycol) of approximately 0° C.

Figure 37B:
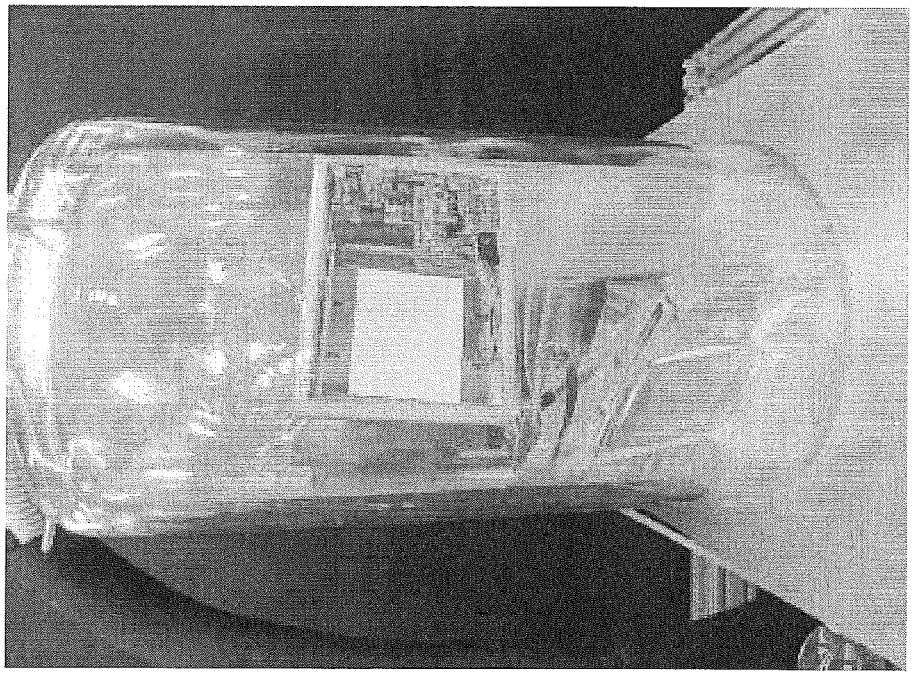

FIG. 37B is a photograph when the light-emitting device of this example emits light in boiling water (approximately 100° C.). The light-emitting device emitted light (blinked) without any problem in boiling water.

In the light-emitting device of this example, the light-emitting panel 10 was able to blink for 8 hours or more using the secondary battery 20 as a power source in both of ice-cooled water and boiling water. It was thus suggested that the light-emitting device of this example can stably operate at high temperature and low temperature.

As described above, the light-emitting device of this example was confirmed to be capable of operating in ice-cooled water and boiling water.

This application is based on Japanese Patent Application serial no. 2014-204599 filed with Japan Patent Office on Oct. 3, 2014, Japanese Patent Application serial no. 2014-219133 filed with Japan Patent Office on Oct. 28, 2014, and Japanese Patent Application serial no. 2014-243193 filed with Japan Patent Office on Dec. 1, 2014, the entire contents of which are hereby incorporated by reference.

What is claimed is:

1. A light-emitting device comprising:
a light-emitting panel;
a secondary battery;
a circuit; and
a sealing structure,
wherein the light-emitting panel includes a light-emitting element,
wherein the light-emitting element is configured to emit light by using power supplied from the secondary battery,
wherein the secondary battery includes a portion overlapping with the light-emitting panel,
wherein the circuit includes an antenna,
wherein the antenna includes a portion overlapping with the light-emitting panel,
wherein the circuit is configured to charge the secondary battery wirelessly,
wherein the light-emitting panel, the secondary battery, and the circuit are provided inside the sealing structure, and
wherein at least part of the sealing structure is configured to transmit light emitted from the light-emitting element.

2. The light-emitting device according to claim 1, wherein at least part of the antenna is between the light-emitting panel and the secondary battery.

3. The light-emitting device according to claim 1,
wherein the light-emitting element includes a pair of electrodes and a light-emitting layer,
wherein the light-emitting layer is between the pair of electrodes,
wherein the light-emitting layer contains a light-emitting organic compound, and
wherein a glass transition temperature of the light-emitting organic compound is higher than or equal to 100° C.

4. The light-emitting device according to claim 1,
wherein the secondary battery contains a nonaqueous electrolyte,
wherein the nonaqueous electrolyte contains an ionic liquid and an alkali metal salt,
wherein the ionic liquid contains an imidazolium cation and an anion, and
wherein the alkali metal salt is a lithium salt.

5. The light-emitting device according to claim 1, further comprising a first switch,
wherein the secondary battery is configured to supply power to the light-emitting panel when the first switch is on, and
wherein the circuit is configured to charge the secondary battery wirelessly when the first switch is off.

6. The light-emitting device according to claim 1, wherein the light-emitting panel includes a flexible portion.

7. The light-emitting device according to claim 1, wherein the secondary battery includes a flexible portion.

8. The light-emitting device according to claim 1, wherein the inside of the sealing structure is a reduced pressure atmosphere.

9. The light-emitting device according to claim 1,
wherein the light-emitting panel includes a second switch, a third switch, and a capacitor,
wherein the second switch is electrically connected to one electrode of the capacitor,
wherein the third switch is electrically connected to the other electrode of the capacitor,
wherein the capacitor is configured to hold voltage corresponding to a video signal,
wherein the light-emitting element is configured to emit light in accordance with the voltage, and
wherein the second switch and the third switch are off in a period during which the capacitor holds the voltage and are electrically disconnected from a driver circuit used for supplying the video signal.

10. A module comprising:
the light-emitting device according to claim 1; and
a touch sensor or an FPC.

11. An electronic device comprising:
the light-emitting device according to claim 1; and
a sensor, a housing, a speaker, a microphone, an operation switch, or an operation button.

12. A light-emitting device comprising:
a light-emitting panel;
a secondary battery;
a circuit; and
a sealing structure,
wherein the light-emitting panel includes a light-emitting element,
wherein the light-emitting element is configured to emit light by using power supplied from the secondary battery,
wherein the light-emitting element is configured to emit light at 0° C.,
wherein the light-emitting element is configured to emit light at 100° C.,
wherein the secondary battery is configured to supply power to the light-emitting panel at 0° C.,
wherein the secondary battery is configured to supply power to the light-emitting panel at 100° C.,
wherein the circuit includes an antenna,
wherein the circuit is configured to charge the secondary battery wirelessly,
wherein the light-emitting panel, the secondary battery, and the circuit are provided inside the sealing structure,
wherein at least part of the sealing structure is configured to transmit light emitted from the light-emitting element, and
wherein the light-emitting device is configured to be operated in water at 0° C. and in water at 100° C.

13. The light-emitting device according to claim 12,
wherein the light-emitting element includes a pair of electrodes and a light-emitting layer,
wherein the light-emitting layer is between the pair of electrodes,
wherein the light-emitting layer contains a light-emitting organic compound, and
wherein a glass transition temperature of the light-emitting organic compound is higher than or equal to 100° C.

14. The light-emitting device according to claim 12,
wherein the secondary battery contains a nonaqueous electrolyte,
wherein the nonaqueous electrolyte contains an ionic liquid and an alkali metal salt,
wherein the ionic liquid contains an imidazolium cation and an anion, and
wherein the alkali metal salt is a lithium salt.

15. The light-emitting device according to claim 12, further comprising a first switch,
wherein the secondary battery is configured to supply power to the light-emitting panel when the first switch is on, and
wherein the circuit is configured to charge the secondary battery wirelessly when the first switch is off.

16. The light-emitting device according to claim 12, wherein the light-emitting panel includes a flexible portion.

17. The light-emitting device according to claim 12, wherein the secondary battery includes a flexible portion.

18. The light-emitting device according to claim 12, wherein the inside of the sealing structure is a reduced pressure atmosphere.

19. The light-emitting device according to claim 12,
wherein the light-emitting panel includes a second switch, a third switch, and a capacitor,
wherein the second switch is electrically connected to one electrode of the capacitor,
wherein the third switch is electrically connected to the other electrode of the capacitor,
wherein the capacitor is configured to hold voltage corresponding to a video signal,
wherein the light-emitting element is configured to emit light in accordance with the voltage, and
wherein the second switch and the third switch are off in a period during which the capacitor holds the voltage and are electrically disconnected from a driver circuit used for supplying the video signal.

20. A module comprising:
the light-emitting device according to claim 12; and
a touch sensor or an FPC.

21. An electronic device comprising:
the light-emitting device according to claim 12; and
a sensor, a housing, a speaker, a microphone, an operation switch, or an operation button.

* * * * *